(12) United States Patent
Takada et al.

(10) Patent No.: US 12,481,215 B2
(45) Date of Patent: *Nov. 25, 2025

(54) ACTIVE-LIGHT-SENSITIVE OR RADIATION-SENSITIVE RESIN COMPOSITION, RESIST FILM, PATTERN FORMATION METHOD, METHOD FOR MANUFACTURING ELECTRONIC DEVICE, COMPOUND, AND RESIN

(71) Applicant: FUJIFILM Corporation, Tokyo (JP)

(72) Inventors: Akira Takada, Shizuoka (JP); Akiyoshi Goto, Shizuoka (JP); Masafumi Kojima, Shizuoka (JP); Aina Ushiyama, Shizuoka (JP); Michihiro Shirakawa, Shizuoka (JP); Keita Kato, Shizuoka (JP); Hironori Oka, Shizuoka (JP); Mitsuhiro Fujita, Shizuoka (JP); Yasuharu Shiraishi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 776 days.

This patent is subject to a terminal disclaimer.

(21) Appl. No.: 17/678,271

(22) Filed: Feb. 23, 2022

(65) Prior Publication Data
US 2022/0179307 A1    Jun. 9, 2022

Related U.S. Application Data

(63) Continuation of application No. PCT/JP2020/028980, filed on Jul. 29, 2020.

(30) Foreign Application Priority Data

Aug. 28, 2019   (JP) ................. 2019-155791

(51) Int. Cl.
    *G03F 7/004*   (2006.01)
    *G03F 7/039*   (2006.01)
    *G03F 7/16*    (2006.01)
    *G03F 7/20*    (2006.01)
    *G03F 7/32*    (2006.01)

(52) U.S. Cl.
    CPC .......... *G03F 7/0045* (2013.01); *G03F 7/0392* (2013.01); *G03F 7/162* (2013.01); *G03F 7/2006* (2013.01); *G03F 7/322* (2013.01); *G03F 7/325* (2013.01)

(58) Field of Classification Search
    CPC ........ G03F 7/0045; C08F 12/30; C08F 28/02; C08F 128/02; C08F 128/04; C08F 228/02; C08F 228/04; C08F 20/38
    See application file for complete search history.

(56) References Cited

U.S. PATENT DOCUMENTS

| | | | |
|---|---|---|---|
| 12,044,967 B2 * | 7/2024 | Asawaka | C08F 220/1804 |
| 2006/0194149 A1 * | 8/2006 | Yamasaki | B41C 1/1016 430/270.1 |
| 2012/0003584 A1 | 1/2012 | Nguyen et al. | |
| 2012/0270155 A1 * | 10/2012 | Komuro | G03F 7/2041 560/126 |
| 2012/0308932 A1 * | 12/2012 | Sagehashi | G03F 7/2041 526/268 |
| 2012/0328985 A1 * | 12/2012 | Kato | C08F 22/24 549/80 |
| 2013/0137048 A1 * | 5/2013 | Yahagi | G03F 7/0045 525/326.4 |
| 2013/0337378 A1 | 12/2013 | Ohashi et al. | |
| 2014/0255853 A1 * | 9/2014 | Takaki | G03F 7/0397 562/42 |
| 2014/0349221 A1 | 11/2014 | Takizawa et al. | |
| 2016/0102157 A1 * | 4/2016 | Jain | C07C 309/12 430/311 |
| 2017/0299963 A1 | 10/2017 | Fujiwara | |
| 2020/0033724 A1 | 1/2020 | Lim et al. | |

FOREIGN PATENT DOCUMENTS

| | | | | |
|---|---|---|---|---|
| JP | 2005084365 A | * | 3/2005 | |
| JP | 2006-264333 A | | 10/2006 | |
| JP | 2009-047754 A | | 3/2009 | |
| JP | 2009-047799 A | | 3/2009 | |
| JP | 2009-537458 A | | 10/2009 | |
| JP | 2012048224 A | * | 3/2012 | |
| JP | 2014-001259 A | | 1/2014 | |
| JP | 2015024989 A | * | 2/2015 | |
| JP | 2018-024749 A | | 2/2018 | |
| JP | 2019-014704 A | | 1/2019 | |
| JP | 2019-031483 A | | 2/2019 | |
| JP | 2019156860 A | * | 9/2019 | ............ A23L 33/10 |
| KR | 10-2013-0141383 A | | 12/2013 | |
| KR | 10-2017-0117884 A | | 10/2017 | |
| KR | 2018049949 A | * | 5/2018 | ................ C07F 1/02 |
| KR | 10-2019-0029065 A | | 3/2019 | |

OTHER PUBLICATIONS

English translation of JP2012048224. (Year: 2012).*
English translation of JP2019156830. (Year: 2019).*
English translation of KR20180049949. (Year: 2018).*
English translation of JP2015024989. (Year: 2015).*
English translation of JP2005084365. (Year: 2005).*
Extended European Search Report dated Oct. 4, 2022 in European Application No. 20858884.8.
Yasunari Nishikata et al., "Preparation and Properties of Poly(p-Phenylenevinylene) Langmuir-Blodgett Film", Thin Solid Films, 1989, vol. 179, No. 1-2, pp. 191-197 (7 pages total).

(Continued)

*Primary Examiner* — Mark F. Huff
*Assistant Examiner* — Anna Malloy
(74) *Attorney, Agent, or Firm* — Sughrue Mion, PLLC

(57) ABSTRACT

An actinic ray-sensitive or radiation-sensitive resin composition includes a resin X including a repeating unit derived from a compound including two or more structural moieties consisting of an anionic moiety and a cationic moiety, and a polymerizable group, in which the compound generates an acid including an acidic moiety derived from the anionic moiety in the two or more structural moieties by irradiation with actinic rays or radiation.

15 Claims, No Drawings

(56) References Cited

OTHER PUBLICATIONS

International Preliminary Report on Patentability dated Mar. 1, 2022 with a Translation of the Written Opinion of the International Searching Authority in Application No. PCT/JP2020/028980.
International Search Report dated Oct. 20, 2020 in Application No. PCT/JP2020/028980.
Written Opinion of the International Searching Authority dated Oct. 20, 2020 in Application No. PCT/JP2020/028980.
Office Action issued Feb. 14, 2024 in Korean Application No. 10-2022-7005743.
Office Action dated Nov. 29, 2022 from the Japanese Patent Office in JP Application No. 2021-542654.
Japanese Office Action dated Apr. 18, 2023 in Japanese Application No. 2021-542654.
Communication issued Aug. 15, 2024 in Chinese Application No. 202080060142.0.

* cited by examiner

ACTIVE-LIGHT-SENSITIVE OR RADIATION-SENSITIVE RESIN COMPOSITION, RESIST FILM, PATTERN FORMATION METHOD, METHOD FOR MANUFACTURING ELECTRONIC DEVICE, COMPOUND, AND RESIN

CROSS-REFERENCE TO RELATED APPLICATIONS

This application is a Continuation of PCT International Application No. PCT/JP2020/028980 filed on Jul. 29, 2020, which claims priority under 35 U.S.C. § 119(a) to Japanese Patent Application No. 2019-155791 filed on Aug. 28, 2019. Each of the above application(s) is hereby expressly incorporated by reference, in its entirety, into the present application.

BACKGROUND OF THE INVENTION

1. Field of the Invention

The present invention relates to an actinic ray-sensitive or radiation-sensitive resin composition, a resist film, a pattern forming method, a method for manufacturing an electronic device, a compound, and a resin.

2. Description of the Related Art

Since the advent of a resist for KrF excimer laser (248 nm), a pattern forming method utilizing chemical amplification has been used in order to compensate for a decrease in sensitivity due to light absorption. For example, in a positive tone chemical amplification method, first, a photoacid generator included in the exposed portion decomposes by irradiation with light to generate an acid. Then, in a post-exposure baking (PEB) step and the like, a solubility in a developer changes by, for example, changing an alkali-insoluble group contained in a resin included in an actinic ray-sensitive or radiation-sensitive resin composition to an alkali-soluble group by the catalytic action of an acid thus generated. Thereafter, development is performed using a basic aqueous solution, for example. As a result, the exposed portion is removed to obtain a desired pattern.

For miniaturization of semiconductor elements, the wavelength of an exposure light source has been shortened and a projection lens with a high numerical aperture (high NA) has been advanced, and currently, an exposure machine using an ArF excimer laser having a wavelength of 193 nm as a light source is under development.

Under these circumstances, various configurations have been proposed as actinic ray-sensitive or radiation-sensitive resin compositions.

For example, an acid generator including a salt represented by General Formula (I) as a component used in a resist composition is disclosed in JP2019-14704A. Furthermore, such an acid generator is also hereinafter referred to as a "low-molecular-weight acid generator".

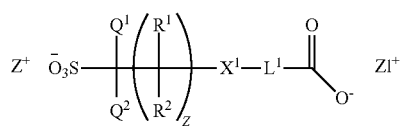

(I)

SUMMARY OF THE INVENTION

In an ordinary resist composition in the related art, in a case where photoacid generators and acid diffusion control agents are added only as each of single compounds to the composition, the photoacid generators or the acid diffusion control agents are easily aggregated with each other. Therefore, in the ordinary resist composition in the related art, a portion having a high (or low) concentration of the photoacid generators and a portion having a high (or low) concentration of the acid diffusion control agents are present in a resist film thus formed, and thus, the concentration distribution of the photoacid generators and the acid diffusion control agents is likely to be non-uniform. As a result, in a case where the resist film is exposed, unevenness in the amount and the diffusion of an acid generated in the resist film also occurs, which causes non-uniformity in the width of a pattern obtained after development.

In contrast, according to the low-molecular-weight acid generator disclosed in the related art (for example, JP2019-14704A), the low-molecular-weight acid generator includes both a moiety corresponding to a photoacid generator and a moiety corresponding to an acid diffusion control agent in one molecule, and therefore, has a characteristic that each of presence ratios of the respective moieties is easily made constant in a resist film.

The present inventors have conducted studies on the resist composition described in JP2019-14704A, and have thus found that there is room to further improve the line width roughness (LWR) of a pattern formed using the resist composition.

Therefore, an object of the present invention is to provide an actinic ray-sensitive or radiation-sensitive resin composition capable of forming a pattern having excellent LWR performance.

Moreover, another object of the present invention is to provide a resin used in the actinic ray-sensitive or radiation-sensitive resin composition capable of forming a pattern having excellent LWR performance, and a compound which is a monomer of the resin.

In addition, still another object of the present invention is to provide a resist film and a pattern forming method, each using the actinic ray-sensitive or radiation-sensitive resin composition, and a method for manufacturing an electronic device, using the pattern forming method.

The present inventors have conducted intensive studies to accomplish the objects, and as a result, they have found that the objects can be accomplished by the following configurations.

[1] An actinic ray-sensitive or radiation-sensitive resin composition comprising a resin X including a repeating unit derived from the following compound.
(Compound)
A compound including two or more structural moieties consisting of an anionic moiety and a cationic moiety, and a polymerizable group,
in which the compound generates an acid including an acidic moiety derived from the anionic moiety in the two or more structural moieties by irradiation with actinic rays or radiation.

[2] The actinic ray-sensitive or radiation-sensitive resin composition as described in [1],
in which in the compound, structures of two or more anionic moieties among the anionic moieties are different from each other.

[3] The actinic ray-sensitive or radiation-sensitive resin composition as described in [1] or [2],
in which the compound is a compound (I) which will be described later.

[4] The actinic ray-sensitive or radiation-sensitive resin composition as described in any one of [1] to [3],
in which the resin X further includes a repeating unit having an acid-decomposable group.

[5] An actinic ray-sensitive or radiation-sensitive resin composition comprising the following resin Y.
(Resin Y)
A resin including:
an acid-decomposable group,
a group having a first structural moiety consisting of a first anionic moiety and a first cationic moiety, and
a group having a second structural moiety consisting of a second anionic moiety and a second cationic moiety,
in which the first structural moiety forms a first acidic moiety derived from the first anionic moiety by irradiation with actinic rays or radiation,
the second structural moiety forms a second acidic moiety derived from the second anionic moiety by irradiation with actinic rays or radiation, and
the second acidic moiety has a structure different from the first acidic moiety, and has an acid dissociation constant larger than an acid dissociation constant of the first acidic moiety.

[6] The actinic ray-sensitive or radiation-sensitive resin composition as described in [5],
in which the resin Y includes:
a repeating unit including the acid-decomposable group, and
a repeating unit including the group having the first structural moiety and the group having the second structural moiety.

[7] A resist film formed of the actinic ray-sensitive or radiation-sensitive resin composition as described in any one of [1] to [6].

[8] A pattern forming method comprising:
forming a resist film on a support, using the actinic ray-sensitive or radiation-sensitive resin composition as described in any one of [1] to [6];
exposing the resist film; and
developing the exposed resist film, using a developer.

[9] A method for manufacturing an electronic device comprising the pattern forming method as described in [8].

[10] A compound comprising:
two or more structural moieties consisting of an anionic moiety and a cationic moiety; and
a polymerizable group,
in which the compound generates an acid including an acidic moiety derived from the anionic moiety in the two or more structural moieties by irradiation with actinic rays or radiation.

[11] The compound as described in [10],
in which structures of two or more anionic moieties among the anionic moieties are different from each other.

[12] The compound as described in [10] or [11],
in which the compound is a compound (I) which will be described later.

[13] A resin comprising a repeating unit derived from the compound as described in any one of [10] to [12].

[14] The resin as described in [13], further comprising a repeating unit having an acid-decomposable group.

[15] A resin comprising:
an acid-decomposable group;
a group having a first structural moiety consisting of a first anionic moiety and a first cationic moiety; and
a group having a second structural moiety consisting of a second anionic moiety and a second cationic moiety,
in which the first structural moiety forms a first acidic moiety derived from the first anionic moiety by irradiation with actinic rays or radiation,
the second structural moiety forms a second acidic moiety derived from the second anionic moiety by irradiation with actinic rays or radiation, and
the second acidic moiety has a structure different from the first acidic moiety, and has an acid dissociation constant larger than an acid dissociation constant of the first acidic moiety.

[16] The resin as described in [15], further comprising:
a repeating unit including the acid-decomposable group, and
a repeating unit including the group having the first structural moiety and the group having the second structural moiety.

According to the present invention, it is possible to provide an actinic ray-sensitive or radiation-sensitive resin composition capable of forming a pattern having excellent LWR performance.

Furthermore, according to the present invention, it is possible to provide a resin used in the actinic ray-sensitive or radiation-sensitive resin composition capable of forming a pattern having excellent LWR performance, and a compound which is a monomer of the resin.

In addition, according to the present invention, it is also possible to provide a resist film and a pattern forming method, each using the actinic ray-sensitive or radiation-sensitive resin composition, and a method for manufacturing an electronic device, using the pattern forming method.

DESCRIPTION OF THE PREFERRED EMBODIMENTS

Hereinafter, the actinic ray-sensitive or radiation-sensitive resin composition, the resist film, the pattern forming method, the method for manufacturing an electronic device, the compound, and the resin according to embodiments of the present invention will be described in detail.

Description of configuration requirements described below may be made on the basis of representative embodiments of the present invention in some cases, but the present invention is not limited to such embodiments.

In notations for a group (atomic group) in the present specification, in a case where the group is noted without specifying whether it is substituted or unsubstituted, the group includes both a group having no substituent and a group having a substituent as long as this does not impair the spirit of the present invention. For example, an "alkyl group" includes not only an alkyl group having no substituent (unsubstituted alkyl group), but also an alkyl group having a substituent (substituted alkyl group). In addition, an "organic group" in the present specification refers to a group including at least one carbon atom.

The substituent is preferably a monovalent substituent unless otherwise specified.

"Actinic rays" or "radiation" in the present specification means, for example, a bright line spectrum of a mercury lamp, far ultraviolet rays typified by an excimer laser, extreme ultraviolet rays (EUV light), X-rays, electron beams (EB), or the like. "Light" in the present specification means actinic rays or radiation.

Unless otherwise specified, "exposure" in the present specification encompasses not only exposure by a bright line spectrum of a mercury lamp, far ultraviolet rays typified by an excimer laser, extreme ultraviolet rays (EUV light), X-rays, or the like, but also lithography by particle beams such as electron beams and ion beams.

In the present specification, a numerical range expressed using "to" is used in a meaning of a range that includes the preceding and succeeding numerical values of "to" as the lower limit value and the upper limit value, respectively.

The bonding direction of divalent groups noted in the present specification is not limited unless otherwise specified. For example, in a case where Y in a compound represented by General Formula "X—Y—Z" is —COO—, Y may be —CO—O— or —O—CO—. In addition, the compound may be "X—CO—O—Z" or "X—O—CO—Z".

In the present specification, (meth)acrylate represents acrylate and methacrylate, and (meth)acryl represents acryl and methacryl.

In the present specification, a weight-average molecular weight (Mw), a number-average molecular weight (Mn), and a dispersity (also referred to as a molecular weight distribution) (Mw/Mn) of a resin are defined as values expressed in terms of polystyrene by means of gel permeation chromatography (GPC) measurement (solvent: tetrahydrofuran, flow amount (amount of a sample injected): 10 μL, columns: TSK gel Multipore HXL-M manufactured by Tosoh Corporation, column temperature: 40° C., flow rate: 1.0 mL/min, and detector: differential refractive index detector) using a GPC apparatus (HLC-8120GPC manufactured by Tosoh Corporation).

In the present specification, an acid dissociation constant (pKa) represents a pKa in an aqueous solution, and is specifically a value determined by computation from a value based on a Hammett's substituent constant and database of publicly known literature values, using the following software package 1. Any of the pKa values described in the present specification indicate values determined by computation using the software package.

Software Package 1: Advanced Chemistry Development (ACD/Labs) Software V 8.14 for Solaris (1994-2007 ACD/Labs).

On the other hand, the pKa can also be determined by a molecular orbital computation method. Examples of a specific method therefor include a method for performing calculation by computing H$^+$ dissociation free energy in an aqueous solution based on a thermodynamic cycle. With regard to a computation method for H$^+$ dissociation free energy, the H$^+$ dissociation free energy can be computed by, for example, density functional theory (DFT), but various other methods have been reported in literature and the like, and are not limited thereto. Furthermore, there are a plurality of software applications capable of performing DFT, and examples thereof include Gaussian 16.

As described above, the pKa in the present specification refers to a value determined by computation from a value based on a Hammett's substituent constant and database of publicly known literature values, using the software package 1, but in a case where the pKa cannot be calculated by the method, a value obtained by Gaussian 16 based on density functional theory (DFT) shall be adopted.

In addition, the pKa in the present specification refers to a "pKa in an aqueous solution" as described above, but in a case where the pKa in an aqueous solution cannot be calculated, a "pKa in a dimethyl sulfoxide (DMSO) solution" shall be adopted.

In the present specification, examples of the halogen atom include a fluorine atom, a chlorine atom, a bromine atom, and an iodine atom.

In the following, the compound and the resin of the embodiments of the present invention will be described and then the actinic ray-sensitive or radiation-sensitive resin composition, the pattern forming method, and the method for manufacturing an electronic device will be described.

[Compound]

The compound of an embodiment of the present invention (hereinafter also referred to as a "specific compound") is a compound including two or more structural moieties consisting of an anionic moiety and a cationic moiety, and a polymerizable group, in which the compound generates an acid including an acidic moiety derived from the anionic moiety in the two or more structural moieties by irradiation with actinic rays or radiation.

The actinic ray-sensitive or radiation-sensitive resin composition (hereinafter also referred to as a "resist composition") including a resin X including a repeating unit derived from the specific compound (hereinafter also referred to as a "specific resin X") is capable of forming a pattern having excellent LWR performance. Mechanism of the action thereof is not necessarily clear, but is presumed to be as follows by the present inventors.

According to the recent studies conducted by the present inventors, it was found that the low-molecular-weight acid generator disclosed in the related art (for example, JP2019-14704A) tends to be aggregated in a composition, and due to this aggregation, the uniformity of presence ratios of moieties corresponding to the photoacid generator to moieties corresponding to the acid diffusion control agent in a resist film is lowered, and thus, the LWR performance of a pattern thus formed may not satisfy a desired requirement.

In contrast, the specific resin X has two or more structural moieties consisting of an anionic moiety and a cationic moiety. Therefore, in a case where at least one of the structural moieties is defines as a structural moiety X having a function corresponding to a photoacid generator and at least one of the structural moieties is define as a structural moiety Y having a function corresponding to an acid diffusion control agent, it is possible to make a presence ratio of each of the structural moieties constant in the resist film since both the structural moiety having a function corresponding to a photoacid generator and the structural moiety having a function corresponding to an acid diffusion control agent are included in one molecule. In particular, the specific resin has a structure in which a salt structural moiety (a structural moiety consisting of an anionic moiety and a cationic moiety, to which the structural moiety X and the structural moiety Y correspond) which is easily aggregated is supported on a resin, and therefore, the specific resin is less likely to be aggregated in a composition, as compared with the low-molecular-weight acid generator disclosed in JP2019-14704A. That is, the uniformity of the presence ratios of the structural moiety corresponding to a photoacid generator to the structural moiety corresponding to an acid diffusion control agent is more likely to be maintained by using the specific resin X, as compared with the low-molecular-weight acid generator disclosed in JP2019-14704A. As a result, even in a case where the resist film is exposed, the amount and the diffusion of an acid generated in the resist film are likely to be uniform, and the width of a pattern obtained after development is likely to be stable (that is, the LWR performance of the pattern is excellent).

This is clear from, for example, the results of Comparative Example 1-3 in the section of Examples.

Furthermore, since the low-molecular-weight acid generator disclosed in JP2019-14704A has a large diffusion distance of an acid generated by irradiation with actinic rays or radiation, a composition including the low-molecular-weight acid generator may have deterioration in EL performance in some cases.

On the other hand, the present inventors have also clarified that the EL performance of a resist composition is further improved with a resin including a repeating unit derived from a specific compound capable of generating an acid including a polymerizable group, an acidic moiety derived from an anionic moiety in the structural moiety X, and an acidic moiety derived from an anionic moiety in the structural moiety Y by irradiation with actinic rays or radiation (hereinafter also referred to as a "specific resin X-A"), among the specific resins X. Mechanism of the action thereof is not necessarily clear, but is presumed to be as follows by the present inventors.

The repeating unit derived from the specific compound in the specific resin X-A can function as an acidic moiety that generates an acid by irradiation with actinic rays or radiation. That is, the specific resin X-A can form an acidic moiety derived from an anionic moiety in the structural moiety X and an acidic moiety derived from an anionic moiety in the structural moiety Y in the resin by irradiation with actinic rays or radiation. That is, since these acidic moieties after exposure are supported in the specific resin X-A, the diffusion distance is significantly smaller than that of the low-molecular-weight acid generator disclosed in JP2019-14704A. As a result, a resist composition including the specific resin X-A also has excellent EL performance. This is also clear from the results of, for example, Example 1-10 in the section of Examples.

Furthermore, the present inventors have clarified that a pattern having excellent LWR performance can be obtained by the same mechanism of action as the specific resin X-A, by using a resist composition including the following resin Y (hereinafter also referred to as "specific resin Y"), and the EL performance is also excellent.

(Resin Y)

A resin including:
an acid-decomposable group,
a group having a first structural moiety consisting of a first anionic moiety and a first cationic moiety, and
a group having a second structural moiety consisting of a second anionic moiety and a second cationic moiety,
in which the first structural moiety forms a first acidic moiety derived from the first anionic moiety by irradiation with actinic rays or radiation,
the second structural moiety forms a second acidic moiety derived from the second anionic moiety by irradiation with actinic rays or radiation, and
the second acidic moiety has a structure different from the first acidic moiety, and has an acid dissociation constant larger than an acid dissociation constant of the first acidic moiety.

Hereinafter, the specific compound, the specific resin X, and the specific resin Y will be described, and then the resist composition will be described.

The specific compound includes a polymerizable group.

A type of the polymerizable group is not particularly limited in terms of, and the polymerizable group is preferably a functional group capable of undergoing an addition polymerization reaction, more preferably an ethylenically unsaturated polymerizable group or ring-polymerizable group, and still more preferably the ethylenically unsaturated polymerizable group.

Specific examples of the ethylenically unsaturated polymerizable group include a (meth)acryloyl group, a vinyl group, a styryl group, and a group represented by General Formula (W1).

Examples of the ring-polymerizable group include an epoxy group and an oxetane group.

The number of the polymerizable groups in the specific compound is not particularly limited, but is preferably 1 to 3, and more preferably 1.

(W1)

In General Formula (W1), $W^1$ represents an atomic group formed from groups selected from the group consisting of $-C(R^{11})_2-$, $-O-$, and $>C(=O)$. $R^{11}$ and $R^{12}$ each independently represent a hydrogen atom or a monovalent substituent.

The monovalent substituent represented by each of $R^{11}$ and $R^{12}$ is not particularly limited, and examples thereof include a linear, branched, or cyclic alkyl group having 1 to 10 carbon atoms.

As $R^{11}$ and $R^{12}$, among those, the hydrogen atom is preferable.

In General Formula (W1), the ring represented by T is formed from a carbon atom specified in General Formula (W1) and the atomic group represented by $W^1$, and represents a ring having 5 to 7 ring member atoms.

As the ring represented by T, a ring having 5 or 6 ring member atoms (in other words, a 5-membered ring or a 6-membered ring) is preferable.

In General Formula (W1), * represents a bonding position. By removing one hydrogen atom in the atomic group represented by $W^1$, the bonding position represented by * is formed.

The specific compound includes two or more structural moieties (hereinafter also referred to as "specific structural moieties") consisting of an anionic moiety and a cationic moiety.

In the specific structural moiety, the anionic moiety and the cationic moiety each have the same valence and exist in pairs. Here, the anionic moiety is a structural moiety including a negatively charged atom or atomic group, and the cationic moiety is a structural moiety including a positively charged atom or atomic group.

The specific compound generates an acid including an acidic moiety derived from the anionic moiety in the two or more specific structural moieties by irradiation with actinic rays or radiation. That is, for example, in a case where the specific compound has a structural moiety X and a structural moiety Y as a specific structural moiety, the generated acid includes an acidic moiety derived from an anionic moiety in the structural moiety X and an acidic moiety derived from an anionic moiety in the structural moiety Y. Among those, the generated acid preferably includes acidic moieties derived from anionic moieties in the two or more specific structural moieties, and a polymerizable group. That is, for example, in a case where the specific compound has the structural moiety X and the structural moiety Y as the specific structural moiety, it is preferable that the generated acid includes an acidic moiety derived from an anionic moiety in the structural moiety X and an acidic moiety derived from an anionic moiety in the structural moiety Y, and a polymerizable group. In a case where a polymerizable group is included in the generated acid as described above, a resin including a repeating unit derived from the specific compound (that is, a resin corresponding to the above-mentioned resin X-A) can form an acidic moiety derived from an anionic moiety in the structural moiety X and an acidic moiety derived from an anionic moiety in the structural moiety Y in the resin by irradiation with actinic rays or radiation. As a result, a resist composition including a resin including a repeating unit derived from the specific compound has excellent EL performance.

Among the specific compounds, a moiety represented by General Formula (D1) or General Formula (D2) is preferable as the specific structural moiety. Furthermore, in General Formulae (D1) and (D2), $P_1^{X1-}$ and $P_2^{X2-}$ correspond to anionic moieties. In addition, $Q_1^{X1+}$ and $Q_2^{X2+}$ correspond to cationic moieties.

(D1)

(D2)

In General Formula (D1), $P_1^{X1-}$ represents a negatively charged atomic group having a valence of X1. $Q_1^{X1+}$ represents a positively charged atomic group having a valence of X1. * represents a bonding position.

In General Formula (D1), $P_2^{X2-}$ represents a negatively charged atomic group having a valence of X2. $Q_2^{X2+}$ represents a positively charged atomic group having a valence of X2. * represents a bonding position.

In General Formula (D1) and General Formula (D2), the valences represented by X1 and X2 are not particularly limited, but are preferably 1.

In General Formula (D1) and General Formula (D2), as the negatively charged atomic group represented by each of $P_1^{X1-}$ and $P_2^{X2-}$, for example, an anionic functional group which will be described later is preferable.

In General Formula (D1) and General Formula (D2), as the positively charged atomic group represented by each of $Q_1^{X1-}$ and $Q_2^{X2-}$, for example, an organic cation which will be described later is preferable.

Moreover, in a case where the specific structural moiety is, for example, a moiety represented by each of General Formula (D1) and General Formula (D2), and the valences represented by X1 and X2 in General Formula (D1) and General Formula (D2) are each 1, acidic moieties represented by General Formula (D2-H) and General Formula (D1-H) derived from the anionic moieties represented by $P_1^{X1-}$ and $P_2^{X2-}$ are formed by irradiation with actinic rays or radiation.

(D1-H)

(D2-H)

The number of the specific structural moieties in the specific compound is not particularly limited as long as it is 2 or more, but the number is, for example, preferably 2 to 4, and more preferably 2.

As the specific compound, a compound represented by General Formula (S1) or General Formula (S2) is preferable.

In General Formula (S1), $W^{11}$ represents a polymerizable group. The polymerizable group is as described earlier.

$L^{11}$ and $L^{12}$ each independently represent a single bond or a divalent linking group.

The divalent linking group represented by each of $L^{11}$ and $L^{12}$ is not particularly limited, and examples thereof include —CO—, —NR$^A$—, —O—, an alkylene group (which preferably has 1 to 6 carbon atoms, and may be linear or branched), a cycloalkylene group (which preferably has 3 to 15 carbon atoms), an alkenylene group (which preferably has 2 to 6 carbon atoms), a divalent aliphatic heterocyclic group (which is preferably a 5- to 10-membered ring, more preferably a 5- to 7-membered ring, and still more preferably a 5- or 6-membered ring, each having at least one of an N atom, an O atom, an S atom, or an Se atom in the ring structure), and a divalent linking group formed by combination of a plurality of these groups. Examples of $R^A$ include a hydrogen atom or a monovalent substituent. The monovalent substituent is not particularly limited, but is, for example, preferably an alkyl group (which preferably has 1 to 6 carbon atoms, and may be linear or branched).

In addition, the alkylene group, the cycloalkylene group, the alkenylene group, and the divalent aliphatic heterocyclic group may be substituted with a substituent. Examples of the substituent include a halogen atom (preferably a fluorine atom).

As $L^{11}$, among those, the single bond, or a divalent linking group formed by one or combination of two or more selected from the group consisting of —O— and an alkylene group (which preferably has 1 to 6 carbon atoms, and may be linear or branched) is preferable.

As $L^{12}$, among those, the single bond or an alkylene group which may be substituted with a fluorine atom (which preferably has 1 to 6 carbon atoms, and more preferably has 1 to 3 carbon atoms, and may be linear or branched) is preferable, the single bond or the alkylene group substituted with a fluorine atom is more preferable, and a perfluoroalkylene group is still more preferable.

$D^{11}$ represents the group represented by General Formula (D2).

$D^{12}$ represents the group represented by General Formula (D1).

In General Formula (S2), $W^{21}$ represents a polymerizable group. The polymerizable group is as described earlier.

$L^{21}$ represents a trivalent linking group.

The trivalent linking group represented by $L^{21}$ is not particularly limited, and examples thereof include a group represented by General Formula (LX).

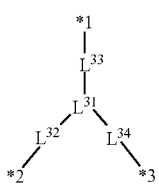

(LX)

In General Formula (LX), $L^{31}$ represents a trivalent linking group. $L^{32}$, $L^{33}$, and $L^{34}$ each independently represent a single bond or a divalent linking group. *1 represents a bonding position with $W^{21}$, *2 represents a bonding position with $D^{21}$, and *3 represents a bonding position with $D^{22}$.

The trivalent linking group represented by $L^{31}$ is not particularly limited, and examples thereof include $C(R^B)$, a nitrogen atom, a trivalent hydrocarbon ring group, and a trivalent heterocyclic group.

The hydrocarbon ring group may be an aromatic hydrocarbon ring group or an aliphatic hydrocarbon ring group. The number of carbon atoms included in the hydrocarbon ring group is preferably 6 to 18, and more preferably 6 to 14.

The heterocyclic group may be either an aromatic heterocyclic group or an aliphatic heterocyclic group. The heterocyclic ring is preferably a 5- to 10-membered ring, more preferably a 5- to 7-membered ring, and still more preferably a 5- or 6-membered ring, each of which has at least one N atom, O atom, S atom, or Se atom in the ring structure.

$R^B$ represents a hydrogen atom or a monovalent substituent.

The monovalent substituent represented by $R^B$ is not particularly limited, and examples thereof include an alkyl group (which preferably has 1 to 6 carbon atoms, and may be linear or branched).

As $L^{31}$, among those, CH is preferable.

The divalent linking group represented by each of $L^{32}$, $L^{33}$, and $L^{34}$ is not particularly limited, and examples thereof include —CO—, —NR$^A$—, —O—, an alkylene group (which preferably has 1 to 6 carbon atoms, and may be linear or branched), a cycloalkylene group (preferably having 3 to 15 carbon atoms), an alkenylene group (preferably having 2 to 6 carbon atoms), a divalent aliphatic heterocyclic group (preferably a 5- to 10-membered ring, more preferably a 5- to 7-membered ring, and still more preferably a 5- or 6-membered ring, each having at least one of an N atom, an O atom, an S atom, or an Se atom in the ring structure), and a divalent linking group formed by combination of a plurality of these groups. Examples of $R^A$ include a hydrogen atom or a monovalent substituent. The monovalent substituent is not particularly limited, but is, for example, preferably an alkyl group (which preferably has 1 to 6 carbon atoms, and may be linear or branched).

In addition, the alkylene group, the cycloalkylene group, the alkenylene group, and the divalent aliphatic heterocyclic group may be substituted with a substituent. Examples of the substituent include a halogen atom (preferably a fluorine atom).

As $L^{33}$, among those, the single bond or —O— is preferable.

As $L^{32}$ and $L^{34}$, among those, the single bond or the alkylene group (which preferably has 1 to 6 carbon atoms, and may be linear or branched) is preferable.

$D^{21}$ and $D^{22}$ each independently represent the group represented by General Formula (D1) mentioned above.

Next, the negatively charged atomic group represented by each of $P_1^{X1-}$ and $P_2^{X2-}$ in General Formula (D1) and General Formula (D2) mentioned above will be described.

Examples of the negatively charged atomic group represented by each of $P_1^{X1-}$ and $P_2^{X2-}$ include —SO$_3^-$ and a group having —SO$_3^-$ in a part thereof, —COO$^-$ and a group having —COO$^-$ in a part thereof, a group having —N$^-$— in a part thereof, and a group having a carbanion (—C$^-$<) in a part thereof.

As $P_1^{X1-}$, among those, groups represented by General Formulae (B-1) to (B-13) are preferable.

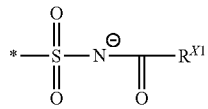

B-1

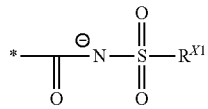

B-2

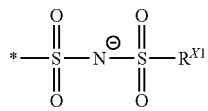

B-3

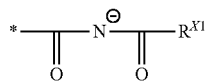

B-4

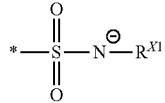

B-5

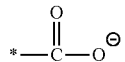

B-6

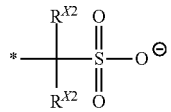

B-7

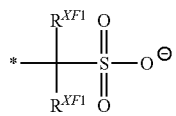

B-8

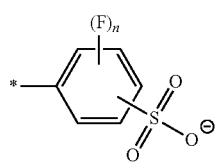

B-9

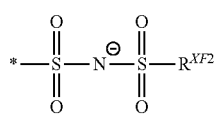

B-10

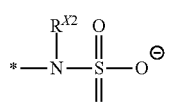

B-11

-continued

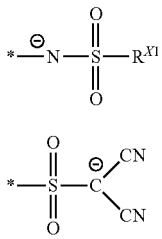

B-12

B-13

In General Formulae (B-1) to (B-13), * represents a bonding position.

Furthermore, it is also preferable that * in General Formula (B-12) is a bonding position to a group which is neither —CO— nor —SO$_2$—.

In General Formulae (B-1) to (B-5), and (B-12), $R^{X1}$ represents an organic group.

As $R^{X1}$, an alkyl group (which may be linear or branched, and preferably has 1 to 15 carbon atoms), a cycloalkyl group (which may be a monocycle or a polycycle, and preferably has 3 to 20 carbon atoms), or an aryl group (which may be a monocycle or a polycycle, and preferably has 6 to 20 carbon atoms) is preferable.

Furthermore, in General Formula (B-5), the atom directly bonded to N$^-$ in $R^{X1}$ is preferably neither a carbon atom in —CO— nor a sulfur atom in —SO$_2$—.

The cycloalkyl group in $R^{X1}$ may be a monocycle or a polycycle.

Examples of the cycloalkyl group in $R^{X1}$ include a norbornyl group and an adamantyl group.

The substituent which may be contained in the cycloalkyl group in $R^{X1}$ is preferably an alkyl group (which may be linear or branched, and preferably has 1 to 5 carbon atoms).

One or more of the carbon atoms which are ring member atoms of the cycloalkyl group in $R^{X1}$ may be substituted with carbonyl carbon atoms.

The alkyl group in $R^{X1}$ preferably has 1 to 10 carbon atoms, and more preferably has 1 to 5 carbon atoms.

The substituent which may be contained in the alkyl group in $R^{X1}$ is preferably a cycloalkyl group, a fluorine atom, or a cyano group.

Examples of the cycloalkyl group as the substituent include those of the cycloalkyl group described in a case where $R^{X1}$ is the cycloalkyl group.

In a case where the alkyl group in $R^{X1}$ has a fluorine atom as the substituent, the alkyl group may be a perfluoroalkyl group.

In addition, in the alkyl group in $R^{X1}$, one or more —CH$_2$—'s may be substituted with a carbonyl group.

The aryl group in $R^{X1}$ is preferably a benzene ring group.

The substituent which may be contained in the aryl group in $R^{X1}$ is preferably an alkyl group, a fluorine atom, or a cyano group. Examples of the alkyl group as the substituent include the alkyl group described in the case where $R^{X1}$ is a cycloalkyl group, a perfluoroalkyl group is preferable, and a perfluoromethyl group is more preferable.

In General Formulae (B-7) and (B-11), $R^{X2}$ represents a hydrogen atom, or a substituent other than a fluorine atom and a perfluoroalkyl group.

The substituent other than a fluorine atom and a perfluoroalkyl group, represented by $R^{X2}$, is preferably an alkyl group other than a perfluoroalkyl group, or a cycloalkyl group.

Examples of the alkyl group include an alkyl group except for a perfluoroalkyl group from the alkyl group in $R^{X1}$. In addition, it is preferable that the alkyl group has no fluorine atom.

Examples of the cycloalkyl group include the cycloalkyl group in $R^{X1}$. In addition, the cycloalkyl group preferably has no fluorine atom.

In General Formula (B-8), $R^{XF1}$ represents a hydrogen atom, a fluorine atom, or a perfluoroalkyl group. It should be noted that at least one of the plurality of $R^{XF1}$'s represents a fluorine atom or a perfluoroalkyl group.

The perfluoroalkyl group represented by $R^{XF1}$ preferably has 1 to 15 carbon atoms, more preferably has 1 to 10 carbon atoms, and still more preferably has 1 to 6 carbon atoms.

In General Formula (B-10), $R^{XF2}$ represents a fluorine atom or a perfluoroalkyl group.

The perfluoroalkyl group represented by $R^{XF2}$ preferably has 1 to 15 carbon atoms, more preferably has 1 to 10 carbon atoms, and still more preferably has 1 to 6 carbon atoms.

In General Formula (B-9), n represents an integer of 0 to 4.

As $P_2^{X2-}$, among those, the groups represented by General Formulae (C-1) to (C-19) are preferable.

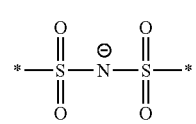

C-1

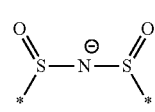

C-2

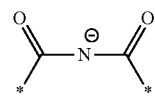

C-3

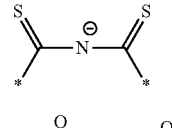

C-4

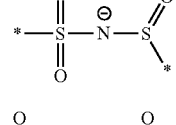

C-5

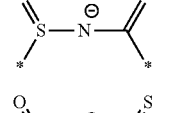

C-6

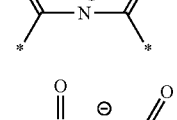

C-7

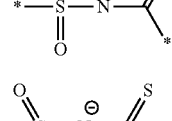

C-8

C-9

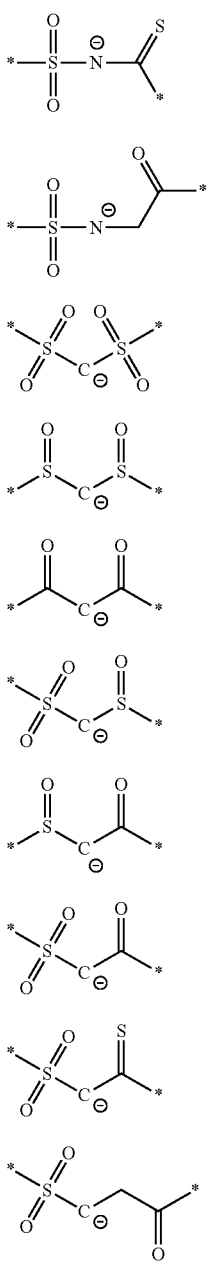

It is preferable that the structures of two or more anionic moieties among the anionic moieties (anionic functional groups) included in the specific compound are different from each other.

The combination of the anionic moieties (anionic functional groups) is not particularly limited, but is preferably, for example, a combination of General Formula (B-10) and General Formula (C-1), a combination of General Formula (B-10) and General Formula (C-8), a combination of General Formula (C-1) and General Formula (B-8), a combination of General Formula (C-1) and General Formula (B-1), or a combination of General Formula (B-2) and General Formula (B-6). In a case where the combination is used, a difference in the acid dissociation constant of the acidic moiety derived from each anionic moiety is more appropriate, and the LWR performance of a pattern formed is more excellent.

As the positively charged atomic group represented by each of $Q_1^{X1+}$ and $Q_2^{X2+}$ in General Formula (D1) and General Formula (D2), organic cations shown below are preferable.

The organic cations represented by $Q_1^{X1+}$ and $Q_2^{X2+}$ are each independently preferably an organic cation represented by General Formula (ZaI) (cation (ZaI)) or an organic cation represented by General Formula (ZaII) (cation (ZaII)).

$$\begin{array}{c} R^{201} \\ | \\ S^+ - R^{202} \\ | \\ R^{203} \end{array} \quad \text{(ZaI)}$$

$$R^{204} - I^+ - R^{205} \quad \text{(ZaII)}$$

In General Formula (ZaI),
$R^{201}$, $R^{202}$, and $R^{203}$ each independently represent an organic group.

The organic group as each of $R^{201}$, $R^{202}$, and $R^{203}$ usually has 1 to 30 carbon atoms, and preferably has 1 to 20 carbon atoms. In addition, two of $R^{201}$ to $R^{203}$ may be bonded to each other to form a ring structure, and the ring may include an oxygen atom, a sulfur atom, an ester group, an amide group, or a carbonyl group. Examples of the group formed by the bonding of two of $R^{201}$ to $R^{203}$ include an alkylene group (for example, a butylene group and a pentylene group), and —$CH_2$—$CH_2$—O—$CH_2$—$CH_2$—.

Suitable aspects of the organic cation as General Formula (ZaI) include a cation (ZaI-1), a cation (ZaI-2), an organic cation represented by General Formula (ZaI-3b) (cation (ZaI-3b)), and an organic cation represented by General Formula (ZaI-4b) (cation (ZaI-4b)), each of which will be described later.

First, the cation (ZaI-1) will be described.

The cation (ZaI-1) is an arylsulfonium cation in which at least one of $R^{201}$, $R^{202}$, or $R^{203}$ of General Formula (ZaI) is an aryl group.

In the arylsulfonium cation, all of $R^{201}$ to $R^{203}$ may be aryl groups, or some of $R^{201}$ to $R^{203}$ may be an aryl group, and the rest may be an alkyl group or a cycloalkyl group.

In addition, one of $R^{201}$ to $R^{203}$ may be an aryl group, two of $R^{201}$ to $R^{203}$ may be bonded to each other to form a ring structure, and an oxygen atom, a sulfur atom, an ester group, an amide group, or a carbonyl group may be included in the ring. Examples of the group formed by the bonding of two of $R^{201}$ to $R^{203}$ include an alkylene group (for example, a butylene group, a pentylene group, or —$CH_2$—$CH_2$—O—$CH_2$—$CH_2$—) in which one or more methylene groups may be substituted with an oxygen atom, a sulfur atom, an ester group, an amide group, and/or a carbonyl group.

Examples of the arylsulfonium cation include a triarylsulfonium cation, a diarylalkylsulfonium cation, an aryldialkylsulfonium cation, a diarylcycloalkylsulfonium cation, and an aryldicycloalkylsulfonium cation.

As the aryl group included in the arylsulfonium cation, a phenyl group or a naphthyl group is preferable, and the phenyl group is more preferable. The aryl group may be an aryl group which has a heterocyclic structure having an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In a case where the arylsulfonium cation has two or more aryl groups, the two or more aryl groups may be the same as or different from each other.

The alkyl group or the cycloalkyl group contained in the arylsulfonium cation, as necessary, is preferably a linear alkyl group having 1 to 15 carbon atoms, a branched alkyl group having 3 to 15 carbon atoms, or a cycloalkyl group having 3 to 15 carbon atoms, and examples thereof include a methyl group, an ethyl group, a propyl group, an n-butyl group, a sec-butyl group, a t-butyl group, a cyclopropyl group, a cyclobutyl group, and a cyclohexyl group.

Examples of the substituent which may be contained in each of the aryl group, the alkyl group, and the cycloalkyl group of each of $R^{201}$ to $R^{203}$ each independently include an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a cycloalkylalkoxy group (for example, having 1 to 15 carbon atoms), a halogen atom, a hydroxyl group, and a phenylthio group.

The substituent may further have a substituent as possible, and may be in the form of an alkyl halide group such as a trifluoromethyl group, for example, in which the alkyl group has a halogen atom as a substituent.

Next, the cation (ZaI-2) will be described.

The cation (ZaI-2) is a cation in which $R^{201}$ to $R^{203}$ in Formula (ZaI) each independently represent an organic group having no aromatic ring. Here, the aromatic ring also encompasses an aromatic ring including a heteroatom.

The organic group having no aromatic ring as each of $R^{201}$ to $R^{203}$ generally has 1 to 30 carbon atoms, and preferably 1 to 20 carbon atoms.

$R^{201}$ to $R^{203}$ are each independently preferably an alkyl group, a cycloalkyl group, an allyl group, or a vinyl group, more preferably a linear or branched 2-oxoalkyl group, a 2-oxocycloalkyl group, or an alkoxycarbonylmethyl group, and still more preferably the linear or branched 2-oxoalkyl group.

Examples of the alkyl group and the cycloalkyl group of each of $R^{201}$ to $R^{203}$ include a linear alkyl group having 1 to 10 carbon atoms or branched alkyl group having 3 to 10 carbon atoms (for example, a methyl group, an ethyl group, a propyl group, a butyl group, and a pentyl group), and a cycloalkyl group having 3 to 10 carbon atoms (for example, a cyclopentyl group, a cyclohexyl group, and a norbornyl group).

$R^{201}$ to $R^{203}$ may further be substituted with a halogen atom, an alkoxy group (for example, having 1 to 5 carbon atoms), a hydroxyl group, a cyano group, or a nitro group.

Next, the cation (ZaI-3b) will be described.

The cation (ZaI-3b) is a cation represented by General Formula (ZaI-3b).

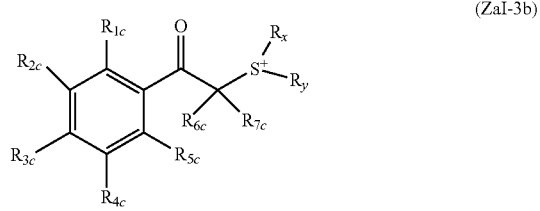

(ZaI-3b)

In General Formula (ZaI-3b), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

$R_{6c}$ and $R_{7c}$ each independently represent a hydrogen atom, an alkyl group (a t-butyl group or the like), a cycloalkyl group, a halogen atom, a cyano group, or an aryl group.

$R_x$ and $R_y$ each independently represent an alkyl group, a cycloalkyl group, a 2-oxoalkyl group, a 2-oxocycloalkyl group, an alkoxycarbonylalkyl group, an allyl group, or a vinyl group.

Any two or more of $R_{1c}$ to $R_{5c}$, $R_{5c}$ and $R_{6c}$, $R_{6c}$ and $R_{7c}$, $R_{5c}$ and $R_x$, and $R_x$ and $R_y$ may each be bonded to each other to form a ring, and the ring may each independently include an oxygen atom, a sulfur atom, a ketone group, an ester bond, or an amide bond.

Examples of the ring include an aromatic or non-aromatic hydrocarbon ring, an aromatic or non-aromatic heterocyclic ring, and a polycyclic fused ring formed by combination of two or more of these rings. Examples of the ring include a 3- to 10-membered ring, and the ring is preferably a 4- to 8-membered ring, and more preferably a 5- or 6-membered ring.

Examples of the group formed by the bonding of any two or more of $R_{1c}$ to $R_{5c}$, $R_{6c}$ and $R_{7c}$, and $R_x$ and $R_y$ include an alkylene group such as a butylene group and a pentylene group. The methylene group in this alkylene group may be substituted with a heteroatom such as an oxygen atom.

As the group formed by the bonding of $R_{5c}$ and $R_{6c}$, and $R_{5c}$ and $R_x$, a single bond or an alkylene group is preferable. Examples of the alkylene group include a methylene group and an ethylene group.

Next, the cation (ZaI-4b) will be described.

The cation (ZaI-4b) is a cation represented by General Formula (ZaI-4b).

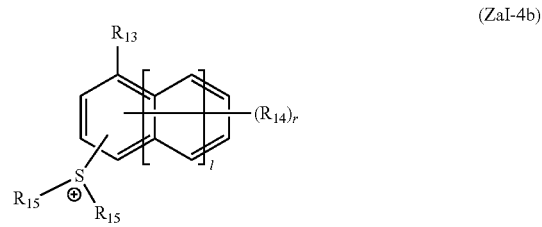

(ZaI-4b)

In General Formula (ZaI-4b), l represents an integer of 0 to 2.

r represents an integer of 0 to 8.

$R_{13}$ represents a hydrogen atom, a fluorine atom, a hydroxyl group, an alkyl group, an alkoxy group, an alkoxycarbonyl group, or a group having a cycloalkyl group (which may be the cycloalkyl group itself or a group including the cycloalkyl group in a part thereof). These groups may have a substituent.

$R_{14}$ represents a hydroxyl group, an alkyl group, an alkoxy group, an alkoxycarbonyl group, an alkylcarbonyl group, an alkylsulfonyl group, a cycloalkylsulfonyl group, or a group having a cycloalkyl group (which may be the cycloalkyl group itself or a group including the cycloalkyl group in a part thereof). These groups may have a substituent. In a case where $R_{14}$'s are present in a plural number, $R_{14}$'s each independently represent the group such as a hydroxyl group.

$R_{15}$'s each independently represent an alkyl group, a cycloalkyl group, or a naphthyl group. These groups may have a substituent. Two $R_{15}$'s may be bonded to each other to form a ring. In a case where two $R_{15}$'s are bonded to each other to form a ring, the ring skeleton may include a heteroatom such as an oxygen atom and a nitrogen atom. In one aspect, it is preferable that two $R_{15}$'s are alkylene groups and are bonded to each other to form a ring structure.

In General Formula (ZaI-4b), the alkyl groups of each of $R_{13}$, $R_{14}$, and $R_{15}$ are linear or branched. The alkyl group preferably has 1 to 10 carbon atoms. As the alkyl group, a methyl group, an ethyl group, an n-butyl group, a t-butyl group, or the like is more preferable.

Next, General Formula (ZaII) will be described.

In General Formula (ZaII), $R^{204}$ and $R^{205}$ each independently represent an aryl group, an alkyl group, or a cycloalkyl group.

As the aryl group of each of $R^{204}$ and $R^{205}$, a phenyl group or a naphthyl group is preferable, and the phenyl group is more preferable. The aryl group of each of $R^{204}$ and $R^{205}$ may be an aryl group which has a heterocyclic ring having an oxygen atom, a nitrogen atom, a sulfur atom, or the like. Examples of the skeleton of the aryl group having a heterocyclic ring include pyrrole, furan, thiophene, indole, benzofuran, and benzothiophene.

As the alkyl group and the cycloalkyl group of each of $R^{204}$ and $R^{205}$, a linear alkyl group having 1 to 10 carbon atoms or a branched alkyl group having 3 to 10 carbon atoms (for example, a methyl group, an ethyl group, a propyl group, a butyl group, and a pentyl group), or a cycloalkyl group having 3 to 10 carbon atoms (for example, a cyclopentyl group, a cyclohexyl group, and a norbornyl group) is preferable.

The aryl group, the alkyl group, and the cycloalkyl group of each of $R^{204}$ and $R^{205}$ may each independently have a substituent. Examples of the substituent which may be contained in each of the aryl group, the alkyl group, and the cycloalkyl group of each of $R^{204}$ and $R^{205}$ include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

The specific compound is also preferably the following compound (I). In the following compound (I), the structures of two or more of the anionic moieties (anionic functional groups) in the compound are different from each other, and the acid dissociation constants of the acidic moieties derived from these anionic moieties are also different from each other.

Furthermore, the following compound (I) further includes a polymerizable group, and a type and a suitable aspect of the polymerizable group are as described earlier.

Compound (I): a compound having at least one of each of the following structural moiety X and the following structural moiety Y, and a polymerizable group, which generates an acid including the polymerizable group, the following first acidic moiety derived from the following structural moiety X, and the following second acidic moiety derived from the following structural moiety Y by irradiation with actinic rays or radiation Structural moiety X: a structural moiety which consists of an anionic moiety $A_1^-$ and a cationic moiety $M_1^+$, and forms a first acidic moiety represented by $HA_1$ by irradiation with actinic rays or radiation Structural moiety Y: a structural moiety which consists of an anionic moiety $A_2^-$ and a cationic moiety $M_2^+$, and forms a second acidic moiety represented by $HA_2$, having a structure different from that of the first acidic moiety formed by the structural moiety X, by irradiation with actinic rays or radiation It should be noted that the compound (I) satisfies the following condition I.

Condition I: a compound PI formed by substituting the cationic moiety $M_1^+$ in the structural moiety X and the cationic moiety $M_2^+$ in the structural moiety Y with $H^+$ in the compound (I) has an acid dissociation constant a1 derived from an acidic moiety represented by $HA_1$, formed by substituting the cationic moiety $M_1^+$ in the structural moiety X with $H^+$, and an acid dissociation constant a2 derived from an acidic moiety represented by $HA_2$, formed by substituting the cationic moiety $M_2^+$ in the structural moiety Y with $H^+$, and the acid dissociation constant a2 is larger than the acid dissociation constant a1.

In addition, the compound PI corresponds to an acid generated by irradiating the compound (I) with actinic rays or radiation.

Furthermore, the acid dissociation constant a1 and the acid dissociation constant a2 are determined by the above-mentioned method. More specifically, with regard to the acid dissociation constant a1 and the acid dissociation constant a2 of the compound PI, in a case where the acid dissociation constant of the compound PI is determined, the pKa with which the compound PI (in which the compound PI corresponds to a "compound having a polymerizable group, and $HA_1$ and $HA_2$") serves as a "compound having a polymerizable group, and $A_1^-$ and $HA_2$" is the acid dissociation constant a1, and the pKa with which "compound having a polymerizable group, and $A_1^-$ and $HA_2$" serves as a "compound having a polymerizable group, and $A_1^-$ and $A_2^{-}$" is the acid dissociation constant a2.

From the viewpoint that the LWR performance of a pattern formed is more excellent, the difference between the acid dissociation constant a1 and the acid dissociation constant a2 in the compound PI is preferably 0.10 or more, and more preferably 2.0 or more. Furthermore, the upper limit value of the difference between the acid dissociation constant a1 and the acid dissociation constant a2 is not particularly limited, but is, for example, preferably 15.0 or less.

In addition, for the compound PI, the acid dissociation constant a2 is preferably 6.5 or less, and from the viewpoint that the stability of the cationic moiety of the compound (I) in the resist composition is more excellent, the acid dissociation constant a2 is more preferably 3.0 or less, and still more preferably 1.0 or less. Furthermore, a lower limit value of the acid dissociation constant a2 is preferably −4.5 or more.

In addition, from the viewpoint that the LWR performance of a pattern formed is more excellent, the acid dissociation constant a1 is preferably 2.0 or less, more preferably 0.5 or less, and still more preferably −0.1 or less in the compound PI. Furthermore, a lower limit value of the acid dissociation constant a1 is preferably −15.0 or more.

Specifically, the above-mentioned specific structural moiety corresponds to the structural moiety X and the structural moiety Y.

Specific examples of the compound (I) include the compounds of General Formula (S1) (provided that in $D^{11}$ and $D^{12}$, the valences represented by X1 and X2 are each 1) mentioned above, and General Formula (S2) (provided that in $D^{21}$ and $D^{22}$, the valences represented by X1 and X2 are each 1) mentioned above. That is, the structural moiety X and the structural moiety Y in the compound (I) correspond to one and the other of $D^{11}$ and $D^{12}$ in General Formula (S1)

mentioned above. In addition, the structural moiety X and the structural moiety Y in the compound (I) correspond to one and the other of $D^{21}$ and $D^{22}$ in General Formula (S2) mentioned above.

It is possible to set the acid dissociation constant a1 and the acid dissociation constant a2 within a predetermined range by appropriately selecting the anionic moiety (anionic functional group) in the structural moiety X and the structural moiety Y in the compound (I).

The combination of the anionic moiety $A_1^-$ and the anionic moiety $A_2^-$ is, for example, preferably a combination of General Formula (B-10) mentioned above and General Formula (C-1) mentioned above, a combination of General Formula (B-10) mentioned above and General Formula (C-8) mentioned above, a combination of General Formula (C-1) mentioned above and General Formula (B-8) mentioned above, a combination of General Formula (C-1) mentioned above and General Formula (B-1) mentioned above, or a combination of General Formula (B-2) mentioned above and General Formula (B-6) mentioned above.

The specific compound can be synthesized according to a known synthetic method.

Hereinafter, a specific example of the specific compound will be shown.

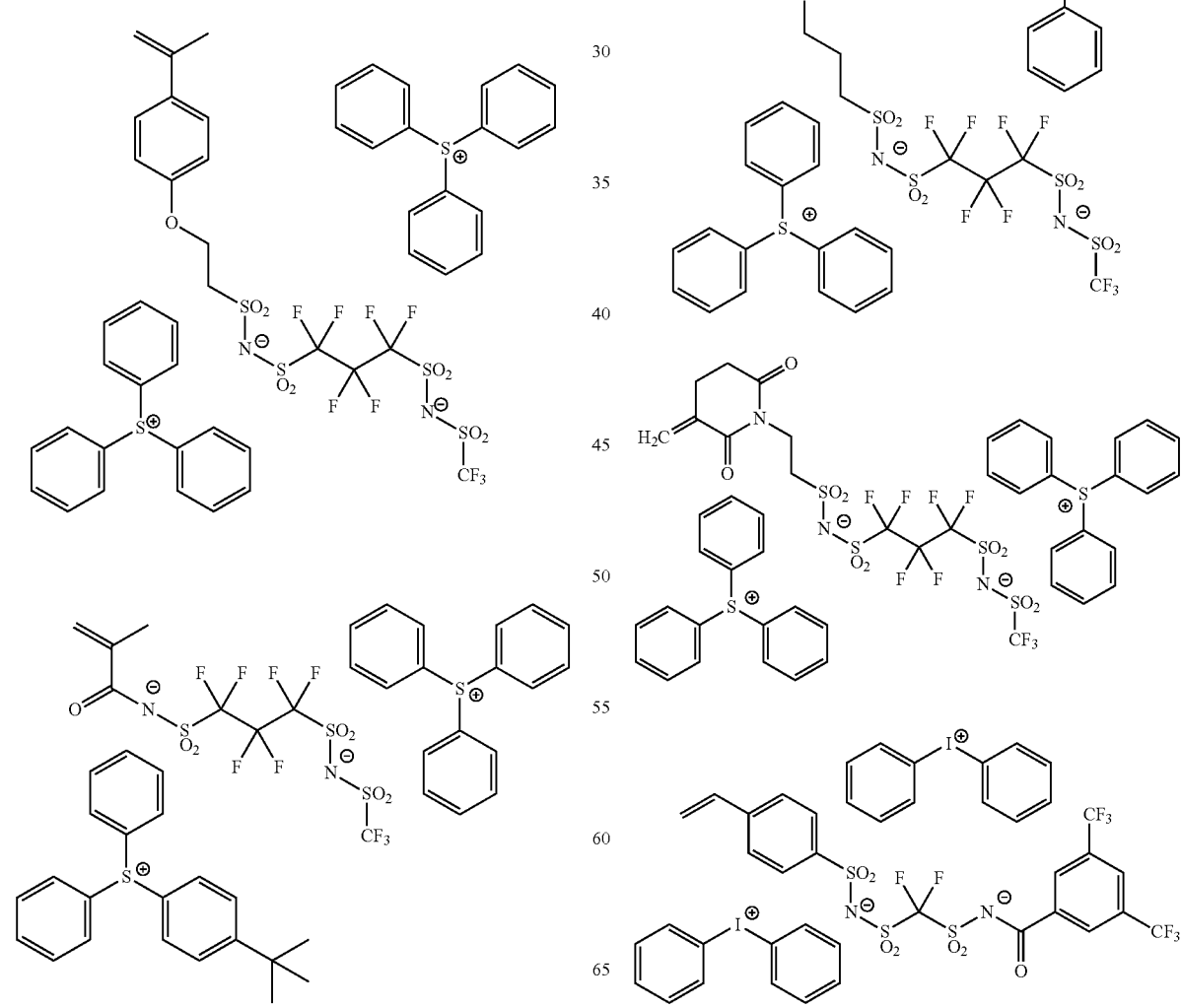

[Resin]

Hereinafter, the resin of an embodiment of the present invention will be described. The resin of the embodiment of the present invention is as follows.

Specific Resin X (First Embodiment)

a resin including a repeating unit derived from the above-mentioned specific compound (hereinafter also referred to as a "specific repeating unit")

Specific Resin Y (Second Embodiment)

a resin including:
an acid-decomposable group,
a group having a first structural moiety consisting of a first anionic moiety and a first cationic moiety (hereinafter also referred to as a "first structural moiety-containing group"), and
a group having a second structural moiety consisting of a second anionic moiety and a second cationic moiety (hereinafter also referred to as a "second structural moiety-containing group").
in which the first structural moiety forms a first acidic moiety derived from the first anionic moiety by irradiation with actinic rays or radiation,
the second structural moiety forms a second acidic moiety derived from the second anionic moiety by irradiation with actinic rays or radiation, and
the second acidic moiety has a structure different from the first acidic moiety, and has an acid dissociation constant larger than an acid dissociation constant of the first acidic moiety.

Specific Resin X (First Embodiment)

The specific resin X includes a repeating unit derived from the above-mentioned specific compound (specific repeating unit).

A content of the specific repeating unit is preferably 1% by mole or more, more preferably 3% by mole or more, and still more preferably 5% by mole or more with respect to all repeating units in the specific resin X. In addition, an upper limit value thereof is preferably 30% by mole or less, more preferably 20% by mole or less, and particularly preferably 15% by mole or less.

The specific resin X is preferably a resin having a polarity that increases through decomposition by the action of an acid (hereinafter also referred to as an "acid-decomposable resin").

That is, in a case where the specific resin X is an acid-decomposable resin, in the pattern forming method of an embodiment of the present invention which will be described later, typically, in a case where an alkali developer is adopted as the developer, a positive tone pattern is suitably formed, and in a case where an organic developer is adopted as the developer, a negative tone pattern is suitably formed.

The specific resin X usually includes a repeating unit having a group having a polarity that increases through decomposition by the action of an acid (hereinafter also referred to as an "acid-decomposable group"), and preferably includes a repeating unit having an acid-decomposable group.

<Repeating Unit Having Acid-Decomposable Group>

The acid-decomposable group is a group that decomposes by the action of an acid to produce a polar group. The acid-decomposable group preferably has a structure in which the polar group is protected by a leaving group that leaves by the action of an acid. That is, the specific resin X preferably has a repeating unit having a group that decomposes by the action of an acid to produce a polar group. A resin having this repeating unit has an increased polarity by the action of an acid, and thus has an increased solubility in an alkali developer, and a decreased solubility in an organic solvent.

As the polar group, an alkali-soluble group is preferable, and examples thereof include an acidic group such as a carboxyl group, a phenolic hydroxyl group, a fluorinated alcohol group, a sulfonic acid group, a phosphoric acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris (alkylsulfonyl)methylene group, and an alcoholic hydroxyl group.

As the polar group, among those, the carboxyl group, the phenolic hydroxyl group, the fluorinated alcohol group (preferably a hexafluoroisopropanol group), or the sulfonic acid group is preferable.

Examples of the leaving group that leaves by the action of an acid include groups represented by Formulae (Y1) to (Y4).

—C(Rx$_1$)(Rx$_2$)(Rx$_3$)   Formula (Y1):

—C(=O)OC(Rx$_1$)(Rx$_2$)(Rx$_3$)   Formula (Y2):

—C(R$_{36}$)(R$_{37}$)(OR$_{38}$)   Formula (Y3):

—C(Rn)(H)(Ar)   Formula (Y4):

In Formula (Y1) and Formula (Y2), Rx$_1$ to Rx$_3$ each independently represent an (linear or branched) alkyl group or (monocyclic or polycyclic) cycloalkyl group, an (linear or branched) alkenyl group, or an (monocyclic or polycyclic) aryl group. In a case where possible, these groups preferably have a fluorine atom or a group having a fluorine atom as a substituent.

Furthermore, in a case where all of Rx$_1$ to Rx$_3$ are (linear or branched) alkyl groups, it is preferable that at least two of Rx$_1$, Rx$_2$, or Rx$_3$ are methyl groups.

Above all, it is preferable that Rx$_1$ to Rx$_3$ each independently represent a linear or branched alkyl group, and it is more preferable that Rx$_1$ to Rx$_3$ each independently represent the linear alkyl group.

Two of Rx$_1$ to Rx$_3$ may be bonded to each other to form a monocycle or a polycycle.

As the alkyl group of each of Rx$_1$ to Rx$_3$, an alkyl group having 1 to 5 carbon atoms, such as a methyl group, an ethyl group, an n-propyl group, an isopropyl group, an n-butyl group, an isobutyl group, and a t-butyl group, is preferable.

As the cycloalkyl group of each of Rx$_1$ to Rx$_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the aryl group as each of Rx$_1$ to Rx$_3$, an aryl group having 6 to 10 carbon atoms is preferable, and examples thereof include a phenyl group, a naphthyl group, and an anthryl group.

As the alkenyl group of each of Rx$_1$ to Rx$_3$, a vinyl group is preferable.

As a ring formed by the bonding of two of Rx$_1$ to Rx$_3$, a cycloalkyl group is preferable. As the cycloalkyl group formed by the bonding of two of Rx$_1$ to Rx$_3$, a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group is preferable, and a monocyclic cycloalkyl group having 5 or 6 carbon atoms is more preferable.

In the cycloalkyl group formed by the bonding of two of Rx$_1$ to Rx$_3$, for example, one of the methylene groups constituting the ring may be substituted with a heteroatom such as an oxygen atom, a group having a heteroatom, such as a carbonyl group, or a vinylidene group. In addition, in the cycloalkyl group, one or more of the ethylene groups constituting the cycloalkane ring may be substituted with a vinylene group.

With regard to the group represented by Formula (Y1) or Formula (Y2), for example, an aspect in which Rx$_1$ is a methyl group or an ethyl group, and Rx$_2$ and Rx$_3$ are bonded to each other to form a cycloalkyl group is also preferable.

In Formula (Y3), R$_{36}$ to R$_{38}$ each independently represent a hydrogen atom or a monovalent organic group. R$_{37}$ and R$_{38}$ may be bonded to each other to form a ring. Examples of the monovalent organic group include an alkyl group, a cycloalkyl group, an aryl group, an aralkyl group, and an alkenyl group. It is also preferable that R$_{36}$ is the hydrogen atom.

Furthermore, the alkyl group, the cycloalkyl group, the aryl group, and the aralkyl group may include a heteroatom such as an oxygen atom, and/or a group having a heteroatom, such as a carbonyl group. For example, in the alkyl group, the cycloalkyl group, the aryl group, and the aralkyl group, one or more of the methylene groups may be substituted with a heteroatom such as an oxygen atom and/or a group having a heteroatom, such as a carbonyl group.

In addition, R$_{38}$ and another substituent contained in the main chain of the repeating unit may be bonded to each other to form a ring. A group formed by the mutual bonding of R$_{38}$ and another substituent on the main chain of the repeating unit is preferably an alkylene group such as a methylene group.

As Formula (Y3), a group represented by Formula (Y3-1) is preferable.

(Y3-1)

Here, L$_1$ and L$_2$ each independently represent a hydrogen atom, an alkyl group, a cycloalkyl group, an aryl group, or a group formed by combination thereof (for example, a group formed by combination of an alkyl group and an aryl group).

M represents a single bond or a divalent linking group.

Q represents an alkyl group which may include a heteroatom, a cycloalkyl group which may include a heteroatom, an aryl group which may include a heteroatom, an amino group, an ammonium group, a mercapto group, a cyano group, an aldehyde group, or a group formed by combination thereof (for example, a group formed by combination of an alkyl group and a cycloalkyl group).

In the alkyl group and the cycloalkyl group, for example, one of the methylene groups may be substituted with a heteroatom such as an oxygen atom or a group having a heteroatom, such as a carbonyl group.

In addition, it is preferable that one of L$_1$ or L$_2$ is a hydrogen atom, and the other is an alkyl group, a cycloalkyl group, an aryl group, or a group formed by combination of an alkylene group and an aryl group.

At least two of Q, M, or $L_1$ may be bonded to each other to form a ring (preferably a 5- or 6-membered ring).

From the viewpoint of pattern miniaturization, $L_2$ is preferably a secondary or tertiary alkyl group, and more preferably the tertiary alkyl group. Examples of the secondary alkyl group include an isopropyl group, a cyclohexyl group, and a norbornyl group, and examples of the tertiary alkyl group include a tert-butyl group and an adamantane group. In these aspects, since the glass transition temperature (Tg) and the activation energy are increased, it is possible to suppress fogging in addition to ensuring film hardness.

In Formula (Y4), Ar represents an aromatic ring group. Rn represents an alkyl group, a cycloalkyl group, or an aryl group. Rn and Ar may be bonded to each other to form a non-aromatic ring. Ar is more preferably the aryl group.

From the viewpoint that the acid decomposability of the repeating unit is excellent, in a case where a non-aromatic ring is directly bonded to a polar group (or a residue thereof) in a leaving group that protects the polar group, it is also preferable that a ring member atom adjacent to the ring member atom directly bonded to the polar group (or a residue thereof) in the non-aromatic ring has no halogen atom such as a fluorine atom as a substituent.

In addition, the leaving group that leaves by the action of an acid may be a 2-cyclopentenyl group having a substituent (an alkyl group and the like), such as a 3-methyl-2-cyclopentenyl group, and a cyclohexyl group having a substituent (an alkyl group and the like), such as a 1,1,4,4-tetramethylcyclohexyl group.

As the repeating unit having an acid-decomposable group, a repeating unit represented by Formula (A) is also preferable.

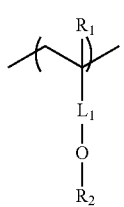

(A)

$L_1$ represents a divalent linking group which may have a fluorine atom or an iodine atom, $R_1$ represents a hydrogen atom, a fluorine atom, an iodine atom, a fluorine atom, an alkyl group which may have an iodine atom, or an aryl group which may have a fluorine atom or an iodine atom, and $R_2$ represents a leaving group that leaves by the action of an acid and may have a fluorine atom or an iodine atom. It should be noted that at least one of $L_1$, $R_1$, or $R_2$ has a fluorine atom or an iodine atom.

$L_1$ represents a divalent linking group which may have a fluorine atom or an iodine atom. Examples of the divalent linking group which may have a fluorine atom or an iodine atom include —CO—, —O—, —S—, —SO—, —SO$_2$—, a hydrocarbon group which may have a fluorine atom or an iodine atom (for example, an alkylene group, a cycloalkylene group, an alkenylene group, and an arylene group), and a linking group formed by the linking of a plurality of these groups. Among those, as $L_1$, —CO— or -arylene group-alkylene group having a fluorine atom or an iodine atom— is preferable.

As the arylene group, a phenylene group is preferable.

The alkylene group may be linear or branched. The number of carbon atoms of the alkylene group is not particularly limited, but is preferably 1 to 10, and more preferably 1 to 3.

The total number of fluorine atoms and iodine atoms included in the alkylene group having a fluorine atom or an iodine atom is not particularly limited, but is preferably 2 or more, more preferably 2 to 10, and still more preferably 3 to 6.

$R_1$ represents a hydrogen atom, a fluorine atom, an iodine atom, an alkyl group which may have a fluorine atom or an iodine atom, or an aryl group which may have a fluorine atom or an iodine atom.

The alkyl group may be linear or branched. The number of carbon atoms of the alkyl group is not particularly limited, but is preferably 1 to 10, and more preferably 1 to 3.

The total number of fluorine atoms and iodine atoms included in the alkyl group having a fluorine atom or an iodine atom is not particularly limited, but is preferably 1 or more, more preferably 1 to 5, and still more preferably 1 to 3.

The alkyl group may include a heteroatom such as an oxygen atom, other than a halogen atom.

$R_2$ represents a leaving group that leaves by the action of an acid and may have a fluorine atom or an iodine atom.

Examples of the leaving group include the groups represented by Formulae (Y1) to (Y4) mentioned above.

As the repeating unit having an acid-decomposable group, for example, the repeating units described in paragraphs [0068] to [0108] of JP2014-010245A, the contents of which are incorporated herein by reference, can also be used.

A content of the repeating unit having an acid-decomposable group is preferably 15% to 95% by mole, more preferably 30% to 80% by mole, and still more preferably 30% to 70% by mole with respect to all repeating units in the specific resin X.

<Repeating Unit Having Lactone Group, Sultone Group, or Carbonate Group>

The specific resin X may have a repeating unit having at least one selected from the group consisting of a lactone group, a sultone group, and a carbonate group (hereinafter also collectively referred to as a "repeating unit having a lactone group, a sultone group, or a carbonate group").

It is also preferable that the repeating unit having a lactone group, a sultone group, or a carbonate group has no acid group such as a hexafluoropropanol group.

The lactone group or the sultone group may have a lactone structure or a sultone structure. The lactone structure or the sultone structure is preferably a 5- to 7-membered ring lactone structure or a 5- to 7-membered ring sultone structure. Among those, the structure is more preferably a 5- to 7-membered ring lactone structure with which another ring structure is fused so as to form a bicyclo structure or a spiro structure or a 5- to 7-membered ring sultone structure with which another ring structure is fused so as to form a bicyclo structure or a spiro structure.

The specific resin X preferably has a repeating unit having a lactone group or a sultone group, formed by extracting one or more hydrogen atoms from a ring member atom of a lactone structure represented by any of General Formulae (LC1-1) to (LC1-21) or a sultone structure represented by any of General Formulae (SL1-1) to (SL1-3).

In addition, the lactone group or the sultone group may be bonded directly to the main chain. For example, a ring member atom of the lactone group or the sultone group may constitute the main chain of the specific resin X.

LC1-1
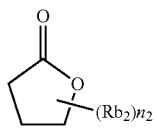
LC1-2
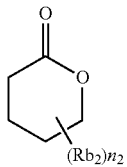
LC1-3
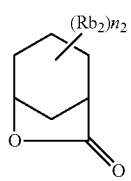
LC1-4
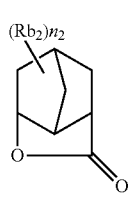
LC1-5
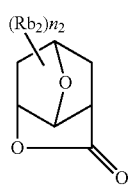
LC1-6
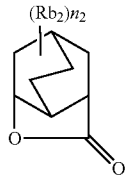
LC1-7
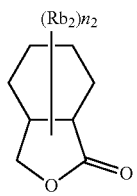
LC1-8
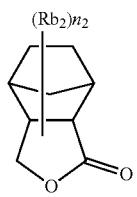
-continued
LC1-9
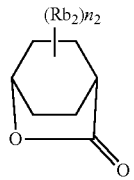
LC1-10
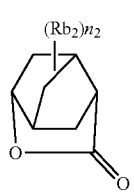
LC1-11
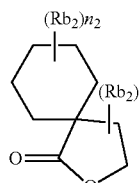
LC1-12
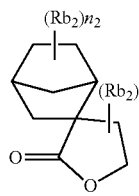
LC1-13
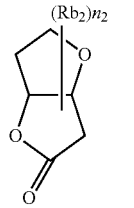
LC1-14
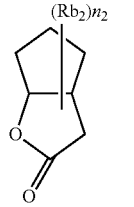
LC1-15
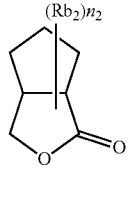
LC1-16
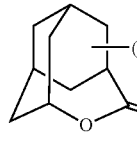

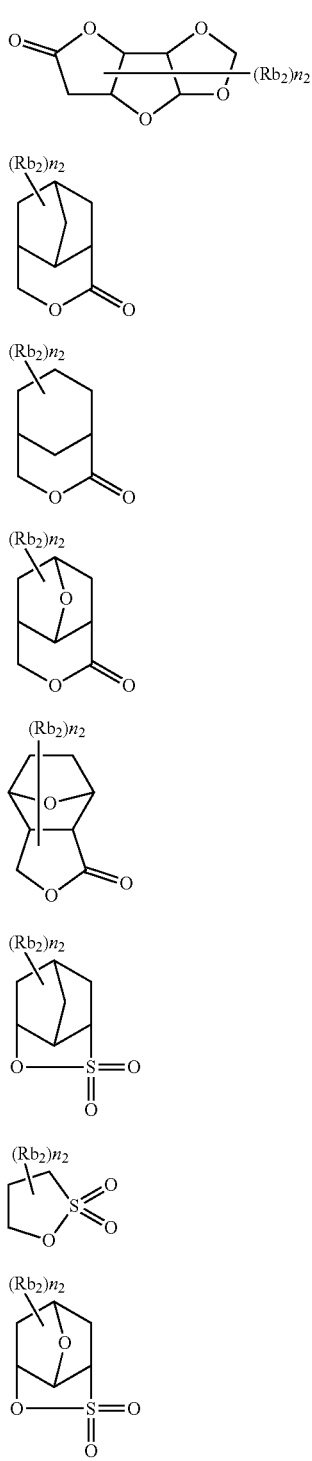

LC1-17
LC1-18
LC1-19
LC1-20
LC1-21
SL1-1
SL1-2
SL1-3

The moiety of the lactone structure or the sultone structure may have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, and an acid-decomposable group. n2 represents an integer of 0 to 4. In a case where n2 is 2 or more, $Rb_2$'s which are present in a plural number may be different from each other, and $Rb_2$'s which are present in a plural number may be bonded to each other to form a ring.

Examples of the repeating unit having a group having the lactone structure represented by any of General Formulae (LC1-1) to (LC1-21) or the sultone structure represented by any of General Formulae (SL1-1) to (SL1-3) include a repeating unit represented by General Formula (AI).

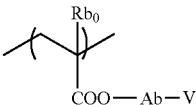

(AI)

In General Formula (AI), $Rb_0$ represents a hydrogen atom, a halogen atom, or an alkyl group having 1 to 4 carbon atoms.

Preferred examples of the substituent which may be contained in the alkyl group of $Rb_0$ include a hydroxyl group and a halogen atom.

Examples of the halogen atom of $Rb_0$ include a fluorine atom, a chlorine atom, a bromine atom, and an iodine atom. $Rb_0$ is preferably the hydrogen atom or a methyl group.

Ab represents a single bond, an alkylene group, a divalent linking group having a monocyclic or polycyclic alicyclic hydrocarbon structure, an ether group, an ester group, a carbonyl group, a carboxyl group, or a divalent group formed by combination thereof. Among those, the single bond or a linking group represented by -$Ab_1$-$CO_2$— is preferable. $Ab_1$ is a linear or branched alkylene group, or a monocyclic or polycyclic cycloalkylene group, and is preferably a methylene group, an ethylene group, a cyclohexylene group, an adamantylene group, or a norbornylene group.

V represents a group formed by extracting one hydrogen atom from a ring member atom of the lactone structure represented by any of General Formulae (LC1-1) to (LC1-21) or a group formed by extracting one hydrogen atom from a ring member atom of the sultone structure represented by any of General Formulae (SL1-1) to (SL1-3).

In a case where an optical isomer is present in the repeating unit having a lactone group or a sultone group, any of optical isomers may be used. In addition, one kind of optical isomers may be used alone or a plurality of kinds of optical isomers may be mixed and used. In a case where one kind of optical isomers is mainly used, an optical purity (ee) thereof is preferably 90 or more, and more preferably 95 or more.

As the carbonate group, a cyclic carbonic acid ester group is preferable.

As the repeating unit having a cyclic carbonic acid ester group, a repeating unit represented by General Formula (A-1) is preferable.

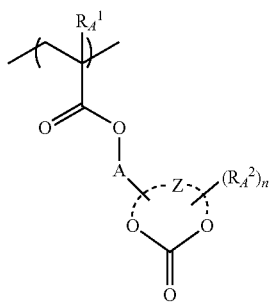

(A-1)

In General Formula (A-1), $R_A^1$ represents a hydrogen atom, a halogen atom, or a monovalent organic group (preferably a methyl group).

n represents an integer of 0 or more.

$R_A^2$ represents a substituent. In a case where n is 2 or more, $R_A^2$ which are present in a plural number may be the same as or different from each other.

A represents a single bond or a divalent linking group. As the divalent linking group, an alkylene group, a divalent linking group having a monocyclic or polycyclic alicyclic hydrocarbon structure, an ether group, an ester group, a carbonyl group, a carboxyl group, or a divalent group formed by combination thereof is preferable.

Z represents an atomic group that forms a monocycle or polycycle with a group represented by —O—CO—O— in the formula.

As the repeating unit having a lactone group or a sultone group, for example, the repeating units described in paragraphs [0109] to [0120] of JP2014-010245A, the contents of which are incorporated herein by reference, can also be used.

As the repeating unit having a carbonate group, for example, the repeating units described in paragraphs [0121] to [0132] of JP2014-010245A, the contents of which are incorporated herein by reference, can also be used.

A content of the repeating unit having a lactone group, a sultone group, or a carbonate group is preferably 1% to 50% by mole, more preferably 5% to 60% by mole, and still more preferably 5% to 50% by mole with respect to all repeating units in the specific resin X.

<Repeating Unit Having Acid Group>

The specific resin X may have a repeating unit having an acid group.

As the acid group, an acid group having a pKa of 13 or less is preferable.

As the acid group, for example, a carboxyl group, a phenolic hydroxyl group, a fluorinated alcohol group (preferably a hexafluoroisopropanol group), a sulfonic acid group, a sulfonamide group, or an isopropanol group is preferable.

In addition, in the hexafluoroisopropanol group, one or more (preferably one or two) fluorine atoms may be substituted with a group (an alkoxycarbonyl group and the like) other than a fluorine atom. —C(CF$_3$)(OH)—CF$_2$— formed as above is also preferable as the acid group. In addition, one or more fluorine atoms may be substituted with a group other than a fluorine atom to form a ring including —C(CF$_3$)(OH)—CF$_2$—.

The repeating unit having an acid group is preferably a repeating unit different from a repeating unit having the structure in which a polar group is protected by the leaving group that leaves by the action of an acid as described above, and the above-mentioned repeating unit having a lactone group, a sultone group, or a carbonate group.

The repeating unit having an acid group may have a fluorine atom or an iodine atom.

As the repeating unit having an acid group, a repeating unit represented by Formula (B) is preferable.

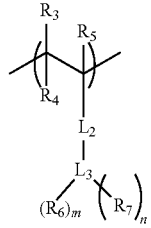

(B)

$R_3$ represents a hydrogen atom or a monovalent substituent which may have a fluorine atom or an iodine atom.

The monovalent substituent which may have a fluorine atom or an iodine atom is preferably a group represented by -L$_4$-R$_8$. L$_4$ represents a single bond or an ester group. R$_8$ is an alkyl group which may have a fluorine atom or an iodine atom, a cycloalkyl group which may have a fluorine atom or an iodine atom, an aryl group which may have a fluorine atom or an iodine atom, or a group formed by combination thereof.

$R_4$ and $R_5$ each independently represent a hydrogen atom, a fluorine atom, an iodine atom, or an alkyl group which may have a fluorine atom or an iodine atom.

$L_2$ represents a single bond or an ester group.

$L_3$ represents an (n+m+1)-valent aromatic hydrocarbon ring group or an (n+m+1)-valent alicyclic hydrocarbon ring group. Examples of the aromatic hydrocarbon ring group include a benzene ring group and a naphthalene ring group. The alicyclic hydrocarbon ring group may be either a monocycle or a polycycle, and examples thereof include a cycloalkyl ring group.

$R_6$ represents a hydroxyl group or a fluorinated alcohol group (preferably a hexafluoroisopropanol group). Furthermore, in a case where $R_6$ is a hydroxyl group, $L_3$ is preferably the (n+m+1)-valent aromatic hydrocarbon ring group.

$R_7$ represents a halogen atom. Examples of the halogen atom include a fluorine atom, a chlorine atom, a bromine atom, or an iodine atom.

m represents an integer of 1 or more. m is preferably an integer of 1 to 3 and more preferably an integer of 1 or 2.

n represents 0 or an integer of 1 or more. n is preferably an integer of 0 to 4.

Furthermore, (n+m+1) is preferably an integer of 1 to 5.

The repeating unit having an acid group may be a repeating unit consisting of (meth)acrylic acid.

As the repeating unit having an acid group, for example, the repeating units described in paragraphs [0050] to [0075] of JP2014-010245A, the contents of which are incorporated herein by reference, can also be used.

A content of the repeating unit having an acid group is preferably 10% to 60% by mole, more preferably 10% to 50% by mole, and still more preferably 10% to 40% by mole with respect to all repeating units in the specific resin X.

<Repeating Unit Having Hydroxyl Group>

The specific resin X may have a repeating unit having a hydroxyl group. As a result, the adhesiveness to a substrate and the affinity for a developer are improved.

The repeating unit having a hydroxyl group is preferably a repeating unit having an alicyclic hydrocarbon structure substituted with a hydroxyl group.

The repeating unit having a hydroxyl group preferably has no acid-decomposable group.

The hydroxyl group in the repeating unit having a hydroxyl group is preferably not a hydroxyl group constituting an acid group.

Examples of the repeating unit having a hydroxyl group include repeating units represented by General Formulae (AIIa) to (AIId).

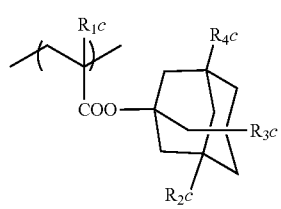

(AIIa)

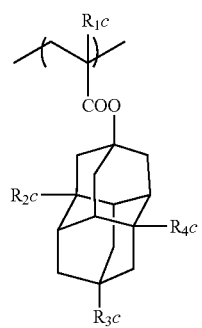

(AIIb)

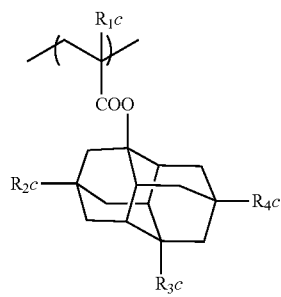

(AIIc)

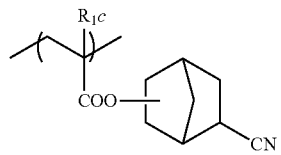

(AIId)

In General Formulae (AIIa) to (AIId), $R_{1c}$ represents a hydrogen atom, a methyl group, a trifluoromethyl group, or a hydroxymethyl group.

$R_{2c}$ to $R_{4c}$ each independently represent a hydrogen atom or a hydroxyl group. It should be noted that at least one of $R_2c$ to $R_4c$ represents a hydroxyl group. It is preferable that one or two of $R_{2c}$ to $R_{4c}$ are hydroxyl groups, and the rest are hydrogen atoms. It is more preferable that two of $R_{2c}$ to $R_{4c}$ are hydroxyl groups and the rest are hydrogen atoms.

As the repeating unit having a hydroxyl group, for example, the repeating units described in paragraphs [0133] to [0142] of JP2014-010245A, the contents of which are incorporated herein by reference, can also be used.

A content of the repeating unit having a hydroxyl group is preferably 5% to 60% by mole, more preferably 5% to 50% by mole, and still more preferably 5% to 40% by mole with respect to all repeating units in the specific resin X.

<Repeating Unit for Reducing Motility of Main Chain>

The specific resin X preferably has a high glass transition temperature (Tg) from the viewpoint that excessive diffusion of an acid generated or pattern collapse during development can be suppressed. Tg is preferably higher than 90° C., more preferably higher than 100° C., still more preferably higher than 110° C., and particularly preferably higher than 125° C. In addition, since an excessive increase in Tg causes a decrease in the dissolution rate in a developer, Tg is preferably 400° C. or lower, and more preferably 350° C. or lower.

In order to increase the Tg of the specific resin X, it is preferable to reduce the motility of the main chain of the specific resin X. Examples of the method for reducing the motility of the main chain of the specific resin X include a method of linking a cyclic structure to the main chain.

Repeating Unit Represented by Formula (E)

Examples of a method of linking the cyclic structure to the main chain include a method of introducing a repeating unit represented by Formula (E) into the specific resin X.

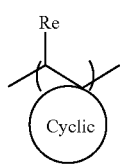

(E)

In Formula (E), Re's each independently represent a hydrogen atom or a substituent. Examples of the substituent include an alkyl group, a cycloalkyl group, an aryl group, an aralkyl group, and an alkenyl group, which may have a substituent.

"Cyclic" is a cyclic group including a carbon atom of the main chain. The number of atoms included in the cyclic group is not particularly limited.

Specific examples of the repeating unit represented by Formula (E) include the following repeating units.

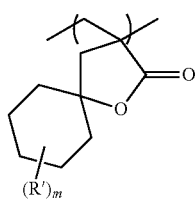

(E-1)

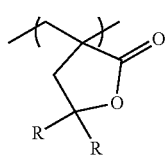

(E-2)

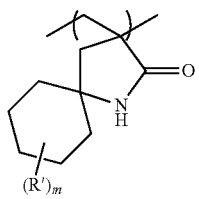
(E-3)

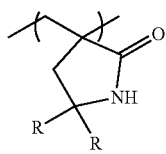
(E-4)

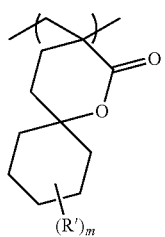
(E-5)

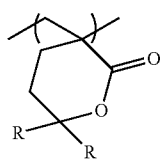
(E-6)

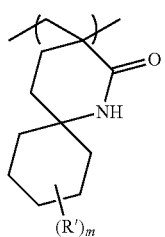
(E-7)

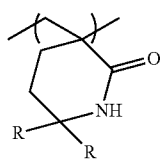
(E-8)

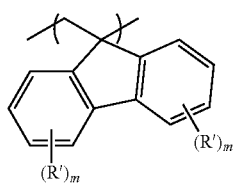
(E-9)

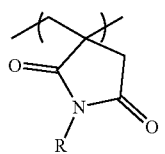
(E-10)

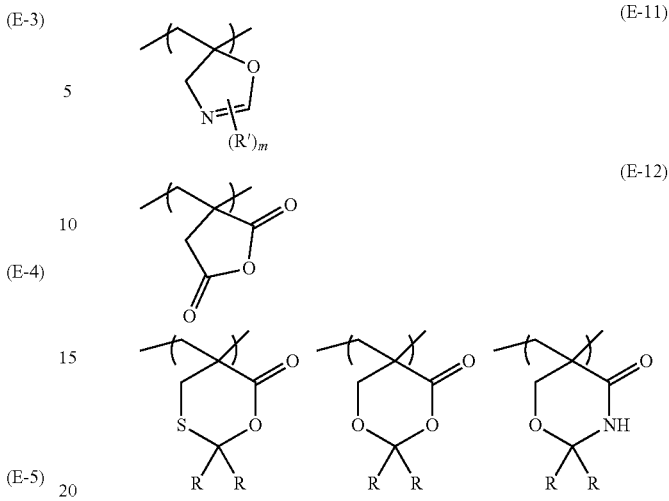

In the formula, R's each independently represent a hydrogen atom, an alkyl group, a cycloalkyl group, an aryl group, an aralkyl group, an alkenyl group, a hydroxyl group, an alkoxy group, an acyloxy group, a cyano group, a nitro group, an amino group, a halogen atom, an ester group (—OCOR" or —COOR": R" is an alkyl group or fluorinated alkyl group having 1 to 20 carbon atoms), or a carboxyl group. Furthermore, the alkyl group, the cycloalkyl group, the aryl group, the aralkyl group, and the alkenyl group may each have a substituent. In addition, the hydrogen atom bonded to the carbon atom in the group represented by R may be substituted with a fluorine atom or an iodine atom.

R"s each independently represent a hydrogen atom, an alkyl group, a cycloalkyl group, an aryl group, an aralkyl group, an alkenyl group, a hydroxyl group, an alkoxy group, an acyloxy group, a cyano group, a nitro group, an amino group, a halogen atom, an ester group (—OCOR" or —COOR": R" is an alkyl group or fluorinated alkyl group having 1 to 20 carbon atoms), or a carboxyl group. Furthermore, the alkyl group, the cycloalkyl group, the aryl group, the aralkyl group, and the alkenyl group may each have a substituent. In addition, a hydrogen atom bonded to the carbon atom in the group represented by R' may be substituted with a fluorine atom or an iodine atom.

m represents an integer of 0 or more. An upper limit of m is not particularly limited, but is 2 or less in many cases, and 1 or less in more cases.

In addition, two R's bonded to the same carbon atom may be bonded to each other to form a ring.

In Formula (E-2), Formula (E-4), Formula (E-6), and Formula (E-8), two R's may be combined to form an "=O".

A content of the repeating unit represented by Formula (E) is preferably 5% to 60% by mole, and more preferably 10% to 55% by mole with respect to all repeating units in the specific resin X.

A method of increasing the Tg of the specific resin X is not limited to other methods, and examples thereof include the method of introducing a repeating unit described in paragraphs [0105] to [0128] of JP2019-045864A.

The specific resin X may have a variety of repeating structural units, in addition to the repeating structural units described above, for the purpose of adjusting dry etching resistance, suitability for a standard developer, adhesiveness to a substrate, a resist profile, resolving power, heat resistance, sensitivity, and the like.

As the specific resin X, all repeating units is also preferably composed of (meth)acrylate-based repeating units (particularly in a case where the resist composition is used as an actinic ray-sensitive or radiation-sensitive resin composition for ArF). In this case, any of a resin in which all of the repeating units are methacrylate-based repeating units, a resin in which all of the repeating units are acrylate-based repeating units, and a resin in which all of the repeating units are methacrylate-based repeating units and acrylate-based repeating units can be used. It is preferable that the amount of the acrylate-based repeating units is 50% by mole or less of all repeating units.

Specific Resin Y (Second Embodiment)

<Acid-Decomposable Group>

The specific resin Y usually includes a repeating unit having a group having a polarity that increases through decomposition by the action of an acid (acid-decomposable group), and preferably includes a repeating unit having an acid-decomposable group.

The "acid-decomposable group" and the "repeating unit having an acid-decomposable group" included in the specific resin Y have the same definitions as the "acid-decomposable group" and the "repeating unit having an acid-decomposable group" which may be contained in the above-mentioned specific resin X, and suitable aspects thereof are also the same.

In a case where the specific resin Y includes a repeating unit having an acid-decomposable group, a content of the repeating unit having an acid-decomposable group is preferably 15% to 95% by mole, more preferably 30% to 80% by mole, and still more preferably 30% to 70% by mole with respect to all repeating units in the specific resin Y.

<First Structural Moiety-Containing Group and Second Structural Moiety-Containing Group>

The first structural moiety-containing group and the second structural moiety-containing group correspond to a group including a specific structural moiety included in the above-mentioned specific compound. The structures of the first structural moiety-containing group and the second structural moiety-containing group are not limited as long as they include the specific structural moiety.

As the first structural moiety-containing group and the second structural moiety-containing group, the above-mentioned group including a moiety represented by General Formula (D1) or General Formula (D2) is preferable.

The first structural moiety-containing group and the second structural moiety-containing group may be included in any form in the specific resin Y. For example, in the specific resin Y, the first structural moiety-containing group and the second structural moiety-containing group may be bonded to a terminal of the main chain. In addition, the specific resin Y may include each of a repeating unit including the first structural moiety-containing group and a repeating unit including the second structural moiety-containing group. Furthermore, the specific resin Y may include a repeating unit including the first structural moiety-containing group and the second structural moiety-containing group. It is preferable that the specific resin Y includes a repeating unit including the first structural moiety-containing group and the second structural moiety-containing group from the viewpoint that the LWR performance of a pattern formed is more excellent in a case where the specific resin Y is applied to the resist composition.

In the specific resin Y, the second acidic moiety derived from the second anionic moiety in the second structural moiety-containing group has a structure different from the first acidic moiety derived from the first anionic moiety in the first structural moiety-containing group, and has an acid dissociation constant larger from the acid dissociation constant of the first acidic moiety.

The acid dissociation constant is determined by the above-mentioned method.

Furthermore, in a case where the specific resin Y includes each of a repeating unit including the first structural moiety-containing group and a repeating unit including the second structural moiety-containing group, and a case where the specific resin Y includes a repeating unit including the first structural moiety-containing group and the second structural moiety-containing group, the acid dissociation constant of the first acidic moiety and the acid dissociation constant of the second acidic moiety in the specific resin Y are calculated, based on the monomers constituting each repeating unit.

Specifically, in a case where the specific resin Y has a structure including each of a repeating unit including the first structural moiety-containing group and a repeating unit including the second structural moiety-containing group, the acid dissociation constant is determined by the above-mentioned method with respect to each of a compound in which a cationic moiety of a monomer constituting the repeating unit including the first structural moiety-containing group is substituted with a hydrogen atom and a compound in which a cationic moiety of a monomer constituting the repeating unit including the second structural moiety-containing group is substituted with a hydrogen atom.

In addition, in a case where the specific resin Y has a structure including a repeating unit including the first structural moiety-containing group and a second structural moiety-containing group, an acid dissociation constant is determined by the above-mentioned method with respect to a compound in which a cationic moiety of a monomer constituting the repeating unit is substituted with a hydrogen atom. In this case, a two-step dissociation constant is obtained.

In the specific resin Y, a suitable numerical range of the acid dissociation constant of the first acidic moiety is the same as that of the acid dissociation constant a1 of above-mentioned compound PI (corresponding to an acid generated by irradiating the compound (I) with actinic rays or radiation). In addition, a suitable numerical range of the acid dissociation constant of the second acidic moiety is the same as that of the acid dissociation constant a2 of the above-mentioned compound PI. Furthermore, a suitable numerical range of a difference between the acid dissociation constant of the first acidic moiety and the acid dissociation constant of the second acidic moiety is the same as the difference between the acid dissociation constant a1 and the acid dissociation constant a2 in the above-mentioned compound PI.

Examples of a method of making the acid dissociation constant of the second acidic moiety larger than the acid dissociation constant of the first acidic moiety include a method of making the structures the first anionic moiety and the second anionic moiety in the specific resin Y different from each other.

The combination of the first anionic moiety (anionic functional group) and the second anionic moiety (anionic functional group) is, for example, preferably a combination of General Formula (B-10) mentioned above and General Formula (C-1) mentioned above, a combination of General Formula (B-10) mentioned above and General Formula (C-8) mentioned above, a combination of General Formula (C-1) mentioned above and General Formula (B-8) mentioned above, a combination of General Formula (C-1) mentioned above and General Formula (B-1) mentioned above, or a combination of General Formula (B-2) mentioned above and General Formula (B-6) mentioned above.

In a case where the specific resin Y includes a repeating unit including the first structural moiety-containing group and the second structural moiety-containing group, a content of the repeating unit is preferably 1% by mole or more, more preferably 3% by mole or more, and still more preferably and 5% by mole or more with respect to all repeating units in the specific resin Y. In addition, an upper limit value thereof is preferably 30% by mole or less, more preferably 20% by mole or less, and particularly preferably 15% by mole or less.

Moreover, in a case where the specific resin Y includes the repeating unit including a first structural moiety-containing group and the repeating unit including the second structural moiety-containing group, a total content of the repeating unit including the first structural moiety-containing group and the second repeating unit including the second structural moiety-containing group is preferably 1% by mole or more, more preferably 3% by mole or more, and still more preferably 5% by mole or more with respect to all repeating units in the specific resin Y. In addition, an upper limit value thereof is preferably 30% by mole or less, more preferably 20% by mole or less, and particularly preferably 15% by mole or less. A content ratio (molar ratio) of the repeating unit including the first structural moiety-containing group and the repeating unit including the second structural moiety-containing group is preferably 30/70 to 70/30.

<Repeating Unit Having Lactone Group, Sultone Group, or Carbonate Group>

The specific resin Y may have a repeating unit having a lactone group, a sultone group, or a carbonate group.

The "repeating unit having a lactone group, a sultone group, or a carbonate group" contained in the specific resin Y has the same definition as the "repeating unit having a lactone group, a sultone group, or a carbonate group" which may be contained in the specific resin X, and a suitable aspect (including a content) thereof is also the same.

<Repeating Unit Having Acid Group>

The specific resin Y may have a repeating unit having an acid group.

The "repeating unit having an acid group" included in the specific resin Y has the same definitions as the "repeating unit having an acid group" which may be contained in the specific resin X, and a suitable aspect (including a content) thereof is also the same.

<Repeating Unit Having Hydroxyl Group>

The specific resin Y may have a repeating unit having a hydroxyl group.

The "repeating unit having a hydroxyl group" contained in the specific resin Y has the same definition as the "repeating unit having a hydroxyl group" which may be contained in the above-mentioned specific resin X, and a suitable aspect (including a content) thereof is also the same.

<Repeating Unit for Reducing Motility of Main Chain>

The specific resin Y may have a repeating unit for reducing the motility of the main chain.

The "repeating unit for reducing the motility of the main chain" contained in the specific resin Y has the same definition as the "repeating unit for reducing the motility of the main chain" which may be contained in the above-mentioned specific resin X, and a suitable aspect (including a content) is also the same.

The specific resin Y may have a variety of repeating structural units, in addition to the repeating structural units described above, for the purpose of adjusting dry etching resistance, suitability for a standard developer, adhesiveness to a substrate, a resist profile, resolving power, heat resistance, sensitivity, and the like.

As the specific resin Y, all repeating units is also preferably composed of (meth)acrylate-based repeating units (particularly in a case where the resist composition is used as an actinic ray-sensitive or radiation-sensitive resin composition for ArF). In this case, any of a resin in which all of the repeating units are methacrylate-based repeating units, a resin in which all of the repeating units are acrylate-based repeating units, and a resin in which all of the repeating units are methacrylate-based repeating units and acrylate-based repeating units can be used. It is preferable that the amount of the acrylate-based repeating units is 50% by mole or less of all repeating units.

[Physical Properties of Specific Resin X and Specific Resin Y]

The specific resin X and the specific resin Y can be synthesized in accordance with an ordinary method (for example, radical polymerization).

The weight-average molecular weight of the specific resin X and the specific resin Y as a value expressed in terms of polystyrene by a GPC method is preferably 1,000 to 200,000, more preferably 3,000 to 20,000, and still more preferably 5,000 to 15,000. By setting the weight-average molecular weight of the specific resin X and the specific resin Y to 1,000 to 200,000, the deterioration in heat resistance and the dry etching resistance can be further suppressed. In addition, deterioration of developability and deterioration of film forming property due to high viscosity can also be further suppressed.

A dispersity (molecular weight distribution) of the specific resin X and the specific resin Y is usually 1.0 to 5.0, preferably 1.0 to 3.0, more preferably 1.2 to 3.0, and still more preferably 1.2 to 2.0. The smaller the dispersity, the more excellent the resolution and the resist shape, and the smoother the side wall of the resist pattern, the more excellent the roughness.

[Actinic Ray-Sensitive or Radiation-Sensitive Resin Composition]

The actinic ray-sensitive or radiation-sensitive resin composition of an embodiment of the present invention (hereinafter also referred to as a "resist composition") will be described.

The resist composition of the embodiment of the present invention includes the above-mentioned specific resin X or specific resin Y.

The resist composition of the embodiment of the present invention may be either a positive tone resist composition or a negative tone resist composition. In addition, the resist composition may be either a resist composition for alkali development or a resist composition for organic solvent development.

The resist composition of the embodiment of the present invention is typically a chemically amplified resist composition.

Hereinafter, components that can be included in the resist composition will be described in detail.

[Specific Resin X and Specific Resin Y]

The resist composition of the embodiment of the present invention includes the specific resin X or the specific resin Y. The specific resin X and the specific resin Y are as described above.

A content of the specific resin X and the specific resin Y (a total content thereof in a case where a plurality of the resins are included) in the resist composition of the embodiment of the present invention is preferably 50% to 99.9% by mass, and more preferably 60% to 99.0% by mass with respect to a total solid content of the composition.

Furthermore, the solid content is intended to be components excluding the solvent in the composition, and any of components other than the solvent are regarded as the solid content even in a case where they are liquid components.

In addition, the specific resin X and the specific resin Y may be used alone or in combination of two or more kinds thereof.

In a case where the resist composition of the embodiment of the present invention includes the specific resin X and the specific resin X is a resin having no acid-decomposable group, it is preferable that the resist composition of the embodiment of the present invention includes a resin having an acid-decomposable group (preferably a resin including a repeating unit having an acid-decomposable group), in addition to the specific resin X. The resin having an acid-decomposable group is not particularly limited, and examples thereof include known resins.

[Photoacid Generator]

The resist composition may include a photoacid generator (a compound that generates an acid upon irradiation with actinic rays or radiation, which is other than the above-mentioned specific resin X and the specific resin Y) which does not correspond to the above-mentioned specific resin X and the specific resin Y. Such another photoacid generator is a compound which generates an acid by exposure (preferably exposure to EUV light and/or ArF).

Such another photoacid generator may be in a form of a low-molecular-weight compound or a form incorporated into a part of a polymer. In addition, a combination of the form of a low-molecular-weight compound and the form incorporated into a part of a polymer may also be used.

In a case where such another photoacid generator is in the form of a low-molecular-weight compound, the molecular weight is preferably 3,000 or less, more preferably 2,000 or less, and still more preferably 1,000 or less.

In a case where such another photoacid generator is in the form of being incorporated into a part of the polymer, it is preferable that such another photoacid generator is incorporated into a resin different from the specific resin X and the specific resin Y.

In the present invention, the photoacid generator is preferably in the form of the low-molecular-weight compound.

Such another photoacid generator is not particularly limited, and above all, a compound which generates an organic acid is preferable, and examples of the organic acid include the same ones as the organic acids described as the organic acid which can be generated by the specific compound.

Examples of such another photoacid generator include a sulfonium salt compound, an iodonium salt compound, a diazonium salt compound, a phosphonium salt compound, an imidosulfonate compound, an oxime sulfonate compound, a diazodisulfone compound, a disulfone compound, and an o-nitrobenzyl sulfonate compound.

Such another photoacid generator may be a zwitterion.

As such another photoacid generator, known compounds that generate an acid by irradiation with actinic rays or radiation can be appropriately selected and used alone or as a mixture thereof. For example, the known compounds disclosed in paragraphs [0125] to [3019] of the specification of US2016/0070167A1, paragraphs [0086] to [0094] of the specification of US2015/0004544A1, and paragraphs [0323] to [0402] of the specification of US2016/0237190A1 may be used.

In a case where the resist composition includes such another photoacid generator, a content thereof is not particularly limited, but from the viewpoint that the effect of the present invention is more excellent, the content is preferably 0.1% to 40% by mass or more, more preferably 0.5% to 20% by mass or more, and still more preferably 0.5% to 10% by mass or more with respect to a total solid content of the composition.

Such another photoacid generator may be used alone or in combination of two or more kinds thereof.

[Solvent]

The resist composition may include a solvent.

The solvent preferably includes at least one of (M1) propylene glycol monoalkyl ether carboxylate (propylene glycol monomethyl ether acetate (PGMEA) and the like), or (M2) selected from the group consisting of propylene glycol monoalkyl ether (propylene glycol monomethyl ether (PGME), propylene glycol monoethyl ether (PGEE), and the like), a lactic acid ester (ethyl lactate and the like), an acetic acid ester, an alkoxypropionic acid ester, a chain ketone, a cyclic ketone (2-heptanone, cyclohexanone, cyclopentanone, and the like), a lactone (γ-butyrolactone and the like), and an alkylene carbonate (propylene carbonate and the like). Furthermore, this solvent may further include components other than the components (M1) and (M2).

It is preferable that the solvent includes the component (M1). The solvent is more preferably formed of substantially only the component (M1) or is a mixed solvent of the component (M1) and other components. In a case where the solvent is the mixed solvent, it is still more preferable that the solvent includes both the component (M1) and the component (M2).

A mass ratio (M1/M2) of the component (M1) to the component (M2) is preferably "100/0" to "0/100", more preferably "100/0" to "15/85", still more preferably "100/0" to "40/60", and particularly preferably "100/0" to "60/40".

As described above, the solvent may further include components other than the components (M1) and (M2). In this case, a content of the components other than the components (M1) and (M2) is preferably 5% to 30% by mass with respect to the total mass of the solvent.

A content of the solvent in the resist composition is preferably set so that the concentration of solid contents is 0.5% to 30% by mass, and more preferably set so that the concentration of solid contents is 1% to 20% by mass. With this content, the coating property of the resist composition can be further improved.

Furthermore, the solid content means all the components excluding the solvent.

[Acid Diffusion Control Agent]

The resist composition may further include an acid diffusion control agent. The acid diffusion control agent acts as a quencher that traps an acid generated from a photoacid generator and functions to control the phenomenon of acid diffusion in the resist film.

The acid diffusion control agent may be, for example, a basic compound.

The basic compound is preferably a compound having a structure represented by each of General Formula (A) to General Formula (E).

(A)

-continued $$—\overset{|}{N}—\overset{|}{C}=N—\quad (B)$$

$$=\overset{|}{C}—\overset{|}{N}=\overset{|}{C}—\quad (C)$$

$$=\overset{|}{C}—\overset{|}{N}—\quad (D)$$

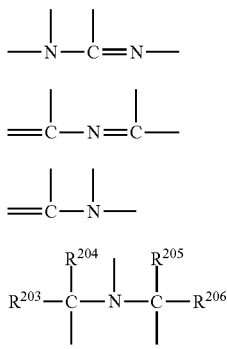
(E)

In General Formula (A) and General Formula (E), $R^{200}$, $R^{201}$, and $R^{202}$ may be the same as or different from each other, and each represent a hydrogen atom, an alkyl group (which preferably has 1 to 20 carbon atoms), a cycloalkyl group (which preferably has 3 to 20 carbon atoms), or an aryl group (which preferably has 6 to 20 carbon atoms), in which $R^{201}$ and $R^{202}$ may be bonded to each other to form a ring.

With regard to the alkyl group, the alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

$R^{203}$, $R^{204}$, $R^{205}$, and $R^{206}$ may be the same as or different from each other, and each represent an alkyl group having 1 to 20 carbon atoms.

It is more preferable that the alkyl groups in General Formula (A) and General Formula (E) are unsubstituted.

(Compound (PA) which has Proton-Accepting Functional Group and Generates Compound that Decomposes by Irradiation with Actinic Rays or Radiation to Exhibit Deterioration in Proton-Accepting Properties, No Proton-Accepting Properties, or Change from Proton-Accepting Properties to Acidic Properties)

The resist composition may include a compound (hereinafter also referred to as a "compound (PA)") which has a proton-accepting functional group and generates a compound that decomposes by irradiation with actinic rays or radiation to exhibit deterioration in proton-accepting properties, no proton-accepting properties, or a change from the proton-accepting properties to acidic properties as an acid diffusion control agent.

The proton-accepting functional group refers to a functional group having a group or electron capable of electrostatically interacting with a proton, and for example, means a functional group with a macrocyclic structure, such as a cyclic polyether, or a functional group having a nitrogen atom having an unshared electron pair not contributing to π-conjugation. The nitrogen atom having an unshared electron pair not contributing to π-conjugation is, for example, a nitrogen atom having a partial structure represented by General Formula.

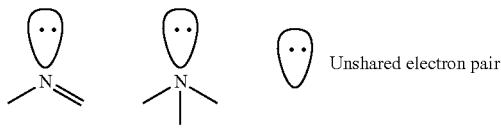
Unshared electron pair

Preferred examples of the partial structure of the proton-accepting functional group include a crown ether structure, an azacrown ether structure, primary to tertiary amine structures, a pyridine structure, an imidazole structure, and a pyrazine structure.

The compound (PA) decomposes by irradiation with actinic rays or radiation to generate a compound exhibiting deterioration in proton-accepting properties, no proton-accepting properties, or a change from the proton-accepting properties to acidic properties. Here, an expression of generating a compound which exhibits deterioration in proton-accepting properties, no proton-accepting properties, or a change from the proton-accepting properties to acidic properties is a change of proton-accepting properties due to the proton being added to the proton-accepting functional group. Specifically, the expression means a decrease in the equilibrium constant at chemical equilibrium in a case where a proton adduct is generated from the compound (PA) having the proton-accepting functional group and the proton.

With regard to the compound (PA), reference can be made to those described in paragraphs [0421] to [0428] of JP2014-41328A or paragraphs [0108] to [0116] of JP2014-134686A, the contents of which are incorporated herein by reference.

A low-molecular-weight compound having a nitrogen atom and a group that leaves by the action of an acid can also be used as an acid diffusion control agent. The low-molecular-weight compound is preferably an amine derivative having, on the nitrogen atom, a group that leaves by the action of an acid.

The group that leaves by the action of an acid is preferably an acetal group, a carbonate group, a carbamate group, a tertiary ester group, a tertiary hydroxyl group, or a hemiaminal ether group, and more preferably the carbamate group or the hemiaminal ether group.

The molecular weight of the low-molecular-weight compound is preferably 100 to 1,000, more preferably 100 to 700, and still more preferably 100 to 500.

The low-molecular-weight compound may have a carbamate group having a protective group on the nitrogen atom.

Examples of the acid diffusion control agent include the compounds (amine compounds, amide group-containing compounds, urea compounds, nitrogen-containing heterocyclic compounds, and the like) described in paragraphs [0140] to [0144] of JP2013-11833A.

As the acid diffusion control agent, for example, the contents described in paragraphs [0123] to [0159] of JP2018-155788A can also be incorporated.

Specific examples of the acid diffusion control agent are shown below, but the present invention is not limited.

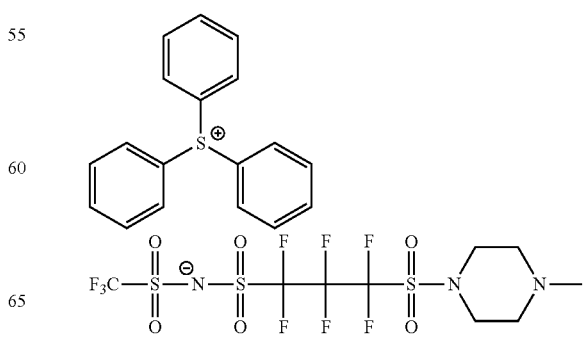

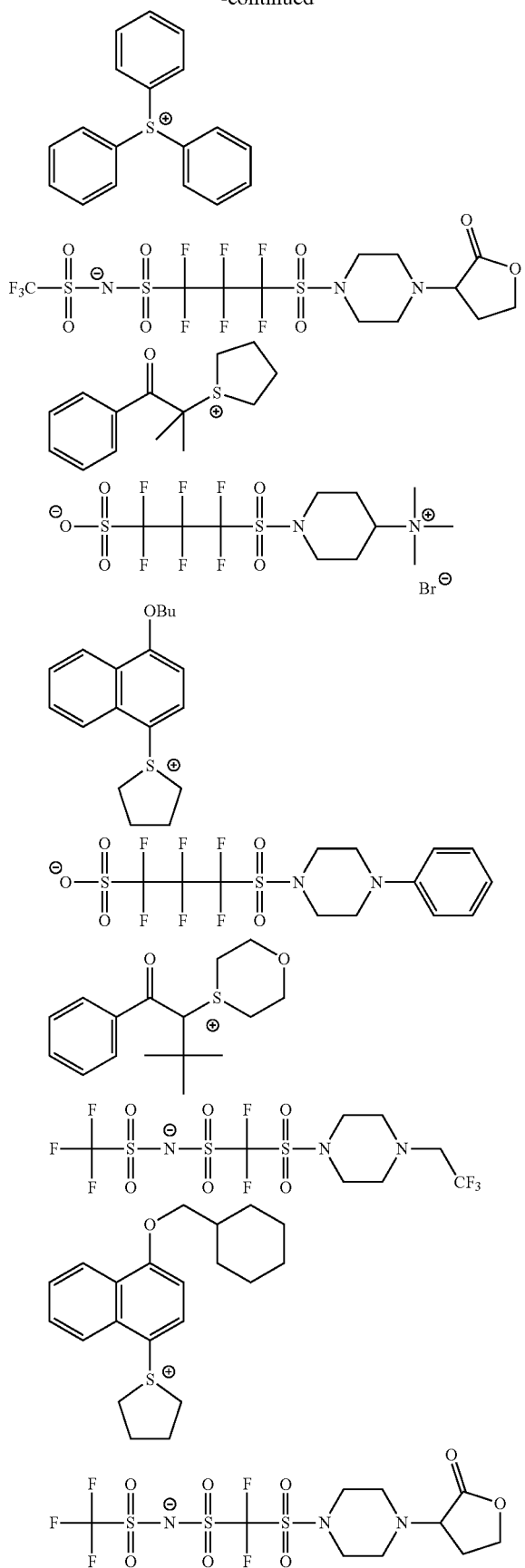

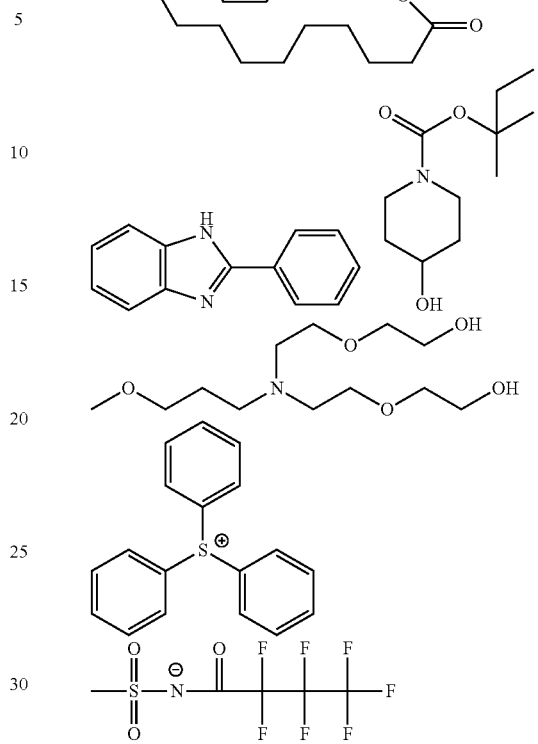

In a case where the resist composition includes an acid diffusion control agent, a content of the acid diffusion control agent is preferably 0.001% to 15% by mass, and more preferably 0.01% to 8% by mass with respect to a total solid content of the resist composition.

The acid diffusion control agents may be used alone or in combination of two or more kinds thereof

[Hydrophobic Resin]

The resist composition may include a hydrophobic resin different from the specific resin X and the specific resin Y, in addition to the specific resin X and the specific resin Y.

Although it is preferable that the hydrophobic resin is designed to be unevenly distributed on a surface of the resist film, it does not necessarily need to have a hydrophilic group in the molecule as different from the surfactant, and does not need to contribute to uniform mixing of polar materials and non-polar materials.

Examples of the effect caused by the addition of the hydrophobic resin include a control of static and dynamic contact angles of a surface of the resist film with respect to water and suppression of out gas.

The hydrophobic resin preferably has any one or more of a "fluorine atom", a "silicon atom", and a "$CH_3$ partial structure which is contained in a side chain moiety of a resin" from the viewpoint of uneven distribution on the film surface layer, and more preferably has two or more kinds thereof. In addition, the hydrophobic resin preferably has a hydrocarbon group having 5 or more carbon atoms. These groups may be contained in the main chain of the resin or may be substituted in a side chain.

With regard to the hydrophobic resin, reference can be made to the description in paragraphs [0315] to [0415] of JP2014-010245A, the contents of which are incorporated herein by reference.

Furthermore, for the hydrophobic resin, the resins described in JP2011-248019A, JP2010-175859A, and JP2012-032544A can also be preferably used, in addition to the resins described above.

In a case where the resist composition includes a hydrophobic resin, a content of the hydrophobic resin is preferably 0.01% to 20% by mass, and more preferably 0.1% to 15% by mass with respect to the total solid content of the resist composition.

[Surfactant]

The resist composition may include a surfactant. In a case where the surfactant is included, it is possible to form a pattern having more excellent adhesiveness and fewer development defects.

The surfactant is preferably a fluorine-based and/or silicon-based surfactant.

Examples of the fluorine-based and/or silicon-based surfactant include the surfactants described in paragraph [0276] of the specification of US2008/0248425A. In addition, EFTOP EF301 or EF303 (manufactured by Shin-Akita Chemical Co., Ltd.); FLUORAD FC430, 431, and 4430 (manufactured by Sumitomo 3M inc.); MEGAFACE F171, F173, F176, F189, F113, F110, F177, F120, and R08 (manufactured by DIC Corporation); SURFLON S-382, SC101, 102, 103, 104, 105, or 106 (manufactured by Asahi Glass Co., Ltd.); TROYSOL S-366 (manufactured by Troy Corporation); GF-300 or GF-150 (manufactured by Toagosei Co., Ltd.); SURFLON S-393 (manufactured by AGC Seimi Chemical Co., Ltd.); EFTOP EF121, EF122A, EF122B, RF122C, EF125M, EF135M, EF351, EF352, EF801, EF802, or EF601 (manufactured by JEMCO Inc.); PF636, PF656, PF6320, and PF6520 (manufactured by OMNOVA Solutions Inc.); KH-20 (manufactured by Asahi Kasei Corporation); or FTX-204G, 208G, 218G, 230G, 204D, 208D, 212D, 218D, and 222D (manufactured by NEOS COMPANY LIMITED) may be used. In addition, a polysiloxane polymer KP-341 (manufactured by Shin-Etsu Chemical Co., Ltd.) can also be used as the silicon-based surfactant.

Moreover, in addition to the known surfactants as shown above, a surfactant may be synthesized using a fluoroaliphatic compound manufactured using a telomerization method (also referred to as a telomer method) or an oligomerization method (also referred to as an oligomer method). Specifically, a polymer including a fluoroaliphatic group derived from fluoroaliphatic compound may be used as the surfactant. This fluoroaliphatic compound can be synthesized, for example, by the method described in JP2002-90991A.

In addition, a surfactant other than the fluorine-based surfactant and/or the silicon-based surfactants described in paragraph [0280] of the specification of US2008/0248425A may be used.

The surfactants may be used alone or in combination of two or more kinds thereof.

In a case where the resist composition includes a surfactant, a content of the surfactant is preferably 0.0001% to 2% by mass, and more preferably 0.0005% to 1% by mass with respect to the total solid content of the composition.

[Other Additives]

The resist composition may further include, in addition to the components, a dissolution inhibiting compound, a dye, a plasticizer, a photosensitizer, a light absorber, and/or a compound promoting a solubility in a developer (for example, a phenol compound having a molecular weight of 1,000 or less or an alicyclic or aliphatic compound including a carboxylic acid group), or the like.

[Resist Film and Pattern Forming Method]

The procedure of the pattern forming method using the resist composition is not particularly limited, but preferably has the following steps.

Step 1: A step of forming a resist film on a substrate, using a resist composition Step 2: A step of exposing the resist film Step 3: A step of developing the exposed resist film, using a developer, to form a pattern Hereinafter, the procedure of each of the steps will be described in detail.

[Step 1: Resist Film Forming Step]

The step 1 is a step of forming a resist film on a substrate, using a resist composition.

The definition of the resist composition is as described above.

Hereinafter, a specific example of the method for preparing the resist composition will be shown.

In the resist composition used in the pattern forming method of the embodiment of the present invention, it is preferable that the content of metal atoms is reduced.

Hereinafter, first, a specific example of a method for reducing the content of the metal atoms in the resist composition will be described, and then a specific example of a method for preparing the resist composition will be described.

Examples of the method for reducing the content of the metal atoms in the resist composition include a method for adjusting the content by filtration using a filter. As for the filter pore diameter, the pore size is preferably less than 100 nm, more preferably 10 nm or less, and still more preferably 5 nm or less. As the filter, a polytetrafluoroethylene-made, polyethylene-made, or nylon-made filter is preferable. The filter may include a composite material in which the filter material is combined with an ion exchange medium. As the filter, a filter which has been washed with an organic solvent in advance may be used. In the step of filter filtration, plural kinds of filters connected in series or in parallel may be used. In a case of using the plural kinds of filters, a combination of filters having different pore diameters and/or materials may be used. In addition, various materials may be filtered plural times, and the step of filtering plural times may be a circulatory filtration step.

In addition, examples of a method for reducing the content of the metal atoms in the resist composition include a method of selecting raw materials having a low content of metals as raw materials constituting various materials in the resist composition, a method of subjecting raw materials constituting various materials in the resist composition to filter filtration, and a method of performing distillation under the condition for suppressing the contamination as much as possible by, for example, lining the inside of a device with TEFLON (registered trademark).

Moreover, as the method for reducing the content of the metal atoms in the resist composition, removal with an adsorbing material may be performed, in addition to the above-mentioned filter filtration, and the filter filtration and the adsorbing material may be used in combination. As the adsorbing material, known adsorbing materials can be used, and for example, inorganic adsorbing materials such as silica gel and zeolite, and organic adsorbing materials such as activated carbon can be used.

In addition, in order to reduce the content of the metal atoms in the resist composition, it is necessary to prevent the incorporation of metal impurities in the production process. Sufficient removal of metal impurities from a production device can be confirmed by measuring the content of metal components included in a washing liquid used to wash the production device.

Next, a specific example of the method for preparing the resist composition will be described.

In the production of the resist composition, for example, it is preferable to dissolve various components such as the resin and the photoacid generator as described above in a solvent, and then perform filtration (which may be circulatory filtration) using a plurality of filters having different materials. For example, it is preferable to connect a polyethylene-made filter with a pore diameter of 50 nm, a nylon-made filter with a pore diameter of 10 nm, and a polyethylene-made filter with a pore diameter of 3 to 5 nm in permuted connection, and then perform filtration. As for the filtration, a method of performing circulatory filtration twice or more is also preferable. Furthermore, the filtration step also has an effect of reducing the content of the metal atoms in the resist composition. A smaller pressure difference among the filters is more preferable, and the pressure difference is generally 0.1 MPa or less, preferably 0.05 MPa or less, and more preferably 0.01 MPa or less. A smaller pressure difference between the filter and the charging nozzle is also more preferable, and the pressure difference is generally 0.5 MPa or less, preferably 0.2 MPa or less, and more preferably 0.1 MPa or less.

In addition, as a method for performing circulatory filtration using a filter in the production of the resist composition, for example, a method of performing circulatory filtration twice or more using a polytetrafluoroethylene-made filter having a pore diameter of 50 nm is also preferable.

It is preferable to subject the inside of a device for producing the resist composition to gas replacement with an inert gas such as nitrogen. With this, it is possible to suppress dissolution of an active gas such as oxygen in the resist composition.

After being filtered by a filter, the resist composition is charged into a clean container. It is preferable that the resist composition charged in the container is subjected to refrigeration storage. This enables performance deterioration caused by the lapse of time to be suppressed. A shorter time from completion of the charge of the resist composition into the container to initiation of cold storage is more preferable, and the time is generally 24 hours or shorter, preferably 16 hours or shorter, more preferably 12 hours or shorter, and still more preferably 10 hours or shorter. The storage temperature is preferably 0° C. to 15° C., more preferably 0° C. to 10° C., and still more preferably 0° C. to 5° C.

Next, a method of forming a resist film on a substrate using a resist composition will be described.

Examples of a method in which a resist film is formed on a substrate, using a resist composition, include a method in which a resist composition is applied onto a substrate.

The resist composition can be applied onto a substrate (for example, silicon and silicon dioxide coating) as used in the manufacture of integrated circuit elements by a suitable application method such as ones using a spinner or a coater. The application method is preferably spin application using a spinner. A rotation speed upon the spin application using a spinner is preferably 1,000 to 3,000 rpm.

After the application of the resist composition, the substrate may be dried to form a resist film. In addition, various underlying films (an inorganic film, an organic film, or an antireflection film) may be formed on the underlayer of the resist film.

Examples of the drying method include a method of heating and drying. The heating can be carried out using a unit included in an ordinary exposure machine and/or an ordinary development machine, and may also be carried out using a hot plate or the like. A heating temperature is preferably 80° C. to 150° C., more preferably 80° C. to 140° C., and still more preferably 80° C. to 130° C. A heating time is preferably 30 to 1,000 seconds, more preferably 60 to 800 seconds, and still more preferably 60 to 600 seconds.

A film thickness of the resist film is not particularly limited, but from the viewpoint that a fine pattern having higher accuracy can be formed, the film thickness is preferably 10 to 90 nm, more preferably 10 to 65 nm, and still more preferably 15 to 50 nm.

Moreover, a topcoat may be formed on the upper layer of the resist film, using the topcoat composition.

It is preferable that the topcoat composition is not mixed with the resist film and can be uniformly applied onto the upper layer of the resist film.

The topcoat composition includes, for example, a resin, an additive, and a solvent.

The topcoat is not particularly limited, a topcoat known in the related art can be formed by the methods known in the related art, and the topcoat can be formed, based on the description in paragraphs [0072] to [0082] of JP2014-059543A, for example.

It is preferable that a topcoat including a basic compound as described in JP2013-61648A, for example, is formed on a resist film. Specific examples of the basic compound which can be included in the topcoat include a basic compound which may be included in the resist composition.

In addition, it is also preferable that the topcoat includes a compound which includes at least one group or bond selected from the group consisting of an ether bond, a thioether bond, a hydroxyl group, a thiol group, a carbonyl bond, and an ester bond.

[Step 2: Exposing Step]

The step 2 is a step of exposing the resist film.

Examples of an exposing method include a method in which a resist film formed is irradiated with light through a predetermined mask.

It is preferable to perform baking (heating) before performing development after the exposure. The baking accelerates a reaction in the exposed portion, and the sensitivity and the pattern shape are improved.

A heating temperature is preferably 80° C. to 150° C., more preferably 80° C. to 140° C., and still more preferably 80° C. to 130° C.

A heating time is preferably 10 to 1,000 seconds, more preferably 10 to 180 seconds, and still more preferably 30 to 120 seconds.

The heating can be carried out using a unit included in an ordinary exposure machine and/or an ordinary development machine, and may also be performed using a hot plate or the like.

This step is also referred to as a post-exposure baking.

[Step 3: Developing Step]

The step 3 is a step of developing the exposed resist film, using a developer, to form a pattern.

The developer may be either an alkali developer or a developer containing an organic solvent (hereinafter also referred to as an organic developer).

Examples of the developing method include a method in which a substrate is immersed in a tank filled with a developer for a certain period of time (a dip method), a method in which development is performed by heaping a developer up onto the surface of a substrate by surface tension, and then leaving it to stand for a certain period of time (a puddle method), a method in which a developer is sprayed on the surface of a substrate (a spray method), and a method in which a developer is continuously jetted onto a substrate rotating at a constant rate while scanning a developer jetting nozzle at a constant rate (a dynamic dispense method).

Furthermore, after the step of performing development, a step of stopping the development may be carried out while substituting the solvent with another solvent.

A developing time is not particularly limited as long as it is a period of time where the non-exposed portion of a resin is sufficiently dissolved, and is preferably 10 to 300 seconds, and more preferably 20 to 120 seconds.

The temperature of the developer is preferably 0° C. to 50° C., and more preferably 15° C. to 35° C.

As the alkali developer, it is preferable to use an aqueous alkali solution including an alkali. The type of the aqueous alkali solution is not particularly limited, but examples thereof include an aqueous alkali solution including a quaternary ammonium salt typified by tetramethylammonium hydroxide, an inorganic alkali, a primary amine, a secondary amine, a tertiary amine, an alcoholamine, a cyclic amine, or the like. Among those, the aqueous solutions of the quaternary ammonium salts typified by tetramethylammonium hydroxide (TMAH) are preferable as the alkali developer. An appropriate amount of an alcohol, a surfactant, or the like may be added to the alkali developer. The alkali concentration of the alkali developer is usually 0.1% to 20% by mass. Furthermore, the pH of the alkali developer is usually 10.0 to 15.0.

The organic developer is preferably a developer containing at least one organic solvent selected from the group consisting of a ketone-based solvent, an ester-based solvent, an alcohol-based solvent, an amide-based solvent, an ether-based solvent, and a hydrocarbon-based solvent.

A plurality of the solvents may be mixed or the solvent may be used in admixture with a solvent other than those described above or water. The moisture content in the entire developer is preferably less than 50% by mass, more preferably less than 20% by mass, and still more preferably less than 10% by mass, and particularly preferably moisture is not substantially contained.

A content of the organic solvent with respect to the organic developer is preferably from 50% by mass to 100% by mass, more preferably from 80% by mass to 100% by mass, still more preferably from 90% by mass to 100% by mass, and particularly preferably from 95% by mass to 100% by mass with respect to the total amount of the developer.

[Other Steps]

It is preferable that the pattern forming method includes a step of performing washing using a rinsing liquid after the step 3.

Examples of the rinsing liquid used in the rinsing step after the step of performing development using an alkali developer include pure water. Furthermore, an appropriate amount of a surfactant may be added to pure water.

An appropriate amount of a surfactant may be added to the rinsing liquid.

The rinsing liquid used in the rinsing step after the developing step with an organic developer is not particularly limited as long as the rinsing liquid does not dissolve the pattern, and a solution including a common organic solvent can be used. As the rinsing liquid, a rinsing liquid containing at least one organic solvent selected from the group consisting of a hydrocarbon-based solvent, a ketone-based solvent, an ester-based solvent, an alcohol-based solvent, an amide-based solvent, and an ether-based solvent is preferably used.

A method for the rinsing step is not particularly limited, and examples thereof include a method in which a rinsing liquid is continuously jetted on a substrate rotated at a constant rate (a rotation application method), a method in which a substrate is immersed in a tank filled with a rinsing liquid for a certain period of time (a dip method), and a method in which a rinsing liquid is sprayed on a substrate surface (a spray method).

Furthermore, the pattern forming method of the embodiment of the present invention may include a heating step (postbaking) after the rinsing step. By the present step, the developer and the rinsing liquid remaining between and inside the patterns are removed by baking. In addition, the present step also has an effect that a resist pattern is annealed and the surface roughness of the pattern is improved. The heating step after the rinsing step is usually performed at 40° C. to 250° C. (preferably 90° C. to 200° C.) for usually 10 seconds to 3 minutes (preferably 30 seconds to 120 seconds).

In addition, an etching treatment on the substrate may be carried out using a pattern formed as a mask.

For etching, any of known methods can be used, and various conditions and the like are appropriately determined according to the type of a substrate, usage, and the like. Etching can be carried out, for example, in accordance with Journal of The International Society for Optical Engineering (Proc. of SPIE), Vol. 6924, 692420 (2008), JP2009-267112A, and the like. In addition, the etching can also be carried out in accordance with "Chapter 4 Etching" in "Semiconductor Process Text Book, 4th Ed., published in 2007, publisher: SEMI Japan".

Various materials (for example, a developer, a rinsing liquid, a composition for forming an antireflection film, and a composition for forming a topcoat) other than the resist composition used in the pattern forming method of the embodiment of the present invention preferably have smaller amounts of impurities such as a metal (for example, Na, K, Ca, Fe, Cu, Mg, Al, Li, Cr, Ni, Sn, Ag, As, Au, Ba, Cd, Co, Pb, Ti, V, W, and Zn). The content of the impurities included in these materials is preferably for example, 1 ppm by mass or less.

Examples of a method for reducing impurities such as a metal in various materials other than the resist composition include filtration using a filter. As for the filter pore diameter, the pore size is preferably less than 100 nm, more preferably 10 nm or less, and still more preferably 5 nm or less. As the filter, a polytetrafluoroethylene-made, polyethylene-made, or nylon-made filter is preferable. The filter may include a composite material in which the filter material is combined with an ion exchange medium. As the filter, a filter which has been washed with an organic solvent in advance may be used. In the step of filter filtration, plural kinds of filters connected in series or in parallel may be used. In a case of using the plural kinds of filters, a combination of filters having different pore diameters and/or materials may be used. In addition, various materials may be filtered plural times, and the step of filtering plural times may be a circulatory filtration step.

In addition, examples of a method for reducing impurities such as a metal in various materials other than the resist composition include a method of selecting raw materials having a low content of metals as raw materials constituting various materials, a method of subjecting raw materials constituting various materials to filter filtration, and a method of performing distillation under the condition for suppressing the contamination as much as possible by, for example, lining the inside of a device with TEFLON (registered trademark).

Moreover, as the method for reducing impurities such as a metal in various materials other than the resist composition, removal of impurities with an adsorbing material may be performed, in addition to the above-mentioned filter filtration, and the filter filtration and the adsorbing material may be used in combination. As the adsorbing material, known adsorbing materials can be used, and for example, inorganic adsorbing materials such as silica gel and zeolite, and organic adsorbing materials such as activated carbon can be used. It is necessary to prevent the incorporation of metal impurities in the production process in order to reduce the impurities such as a metal included in the various materials other than the resist composition. Sufficient removal of metal impurities from a production device can be confirmed by measuring the content of metal components included in a washing liquid used to wash the production device.

A conductive compound may be added to an organic treatment liquid such as a rinsing liquid in order to prevent breakdown of chemical liquid pipes and various parts (a filter, an O-ring, a tube, or the like) due to electrostatic charging, and subsequently generated electrostatic discharging. The conductive compound is not particularly limited, but examples thereof include methanol. The addition amount is not particularly limited, but from the viewpoint that preferred development characteristics or rinsing characteristics are maintained, the addition amount is preferably 10% by mass or less, and more preferably 5% by mass or less.

For members of the chemical liquid pipe, various pipes coated with stainless steel (SUS), or a polyethylene, polypropylene, or fluorine resin (a polytetrafluoroethylene or perfluoroalkoxy resin, or the like) that has been subjected to an antistatic treatment can be used. In the same manner, for the filter or the O-ring, polyethylene, polypropylene, or a fluorine resin (a polytetrafluoroethylene or perfluoroalkoxy resin, or the like) that has been subjected to an antistatic treatment can be used.

Moreover, the present invention further relates to a method for manufacturing an electronic device, including the pattern forming method, and an electronic device manufactured by the manufacturing method.

The electronic device of an embodiment of the present invention is suitably mounted on electric and electronic equipment (for example, home appliances, office automation (OA)-related equipment, media-related equipment, optical equipment, telecommunication equipment, and the like).

EXAMPLES

Hereinafter, the present invention will be described in more detail with reference to Examples. The materials, the amounts of materials used, the proportions, the treatment details, the treatment procedure, and the like shown in Examples below may be appropriately modified as long as the modifications do not depart from the spirit of the present invention. Therefore, the scope of the present invention should not be construed as being limited to Examples shown below.

[Various Components]
[Resin]

As the resins A-1 to A-13 shown in Table 4 and Table 8, those synthesized according to a method for synthesizing a resin A-5 (Synthesis Example 1) which will be described later were used. The compositional ratio (molar ratio; corresponding in order from the left) of the respective repeating units shown below, the weight-average molecular weight (Mw), and the dispersity (Mw/Mn) are shown in Table 1.

Furthermore, the weight-average molecular weight (Mw) and the dispersity (Mw/Mn) of the resins A-1 to A-13 were measured by GPC (carrier: tetrahydrofuran (THF)) (an amount expressed in terms of polystyrene). In addition, the compositional ratio (ratio based on % by mole) of the resin was measured by $^{13}C$-nuclear magnetic resonance (NMR).

TABLE 1

| | Molar ratio of repeating unit | | | | Mw | Mw/Mn |
|---|---|---|---|---|---|---|
| Resin A-1 | 30 | 60 | 10 | — | 8,800 | 1.65 |
| Resin A-2 | 30 | 40 | 25 | 5 | 8,300 | 1.65 |
| Resin A-3 | 30 | 5 | 55 | 10 | 7,800 | 1.71 |
| Resin A-4 | 40 | 55 | 5 | — | 12,000 | 1.68 |
| Resin A-5 | 30 | 60 | 10 | — | 7,800 | 1.63 |
| Resin A-6 | 25 | 65 | 10 | — | 8,600 | 1.63 |
| Resin A-7 | 30 | 30 | 30 | 10 | 9,600 | 1.72 |
| Resin A-8 | 20 | 15 | 60 | 5 | 10,200 | 1.64 |
| Resin A-9 | 15 | 25 | 50 | 10 | 7,900 | 1.70 |
| Resin A-10 | 5 | 50 | 40 | 5 | 9,000 | 1.77 |
| Resin A-11 | 35 | 50 | 5 | 10 | 9,500 | 1.80 |
| Resin A-12 | 50 | 50 | — | — | 8,200 | 1.61 |
| Resin A-13 | 40 | 15 | 45 | — | 9,100 | 1.66 |

The structural formulae of the resins A-1 to A-13 shown in Table 1 are shown below.

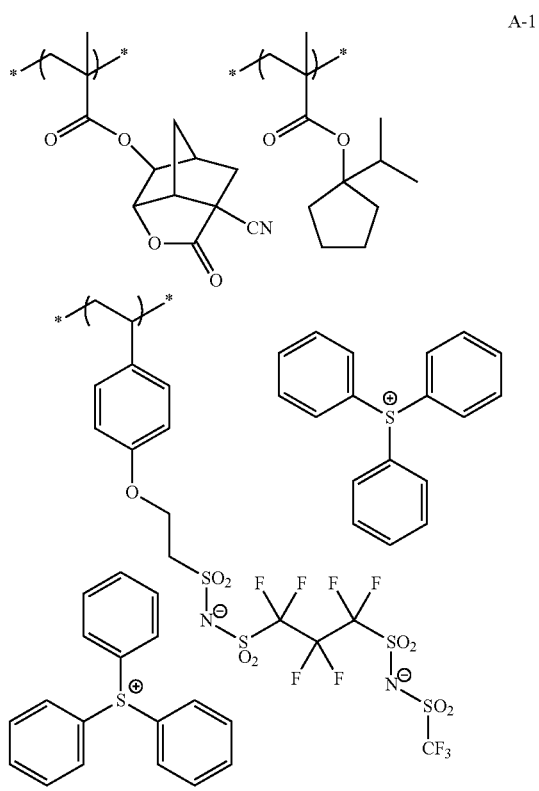

A-1

A-2
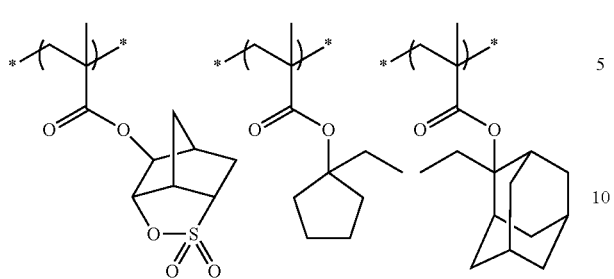
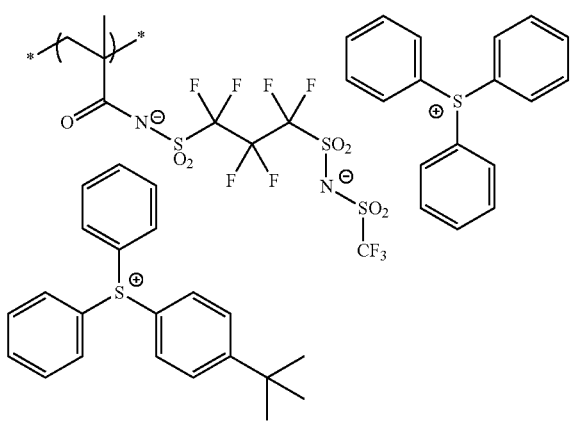
A-3
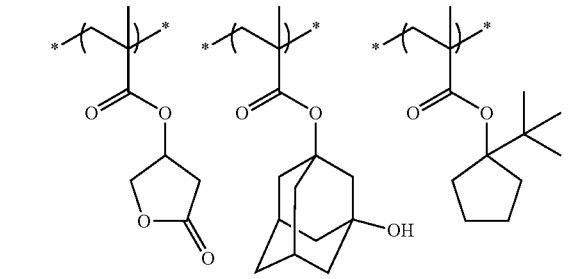
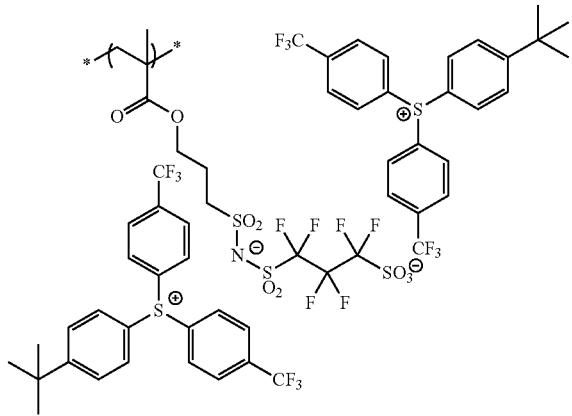
A-4
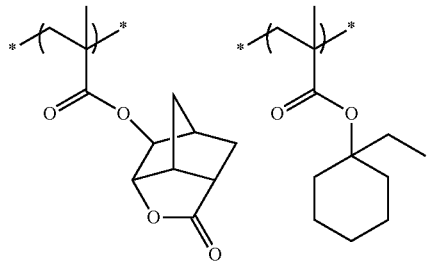
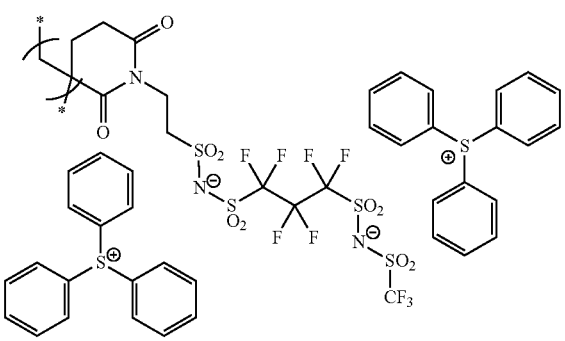
A-5
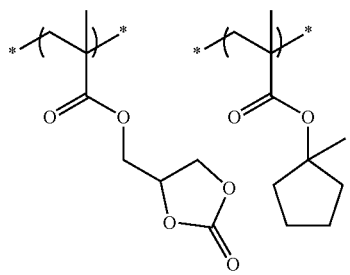
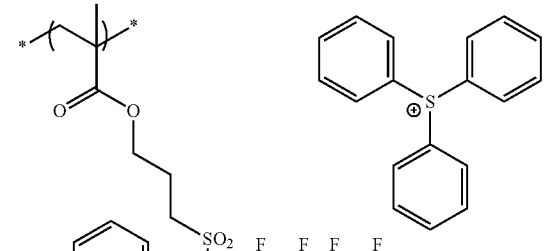
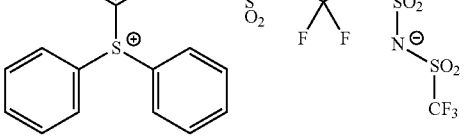
A-6
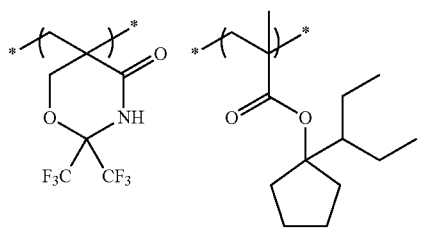

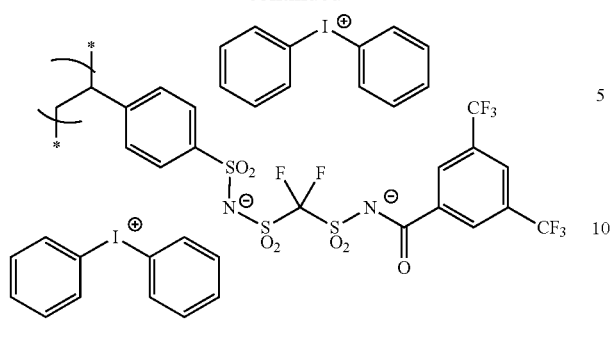
A-7
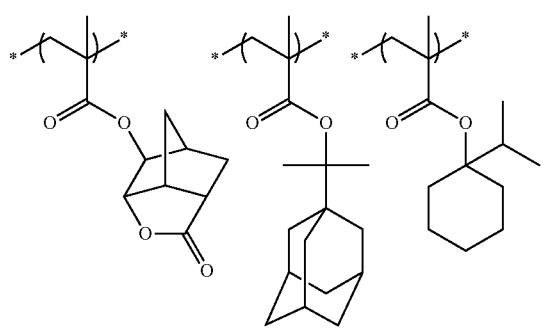
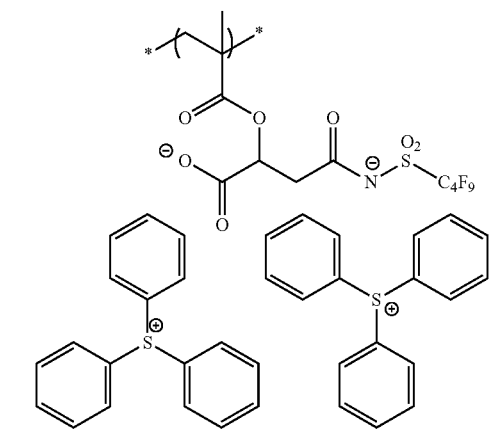
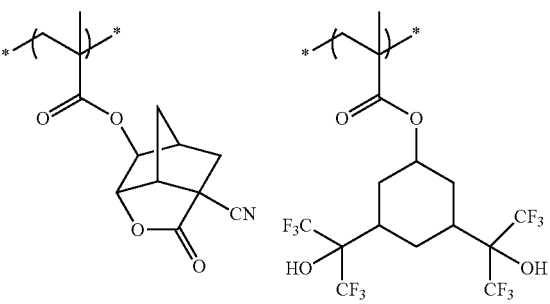
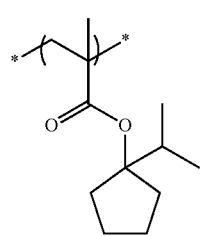
A-8
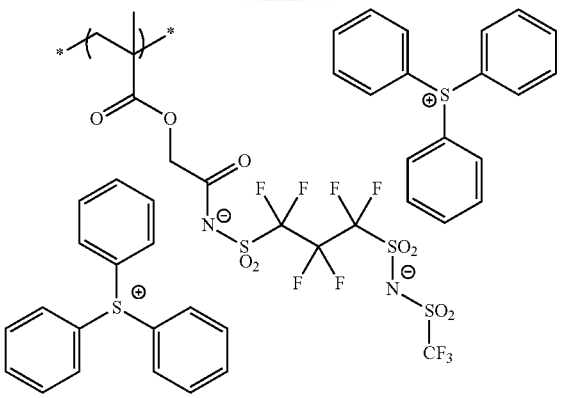
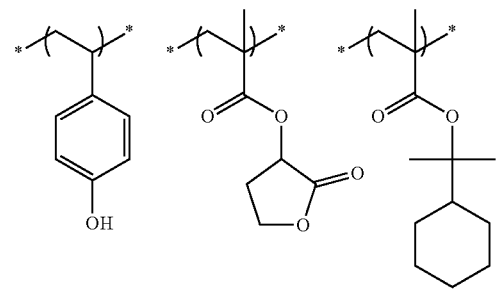
A-9
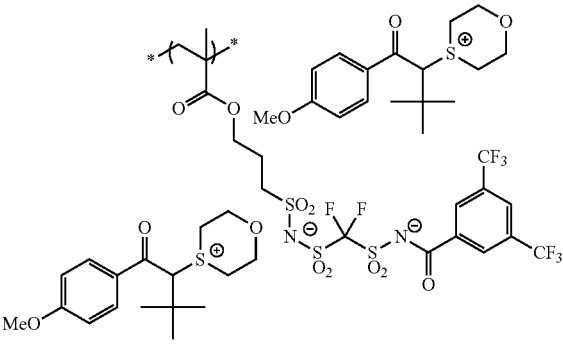
A-10

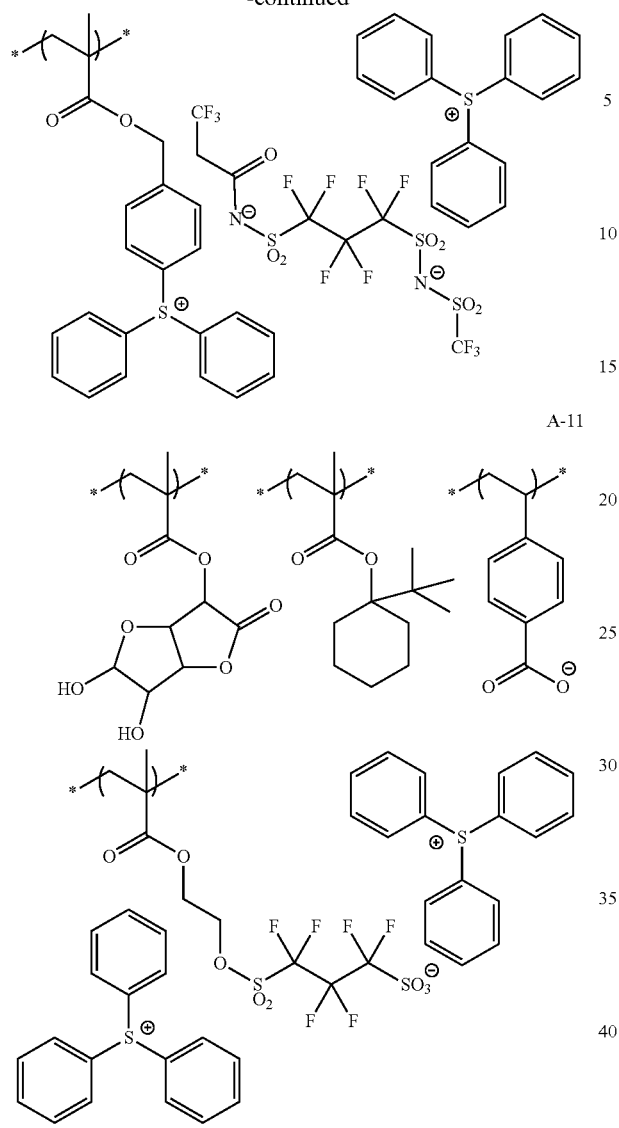
A-11
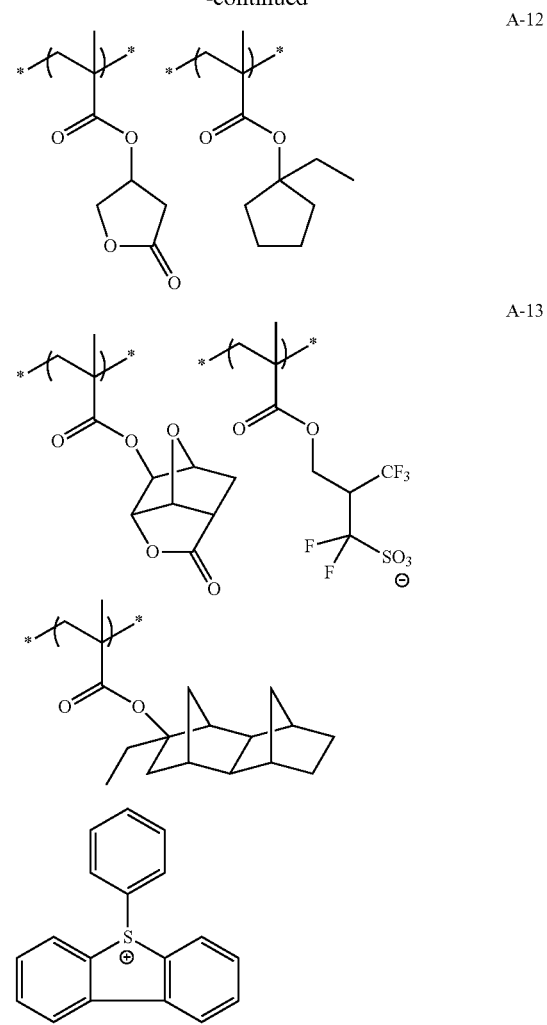
A-12
A-13
Synthesis Example 1: Synthesis of Resin A-5
Synthesis Example 1A: Synthesis of Compound (1)
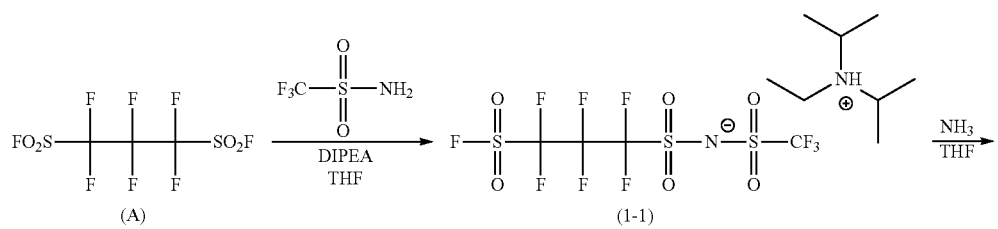
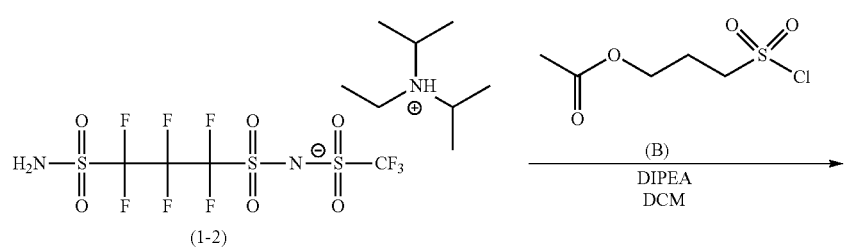

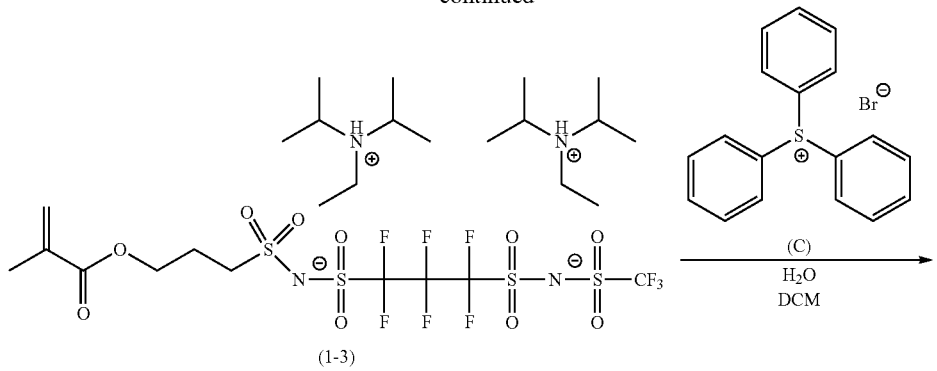

(1-3)

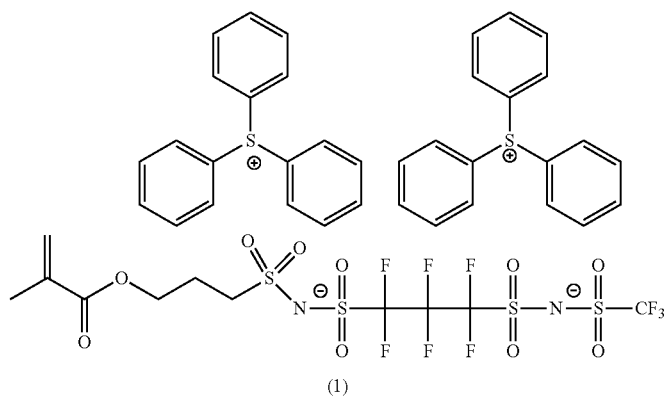

(1)

<<Synthesis of Compound (1-1)>>

30.0 g of trifluoromethanesulfonamide was dissolved in 90 g of dehydrated THF and cooled to 0° C. After 65.0 g of diisopropylethylamine (DIPEA) was added thereto at 0° C., a solution obtained by dissolving 63.3 g of the compound (A) in 30 g of dehydrated THF was added dropwise to the mixture, using a dropping funnel. Then, the mixture was stirred at 25° C. for 1 hour and the reaction system was added dropwise to 400 ml of 1 N hydrochloric acid. Methylene chloride was added to the organic layer and the mixture was washed three times with 150 g of water. The concentrated solution was subjected to column chromatography to obtain 84.0 g of a compound (1-1).

<<Synthesis of Compound (1-2)>>

84.0 g of the compound (1-1) was dissolved in 250 g of THF and ammonia gas was passed therethrough at 0° C. After 2 hours, the mixture was added dropwise to 1,000 ml of 1 N hydrochloric acid, methylene chloride was added thereto, and the mixture was washed three times with 300 g of water. The obtained organic layer was concentrated to obtain 54.0 g of a compound (1-2).

<<Synthesis of Compound (1-3)>>

17.0 g of the compound (1-2) was dissolved in 100 g of methylene chloride and cooled to 0° C. 9.61 g of diisopropylethylamine was added thereto at 0° C., and then a solution obtained by dissolving 7.42 g of the compound (B) in 19 g of methylene chloride (DCM) was added dropwise to the mixture, using a dropping funnel. Then, the mixture was stirred at 0° C. for 1 hour and the reaction solution was washed three times with 100 g of water. The concentrated solution was subjected to column chromatography to obtain 21.0 g of a compound (1-3).

<<Synthesis of Compound (1)>>

21.0 g of the compound (1-3) was dissolved in 170 g of methylene chloride, 150 g of pure water was added thereto, and then 8.09 g of compound (C) was further added to the mixture. Then, the mixture was stirred at 25° C. for 1 hour and the reaction solution was washed five times with 100 g of water. The concentrated solution was subjected to column chromatography to obtain 14.0 g of a compound (1).

Compound (1): $^1$H-NMR (CDCl$_3$) δppm 7.77-7.61 (30H, m), 6.07 (1H, s), 5.51 (1H, s), 4.21 (2H, t), 3.24 (2H, q), 2.23 (2H, m), 1.89 (3H, s)

Synthesis Example 2: Synthesis of Resin A-5

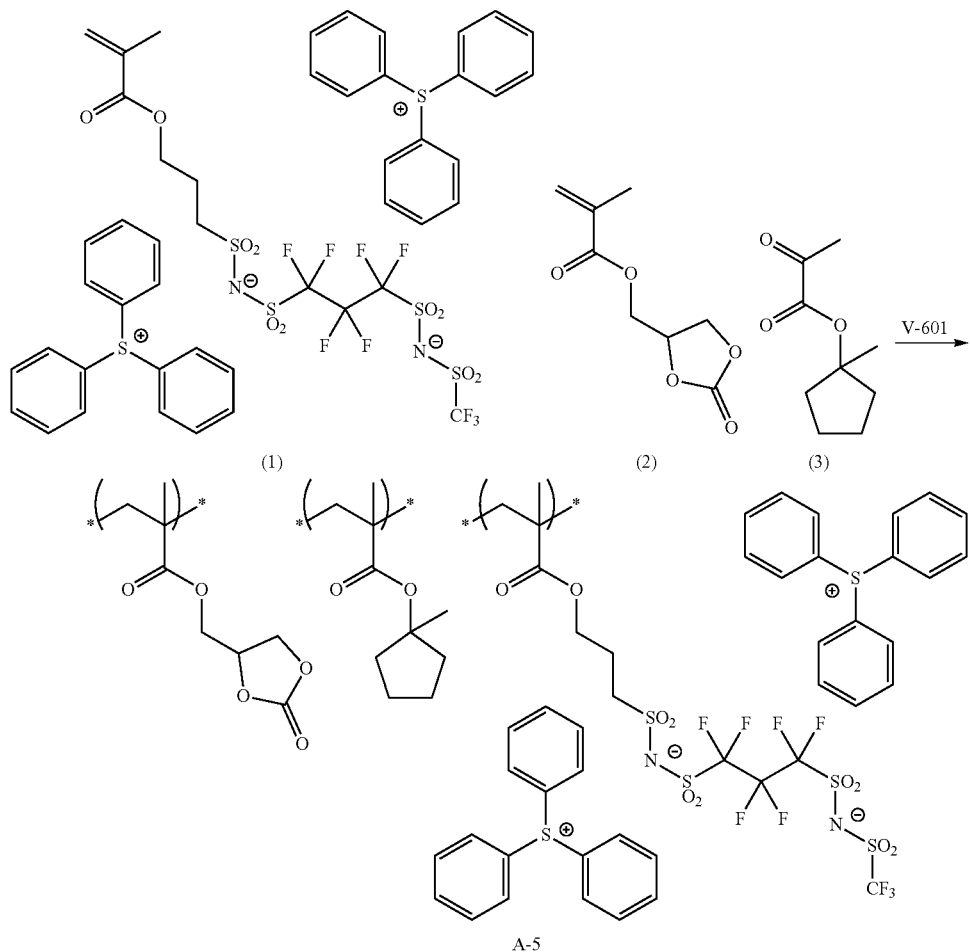

Cyclohexanone (24 g) was heated to 85° C. under a nitrogen stream. While stirring this liquid, a mixed solution of the monomer represented by Formula (1) (14.9 g), the monomer represented by Formula (2) (11.3 g), the monomer represented by Formula (3) (18.9 g), cyclohexanone (108 g), and dimethyl 2,2'-azobisisobutyrate [V-601, manufactured by FUJIFILM Wako Pure Chemical Corporation] (1.88 g) were added dropwise thereto over 4 hours to obtain a reaction solution. After completion of the dropwise addition, the reaction solution was further stirred at 85° C. for 2 hours. The obtained reaction solution was cooled, then reprecipitated with a large amount of methanol/water (mass ratio: 5:5), and filtered, and the obtained solid was vacuum-dried to obtain 20 g of a resin A-5.

<Acid Dissociation Constant (pKa) of Acidic Moiety Generated by Irradiation of Actinic Rays or Radiation (Exposure)>

The acid dissociation constants (pKa) of the acidic moieties generated by exposure of the resins A-1 to A-13 are shown in Table 2. Furthermore, in the resins A-1 to A-9 and the resin A-11, two acidic moieties derived from anionic moieties in specific structural moieties are formed in the resin by exposure. The resin A-10 is generated by separating an acid including two acidic moieties derived from an anionic moiety in a specific structural moiety from the main chain by exposure. In the resin A-13, one acidic moiety derived from an anionic moiety in a specific structural moiety is formed in the resin by exposure.

In the measurement of the acid dissociation constant (pKa) of an acidic moiety generated by exposure of the resin, specifically, the pKa is determined by subjecting a compound formed by substituting a cationic moiety of a monomer constituting a repeating unit including a specific structural moiety with a hydrogen atom to computation in terms of a value based on a Hammett's substituent constant and database of publicly known literature values, using Software Package 1 of ACD/Labs, as described above. In addition, in a case where pKa could not be calculated by the method, a value obtained by Gaussian 16 based on density functional theory (DFT) was adopted.

In the following table, "pKa1" represents an acid dissociation constant of the first stage, and "pKa2" represents an acid dissociation constant of the second stage. A smaller value of pKa means a higher acidity.

Furthermore, pKa1 corresponds to the above-mentioned acid dissociation constant a1, and pKa2 corresponds to the above-mentioned acid dissociation constant a2.

Table 2 is shown below.

Furthermore, the structure of the resin ("Note (structure)" column in Table 2) is also shown in Table 2, together with the acid dissociation constant (pKa) of the acidic moiety generated by exposure of the resin.

In the "Whether structure of resin corresponds to any of specific resin X or specific resin Y" column in the "Note (structure)" column in Table 2, "X, Y" indicates a case where the structure of the resin corresponds to both of the specific resin X and the specific resin Y, "X" indicates a case where the structure of the resin corresponds to only the specific resin X, "Y" indicates a case where the structure of the resin corresponds to only the specific resin Y, and "-" indicates a case where the structure of the resin corresponds to neither of the both.

In the "Whether or not monomer corresponds to compound (I)" column in the "Note (structure)" column in Table 2, "A" indicates a case where the monomer corresponds to the compound (I), and "B" indicates a case where the monomer does not correspond to the compound (I).

TABLE 2

| | Acid dissociation constant (pKa) | | | | Note (structure) | |
| | | | | | Whether structure of resin corresponds to any of specific resin X or specific resin Y | Whether or not monomer corresponds to compound (I) |
| | pKa1 | pKa2 | Acid dissociation constant a1 | Acid dissociation constant a2 | Difference between acid dissociation constant a1 and acid dissociation constant a2 | | |
|---|---|---|---|---|---|---|---|
| A-1 | −10.73 | −3.69 | −10.73 | −3.69 | 7.04 | X, Y | A |
| A-2 | −10.71 | −0.13 | −10.71 | −0.13 | 10.58 | X, Y | A |
| A-3 | −3.49 | −3.33 | −3.49 | −3.33 | 0.16 | X, Y | A |
| A-4 | −10.74 | −4.37 | −10.74 | −4.37 | 6.37 | X, Y | A |
| A-5 | −10.73 | −3.47 | −10.73 | −3.47 | 7.26 | X, Y | A |
| A-6 | −6.07 | −1.28 | −6.07 | −1.28 | 4.79 | X, Y | A |
| A-7 | −0.32 | 2.91 | −0.32 | 2.91 | 3.23 | X, Y | A |
| A-8 | −10.72 | −0.63 | −10.72 | −0.63 | 10.09 | X, Y | A |
| A-9 | −4.22 | −1.33 | −4.22 | −1.33 | 2.89 | X, Y | A |
| A-10 | −10.72 | −0.37 | −10.72 | −0.37 | 10.35 | X | B |
| A-11 | −3.39 | 4.24 | −3.39 | 4.24 | 7.63 | Y | B |
| A-12 | — | — | — | — | — | — | B |
| A-13 | −2.76 | — | −2.76 | — | — | — | B |

[Photoacid Generator]

The structures of the photoacid generators (compounds C-1 to C-13) shown in Table 4 and Table 8 are shown below.

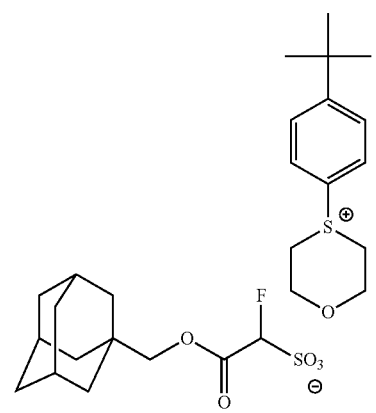

C-1

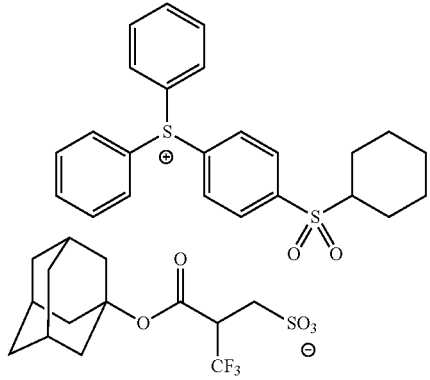

C-2

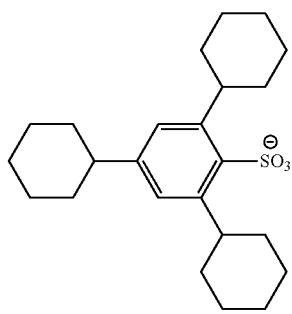

C-3

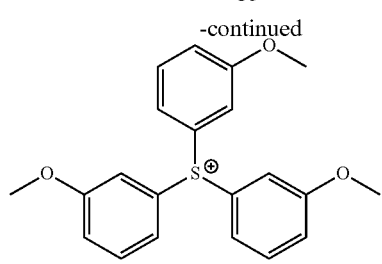
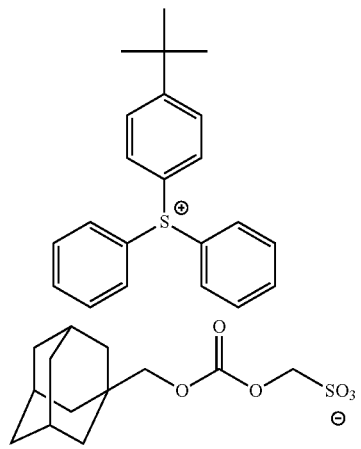
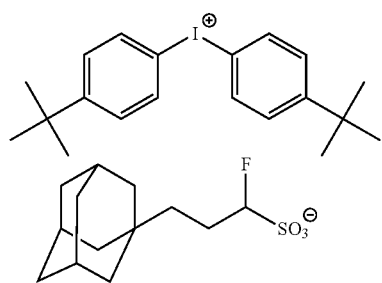
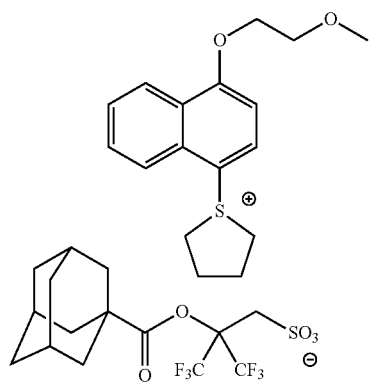
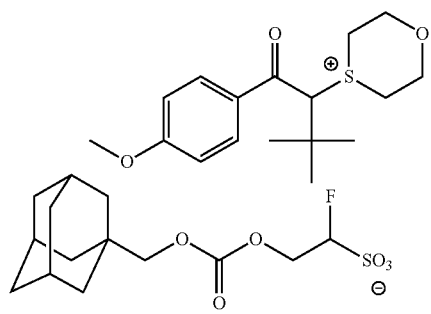
C-4
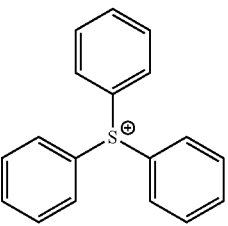
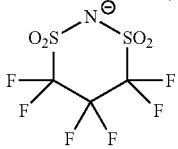
C-5
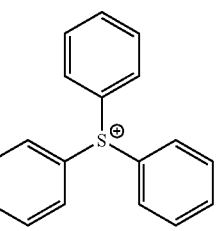
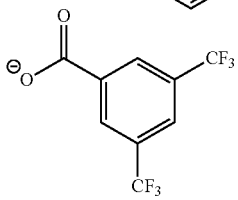
C-6
C-7
C-8
C-9
C-10
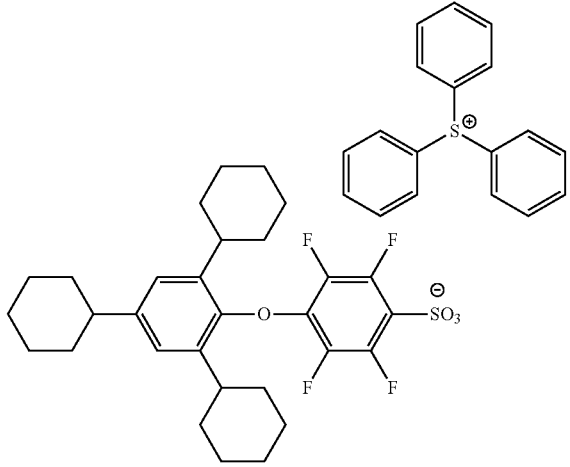
C-11
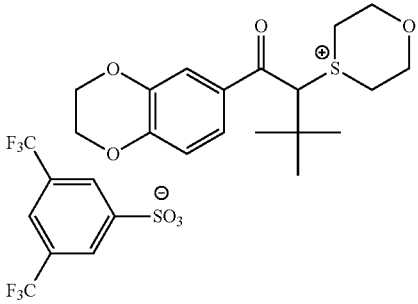

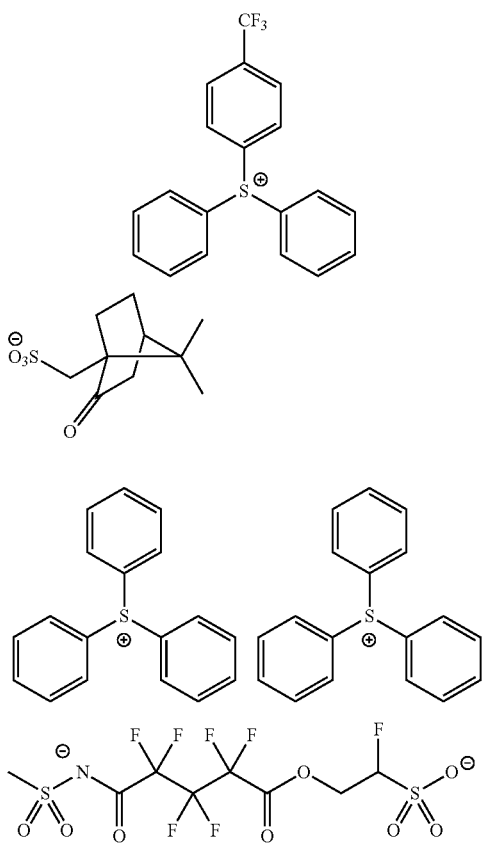

C-12

C-13

[Acid Diffusion Control Agent]

The structures of acid diffusion control agents (compounds D-1 to D-5) shown in Table 4 and Table 8 are shown below.

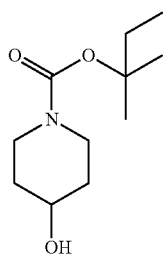

D-1

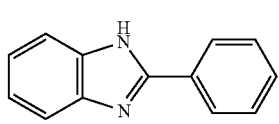

D-2

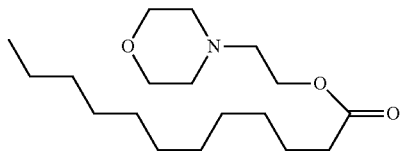

D-3

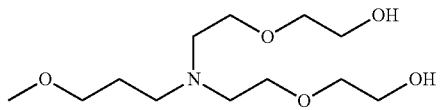

D-4

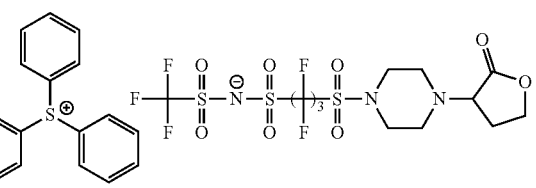

D-5

[Hydrophobic Resin and Resin for Topcoat]

As hydrophobic resins (E-1 to E-11) shown in Table 4 and Table 8 and resins (PT-1 to PT-3) for a topcoat shown in Table 5, the synthesized hydrophobic resins were used.

The molar ratios of the repeating units, the weight-average molecular weights (Mw), and the dispersities (Mw/Mn) in the hydrophobic resins shown in Table 4 and Table 8 and the resins for topcoat shown in Table 5 are shown in Table 3.

Furthermore, the weight-average molecular weights (Mw) and the degrees of dispersion (Mw/Mn) of the hydrophobic resins E-1 to E-11 and the resins PT-1 to PT-3 for a topcoat were measured by GPC (carrier: tetrahydrofuran (THF)) (an amount expressed in terms of polystyrene). In addition, the compositional ratio (ratio based on % by mole) of the resin was measured by $^{13}C$-nuclear magnetic resonance (NMR).

TABLE 3

|  | Molar ratio of repeating unit 1 | | Molar ratio of repeating unit 2 | | Molar ratio of repeating unit 3 | | Molar ratio of repeating unit 4 | | Mw | Mw/Mn |
|---|---|---|---|---|---|---|---|---|---|---|
| Resin E-1 | ME-3 | 60 | ME-4 | 40 | | | | | 10,000 | 1.4 |
| Resin E-2 | ME-15 | 50 | ME-1 | 50 | | | | | 12,000 | 1.5 |
| Resin E-3 | ME-2 | 40 | ME-13 | 50 | ME-9 | 5 | ME-20 | 5 | 6,000 | 1.3 |
| Resin E-4 | ME-19 | 50 | ME-14 | 50 | | | | | 9,000 | 1.5 |
| Resin E-5 | ME-10 | 50 | ME-2 | 50 | | | | | 15,000 | 1.5 |
| Resin E-6 | ME-17 | 50 | ME-15 | 50 | | | | | 10,000 | 1.5 |
| Resin E-7 | ME-7 | 100 | | | | | | | 23,000 | 1.7 |
| Resin E-8 | ME-5 | 100 | | | | | | | 13,000 | 1.5 |
| Resin E-9 | ME-6 | 50 | ME-16 | 50 | | | | | 10,000 | 1.7 |
| Resin E-10 | ME-13 | 10 | ME-18 | 85 | ME-9 | 5 | | | 11,000 | 1.4 |
| Resin E-11 | ME-8 | 80 | ME-11 | 20 | | | | | 13,000 | 1.4 |

TABLE 3-continued

|  | Molar ratio of repeating unit 1 |  | Molar ratio of repeating unit 2 |  | Molar ratio of repeating unit 3 |  | Molar ratio of repeating unit 4 |  | Mw | Mw/Mn |
|---|---|---|---|---|---|---|---|---|---|---|
| Resin PT-1 | ME-2 | 40 | ME-11 | 30 | ME-9 | 30 |  |  | 8,000 | 1.6 |
| Resin PT-2 | ME-2 | 50 | ME-8 | 40 | ME-3 | 10 |  |  | 5,000 | 1.5 |
| Resin PT-3 | ME-3 | 30 | ME-4 | 65 | ME-12 | 5 |  |  | 8,500 | 1.7 |

The monomer structures used in the synthesis of the hydrophobic resins E-1 to E-11 shown in Table 4 and Table 8, and the resins PT-1 to PT-3 for a topcoat shown in Table 5 are shown below.

ME-1

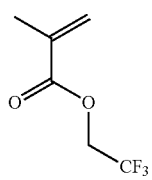

ME-2

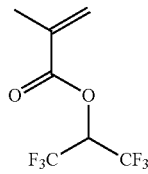

ME-3

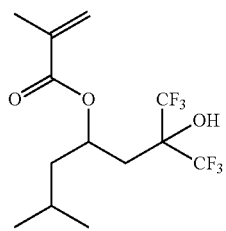

ME-4

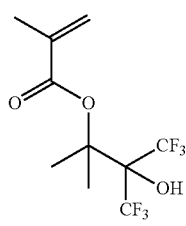

ME-5

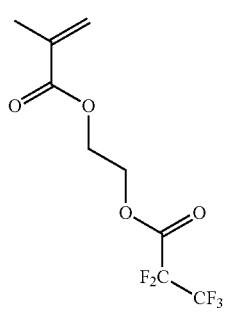

-continued

ME-6

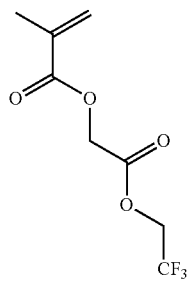

ME-7

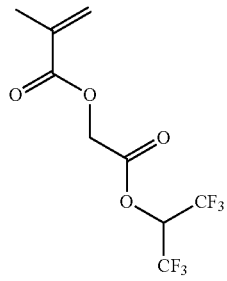

ME-8

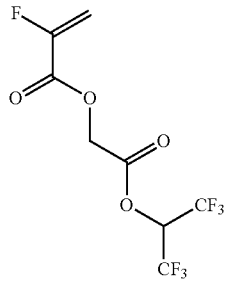

ME-9

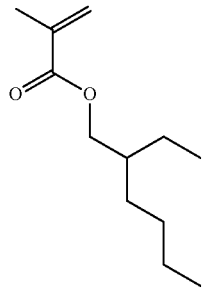

ME-10

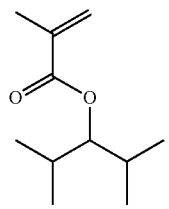

ME-11 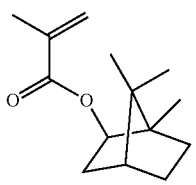

ME-12 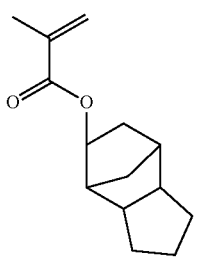

ME-13 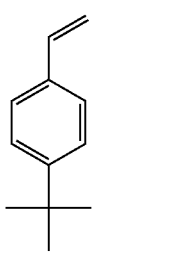

ME-14 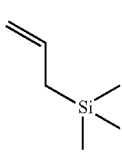

ME-15 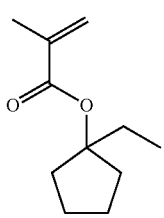

ME-16 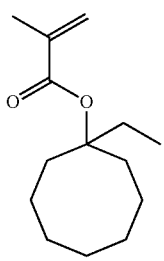

ME-17 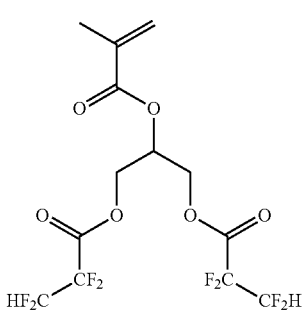

ME-18 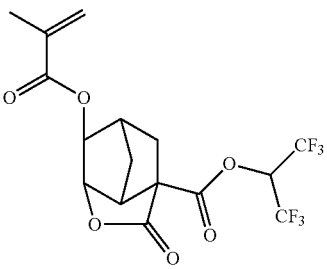

ME-19 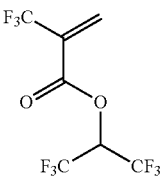

ME-20 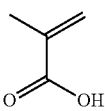

[Surfactant]

Surfactants shown in Table 4 and Table 8 are shown below.

H-1: MEGAFACE F176 (manufactured by DIC Corporation, fluorine-based surfactant)

H-2: MEGAFACE R08 (manufactured by DIC Corporation, fluorine- and silicon-based surfactant)

H-3: PF656 (manufactured by OMNOVA Solutions Inc., fluorine-based surfactant)

[Solvent]

The solvents shown in Table 4 and Table 8 are shown below.

F-1: Propylene glycol monomethyl ether acetate (PG-MEA)
F-2: Propylene glycol monomethyl ether (PGME)
F-3: Propylene glycol monoethyl ether (PGEE)
F-4: Cyclohexanone
F-5: Cyclopentanone
F-6: 2-Heptanone
F-7: Ethyl lactate
F-8: γ-Butyrolactone
F-9: Propylene carbonate

[Preparation and Evaluation of Actinic Ray-Sensitive or Radiation-Sensitive Resin Composition (1), ArF Liquid Immersion Exposure]

[Preparation of Actinic Ray-Sensitive or Radiation-Sensitive Resin Composition (1), ArF Liquid Immersion Exposure]

The respective components shown in Table 4 were mixed so that the concentration of solid contents was 4% by mass. Next, the obtained mixed liquid was filtered initially through a polyethylene-made filter having a pore diameter of 50 nm, then through a nylon-made filter having a pore diameter of 10 nm, and lastly through a polyethylene-made filter having a pore diameter of 5 nm in this order to prepare an actinic ray-sensitive or radiation-sensitive resin composition (hereinafter also referred to as a resist composition). In addition, in the resist composition, the solid content means all the components excluding the solvent. The obtained resist composition was used in Examples and Comparative Examples.

Furthermore, in Table 4, the content (% by mass) of each component means a content with respect to the total solid content.

TABLE 4

| | Resin | | Photoacid generator | | Acid diffusion control agent | | Additive resin | | Surfactant | | Solvent | |
|---|---|---|---|---|---|---|---|---|---|---|---|---|
| | Type | % by mass | Type | % by mass | Type | % by mass | Type | % by mass | Type | % by mass | Type | Mixing ratio (mass ratio) |
| Re-1 | | | C-1 | 0.8 | — | — | E-3 | 0.3 | — | — | F-1/F-2 | 70/30 |
| Re-2 | A-2 | 95.9 | C-2 | 2.1 | — | — | E-1/E-2 | 1.0/1.0 | — | — | F-1/F-8 | 85/15 |
| Re-3 | A-3 | 96.4 | C-3 | 1.1 | — | — | E-4 | 2.5 | — | — | F-1/F-2/F-8 | 70/25/5 |
| Re-4 | A-4 | 97.5 | — | — | D-5 | 0.9 | E-8 | 1.6 | — | — | F-4 | 100 |
| Re-5 | A-5 | 99.8 | — | — | — | — | — | — | H-1/H-2 | 0.1/0.1 | F-1/F-7 | 80/20 |
| Re-6 | A-6 | 99.2 | C-4 | 0.7 | — | — | — | — | H-3 | 0.1 | F-1/F-3 | 70/30 |
| Re-7 | A-7 | 99.2 | C-5 | 0.8 | — | — | — | — | — | — | F-1/F-5 | 50/50 |
| Re-8 | A-8 | 97.9 | C-6 | 1.1 | — | — | E-5 | 1.0 | — | — | F-1/F-9 | 90/10 |
| Re-9 | A-9 | 98.4 | — | — | D-1 | 0.1 | E-9 | 1.5 | — | — | F-1/F-6 | 40/60 |
| Re-10 | A-10 | 95.9 | C-7 | 0.9 | — | — | E-10 | 3.2 | — | — | F-1/F-8 | 90/10 |
| Re-11 | A-11 | 97.8 | C-8 | 1.3 | — | — | E-11 | 0.8 | H-1 | 0.1 | F-1/F-2 | 80/20 |
| Re-12 | A-7 | 93.3 | C-9 | 2.5 | — | — | E-8 | 4.2 | — | — | F-1 | 100 |
| Re-13 | A-1 | 93.9 | C-10 | 4.2 | D-3 | 0.5 | E-7 | 1.4 | — | — | F-7 | 100 |
| Re-14 | A-2 | 95.9 | C-11 | 1.6 | — | — | E-10 | 2.5 | — | — | F-1/F-8 | 85/15 |
| Re-15 | A-1/A-12 | 76.5/19.1 | C-12 | 1.1 | — | — | E-6 | 3.3 | — | — | F-1/F-2 | 70/30 |
| Re-16 | A-9/A-12 | 69.2/29.6 | — | — | — | — | E-3 | 1.2 | — | — | F-1/F-8 | 85/15 |
| Re-17 | A-12 | 92.1 | C-5 | 6.0 | D-5 | 0.9 | E-1 | 1.0 | — | — | F-1/F-2 | 70/30 |
| Re-18 | A-13 | 95.3 | — | — | D-4 | 3.5 | E-1 | 1.2 | — | — | F-1/F-8 | 85/15 |
| Re-19 | A-12 | 92.8 | C-13 | 5.0 | — | — | E-2 | 2.2 | — | — | F-1/F-9 | 85/15 |

Various components included in the topcoat composition shown in Table 5 are shown below.

<Resin>

As the resin shown in Table 5, the resins PT-1 to PT-3 shown in Table 3 were used.

<Additive>

The structures of the additives shown in Table 5 are shown below.

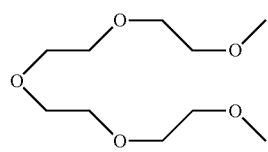

DT-1

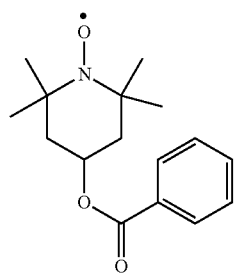

DT-2

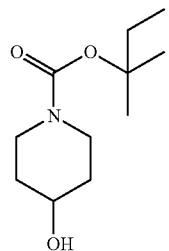

DT-3

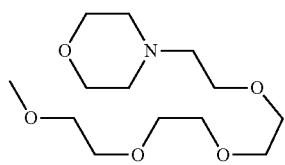

DT-4

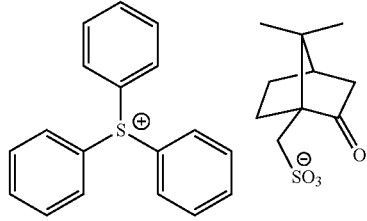

DT-5

<Surfactant>

As the surfactant shown in Table 5, the surfactant H-3 was used.

<Solvent>

The solvents shown in Table 5 are shown below.

FT-1: 4-Methyl-2-pentanol (MIBC)

FT-2: n-Decane

FT-3: Diisoamyl ether

<Preparation of Topcoat Composition>

The respective components shown in Table 5 were mixed so that the concentration of solid contents was 3% by mass, and then the obtained mixed liquid was filtered initially through a polyethylene-made filter having a pore diameter of 50 nm, then through a nylon-made filter having a pore diameter of 10 nm, and lastly through a polyethylene-made filter having a pore diameter of 5 nm in this order to prepare a topcoat composition. Furthermore, the solid content as mentioned herein means all the components other than the solvent. The obtained topcoat composition was used in Examples.

TABLE 5

| | Resin | | Additive | | Surfactant | | Solvent | |
|---|---|---|---|---|---|---|---|---|
| | Type | Mass [g] | Type | Mass [g] | Type | Mass [g] | Type | Mixing ratio (mass ratio) |
| TC-1 | PT-1 | 10 | DT-1/ DT-2 | 1.3/0.06 | | | FT-1/FT-2 | 70/30 |
| TC-2 | PT-2 | 10 | DT-3/ DT-4 | 0.04/ 0.06 | H-3 | 0.005 | FT-1/FT-3 | 75/25 |
| TC-3 | PT-3 | 10 | DT-5 | 0.05 | | | FT-1/FT-3 | 10/90 |

[Pattern Formation (1): ArF Liquid Immersion Exposure and Organic Solvent Development]

A composition for forming an organic antireflection film, ARC29SR (manufactured by Brewer Science, Inc.), was applied onto a silicon wafer and baked at 205° C. for 60 seconds to form an antireflection film having a film thickness of 98 nm. The resist composition shown in Table 4 was applied thereon and baked at 100° C. for 60 seconds to form a resist film (actinic ray-sensitive or radiation-sensitive film) having a film thickness of 90 nm. Furthermore, in Examples 1-5, Example 1-6, and Example 1-7, a topcoat film was formed on the upper layer of the resist film (the types of topcoat compositions used are shown in Table 6). The film thickness of the topcoat film was 100 nm in any case.

The obtained resist film was exposed. The exposing method was carried out by a method described in (A) below (for LWR performance evaluation) or a method described in (B) (for EL performance evaluation).

(A) Formation of Line-and-Space Pattern

The resist film was exposed through a 6% halftone mask having a 1:1 line-and-space pattern with a line width of 45 nm, using an ArF excimer laser liquid immersion scanner (XT1700i, manufactured by ASML, NA 1.20, Dipole, outer sigma: 0.950, inner sigma: 0.850, Y polarization). Ultrapure water was used as the immersion liquid.

(B) Formation of Contact Hole Pattern

Using an ArF excimer laser liquid immersion scanner (manufactured by ASML; XT1700i, NA 1.20, C-Quad, outer sigma 0.98, inner sigma 0.89, XY deflection), the resist film was exposed through a mask pattern (6% halftone) for forming a pattern with a mask size of 45 nm and a pitch of 90 nm in the X direction and a mask size of 60 nm and a pitch of 120 nm in the Y direction. Ultrapure water was used as the immersion liquid.

The resist film after the exposure was baked at 90° C. for 60 seconds, developed with n-butyl acetate for 30 seconds, and then rinsed with 4-methyl-2-pentanol for 30 seconds. Then, the film was spin-dried to obtain a negative tone pattern.

<Evaluation>

(Evaluation Item 1: LWR Performance)

In a case where a 45 nm (1:1) line-and-space pattern resolved with an optimum exposure amount upon resolving a line pattern having an average line width of 45 nm was observed from the upper part of the pattern using a critical dimension scanning electron microscope (SEM (S-9380II manufactured by Hitachi, Ltd.)), the line width was observed at any points, and a measurement deviation thereof was evaluated as 3σ. A smaller value thereof indicates better performance. Furthermore, LWR (nm) is preferably 3.3 nm or less, more preferably 3.0 nm or less, and still more preferably 2.5 nm or less.

(Evaluation item 2: Exposure Latitude (EL))

A hole size in a contact hole pattern was observed with a critical-dimension scanning electron microscope (SEM, Hitachi, Ltd. S-9380II), and an optimum exposure amount upon resolution of a hole pattern with an average hole size of 45 nm in the X direction was defined as a sensitivity (Eopt) (mJ/cm$^2$). Then, an exposure amount at which the hole size was ±10% of 45 nm which is a desired value (that is, 40.5 nm and 49.5 nm) was determined, based on the obtained optimum exposure amount (Eopt). Then, an exposure latitude (EL, %) defined by the following equation was calculated. The larger the EL value, the smaller a change in the performance due to a change in the exposure amount, which is the better. Furthermore, the EL (%) is preferably 14.0% or more, and more preferably 14.5% or more.

[EL (%)]=[(Exposure amount at which hole size is 40.5 nm)−(Exposure amount at which hole size is 49.5 nm)]/$E$opt×100

<<Evaluation Results>>

The results of the evaluation tests are shown in Table 6 below.

TABLE 6

| | Actinic ray-sensitive or radiation-sensitive resin composition | Topcoat composition | Evaluation item LWR | Evaluation item EL |
|---|---|---|---|---|
| Example 1-1 | Re-1 | — | 2.8 | 15.0 |
| Example 1-2 | Re-2 | — | 2.7 | 15.4 |
| Example 1-3 | Re-3 | — | 2.9 | 15.4 |
| Example 1-4 | Re-4 | — | 2.8 | 16.8 |
| Example 1-5 | Re-5 | TC-1 | 3.0 | 16.8 |
| Example 1-6 | Re-6 | TC-2 | 2.4 | 15.6 |
| Example 1-7 | Re-7 | TC-3 | 2.3 | 14.9 |
| Example 1-8 | Re-8 | — | 2.7 | 15.9 |
| Example 1-9 | Re-9 | — | 2.7 | 16.5 |
| Example 1-10 | Re-10 | — | 2.7 | 14.2 |
| Example 1-11 | Re-11 | — | 3.3 | 15.1 |
| Example 1-12 | Re-12 | — | 2.6 | 15.2 |
| Example 1-13 | Re-13 | — | 2.7 | 16.2 |
| Example 1-14 | Re-14 | — | 2.8 | 15.2 |
| Example 1-15 | Re-15 | — | 3.1 | 15.5 |
| Example 1-16 | Re-16 | — | 3.1 | 16.0 |
| Comparative Example 1-1 | Re-17 | — | 4.0 | 10.1 |
| Comparative Example 1-2 | Re-18 | — | 3.8 | 12.9 |
| Comparative Example 1-3 | Re-19 | — | 3.4 | 13.8 |

From the results in Table 6, it is clear that patterns formed by the resist compositions of Examples have excellent LWR performance. Moreover, it is clear that the resist compositions of Example exhibit excellent EL performance.

In addition, from the results in Table 6, it is clear that in a case where the resin included in the resist composition is a resin including a repeating unit derived from a specific compound capable of generating an acid including a polymerizable group, an acidic moiety derived from an anionic moiety in the structural moiety X, and an anionic moiety in the structural moiety Y by exposure (preferably a resin including a repeating unit derived from the compound (I)), the resist composition exhibits excellent EL performance (a comparison between the resist compositions using the resins A-1 to A-9 and the resist composition using the resin A-10).

Moreover, from the results in Table 6, it is clear that in a case where the resin included in the resist composition is the specific resin Y and the specific resin Y is a resin including a repeating unit including the group having the first structural moiety and the group having the second structural moiety (in other words, a resin including a repeating unit including two specific structural moieties), the LWR performance of a pattern formed is more excellent (a comparison between the resist compositions using the resins A-1 to A-9 and the resist composition using the resin A-11).

[Pattern Formation (2): ArF Liquid Immersion Exposure and Aqueous Alkali Solution Development]

A composition for forming an organic antireflection film, ARC29SR (manufactured by Brewer Science, Inc.), was applied onto a silicon wafer and baked at 205° C. for 60 seconds to form an antireflection film having a film thickness of 98 nm. A resist composition shown in Table 4 was applied thereon and baked at 100° C. for 60 seconds to form a resist film having a film thickness of 90 nm. Furthermore, in Example 2-3, and Example 2-5 to Example 2-7, a topcoat film was formed on the upper layer of the resist film (the types of topcoat compositions used are shown in Table 7). The film thickness of the topcoat film was 100 nm in any case.

The obtained resist film was exposed. The exposing method was carried out by a method described in (A) below (for LWR performance evaluation) or a method described in (B) (for EL performance evaluation).

(A) Formation of Line-and-Space Pattern

The resist film was exposed through a 6% halftone mask having a 1:1 line-and-space pattern with a line width of 45 nm, using an ArF excimer laser liquid immersion scanner (XT1700i, manufactured by ASML, NA 1.20, Dipole, outer sigma: 0.950, inner sigma: 0.890, Y deflection). Ultrapure water was used as the immersion liquid.

(B) Formation of Contact Hole Pattern

Using an ArF excimer laser liquid immersion scanner (manufactured by ASML; XT1700i, NA 1.20, C-Quad, outer sigma 0.98, inner sigma 0.89, XY deflection), the resist film was exposed through a mask pattern (6% halftone) for forming a pattern with a mask size of 45 nm and a pitch of 90 nm in the X direction and a mask size of 60 nm and a pitch of 120 nm in the Y direction. Ultrapure water was used as the immersion liquid.

The resist film after the exposure was baked at 90° C. for 60 seconds, developed with an aqueous tetramethylammonium hydroxide solution (2.38%-by-mass) for 30 seconds, and then rinsed with pure water for 30 seconds. Thereafter, the resist film was spin-dried to obtain a positive tone pattern.

The obtained positive tone pattern was subjected to performance evaluation of (line width roughness (LWR, nm) and exposure latitude (EL, %)) which had been carried out on the negative tone pattern obtained by the above-described [Pattern Formation (1): ArF Liquid Immersion Exposure and Organic Solvent Development].

<<Evaluation Results>>

The results of the evaluation tests above are shown in Table 7 below.

TABLE 7

| | Actinic ray-sensitive or radiation-sensitive resin composition | Topcoat composition | Evaluation item LWR | Evaluation item EL |
|---|---|---|---|---|
| Example 2-1 | Re-1 | — | 2.9 | 15.0 |
| Example 2-2 | Re-2 | — | 2.7 | 15.4 |
| Example 2-3 | Re-3 | TC-1 | 3.0 | 15.4 |
| Example 2-4 | Re-4 | — | 2.8 | 16.8 |
| Example 2-5 | Re-5 | TC-2 | 2.9 | 16.8 |
| Example 2-6 | Re-6 | TC-2 | 2.4 | 15.6 |
| Example 2-7 | Re-7 | TC-3 | 2.3 | 14.9 |
| Example 2-8 | Re-8 | — | 2.7 | 15.9 |
| Example 2-9 | Re-9 | — | 2.7 | 16.5 |
| Example 2-10 | Re-10 | — | 2.6 | 14.2 |
| Example 2-11 | Re-11 | — | 3.3 | 15.1 |
| Example 2-12 | Re-12 | — | 2.6 | 15.2 |
| Example 2-13 | Re-13 | — | 2.7 | 16.2 |
| Example 2-14 | Re-14 | — | 2.9 | 15.2 |
| Example 2-15 | Re-15 | — | 3.0 | 15.5 |
| Example 2-16 | Re-16 | — | 3.1 | 16.0 |
| Comparative Example 2-1 | Re-17 | — | 3.9 | 10.1 |
| Comparative Example 2-2 | Re-18 | — | 3.7 | 12.9 |
| Comparative Example 2-3 | Re-19 | — | 3.4 | 13.8 |

From the results in Table 7, it is clear that patterns formed by the resist compositions of Examples have excellent LWR performance. Moreover, it is clear that the resist compositions of Example exhibit excellent EL performance.

In addition, from the results in Table 7, it is clear that in a case where the resin included in the resist composition is a resin including a repeating unit derived from a specific compound capable of generating an acid including a polymerizable group, an acidic moiety derived from an anionic moiety in the structural moiety X, and an anionic moiety in the structural moiety Y by exposure (preferably a resin including a repeating unit derived from the compound (I)), the resist composition exhibits excellent EL performance (a comparison between the resist compositions using the resins A-1 to A-9 and the resist composition using the resin A-10).

Moreover, from the results in Table 7, it is clear that in a case where the resin included in the resist composition is the specific resin Y, and the specific resin Y is a resin including a repeating unit including the group having the first structural moiety and the group having the second structural moiety (in other words, a resin including a repeating unit including two specific structural moieties), the LWR performance of a pattern formed is more excellent (a comparison between the resist compositions using the resins A-1 to A-9 and the resist composition using the resin A-11).

[Preparation and Evaluation of Actinic Ray-Sensitive or Radiation-Sensitive Resin Composition (2), EUV Exposure]

[Preparation of Actinic Ray-Sensitive or Radiation-Sensitive Resin Composition (2), EUV Exposure]

The respective components shown in Table 8 were mixed so that the concentration of solid contents was 2% by mass. Next, the obtained mixed liquid was filtered initially through a polyethylene-made filter having a pore diameter of 50 nm, then through a nylon-made filter having a pore diameter of 10 nm, and lastly through a polyethylene-made filter having a pore diameter of 5 nm in this order to prepare an actinic ray-sensitive or radiation-sensitive resin composition (hereinafter also referred to as a resist composition). In addition, in the resist composition, the solid content means all the components excluding the solvent.

The obtained resist composition was used in Examples and Comparative Examples.

TABLE 8

| | Resin | | Photoacid generator | | Acid diffusion control agent | | Additive resin | | Surfactant | | Solvent | |
|---|---|---|---|---|---|---|---|---|---|---|---|---|
| | Type | % by mass | Type | % by mass | Type | % by mass | Type | % by mass | Type | % by mass | Type | Mixing ratio (mass ratio) |
| Re-20 | A-1 | 100.0 | — | — | — | — | — | — | — | — | F-1/F-8 | 85/15 |
| Re-21 | A-2 | 100.0 | — | — | — | — | — | — | — | — | F-1/F-2/F-8 | 70/25/5 |
| Re-22 | A-3 | 94.8 | C-7 | 5.1 | D-2 | 0.1 | — | — | — | — | F-4 | 100 |
| Re-23 | A-4 | 100.0 | — | — | — | — | — | — | — | — | F-1/F-2 | 70/30 |
| Re-24 | A-5 | 99.6 | — | — | D-4/D-1 | 0.1/0.3 | — | — | — | — | F-1/F-8 | 85/15 |
| Re-25 | A-6 | 98.0 | C-10 | 2.0 | — | — | — | — | — | — | F-1/F-8 | 85/15 |
| Re-26 | A-7 | 98.4 | C-11 | 1.6 | — | — | — | — | — | — | F-1/F-2 | 70/30 |
| Re-27 | A-8 | 98.8 | C-12 | 1.1 | — | — | — | — | H-1 | 0.1 | F-1/F-8 | 85/15 |
| Re-28 | A-9 | 100.0 | — | — | — | — | — | — | — | — | F-1/F-2/F-8 | 50/40/10 |
| Re-29 | A-10 | 100.0 | — | — | — | — | — | — | — | — | F-1/F-9 | 90/10 |
| Re-30 | A-11 | 97.9 | C-2 | 2.1 | — | — | — | — | — | — | F-1/F-6 | 40/60 |
| Re-31 | A-1 | 98.8 | — | — | — | — | E-5 | 1.2 | — | — | F-1/F-8 | 90/10 |
| Re-32 | A-1/A-12 | 80.0/20.0 | — | — | — | — | — | — | — | — | F-1/F-2 | 80/20 |
| Re-33 | A-9/A-12 | 70.0/30.0 | — | — | — | — | — | — | — | — | F-1 | 100 |
| Re-34 | A-4 | 100.0 | — | — | — | — | — | — | — | — | F-1/F-2 | 70/30 |
| Re-35 | A-12 | 93.1 | C-5 | 6.0 | D-5 | 0.9 | — | — | — | — | F-1/F-8 | 85/15 |
| Re-36 | A-13 | 96.5 | — | — | D-4 | 3.5 | — | — | — | — | F-1/F-2 | 70/30 |
| Re-37 | A-12 | 95.0 | C-13 | 5.0 | — | — | — | — | — | — | F-1/F-8 | 85/15 |

[Pattern Formation (3): EUV Exposure and Organic Solvent Development]

A composition for forming an underlayer film, AL412 (manufactured by Brewer Science, Inc.), was applied onto a silicon wafer and baked at 205° C. for 60 seconds to form an underlying film having a film thickness of 20 nm. A resist composition shown in Table 8 was applied thereon and baked at 100° C. for 60 seconds to form a resist film having a film thickness of 30 nm.

The silicon wafer having the obtained resist film was subjected to patternwise irradiation using an EUV exposure device (manufactured by Exitech Ltd., Micro Exposure Tool, NA 0.3, Quadrupol, outer sigma 0.68, inner sigma 0.36). Further, as a reticle, a mask having a line size=20 nm and a line:space=1:1 was used.

The resist film after the exposure was baked at 90° C. for 60 seconds, developed with n-butyl acetate for 30 seconds, and spin-dried to obtain a negative tone pattern.

<Evaluation>
(Evaluation Item 1: LWR Performance)

In a case where a 20 nm (1:1) line-and-space pattern resolved with an optimum exposure amount upon resolving a line pattern having an average line width of 20 nm was observed from the upper part of the pattern using a critical-dimension scanning electron microscope (SEM (S-9380II manufactured by Hitachi, Ltd.)), the line width was observed at any points, and a measurement deviation thereof was evaluated as $3\sigma$. A smaller value thereof indicates better performance. Further, LWR (nm) is preferably 4.2 nm or less, more preferably 4.0 nm or less, still more preferably 3.8 nm or less, and particularly preferably 3.7 nm or less.

(Evaluation item 2: Exposure Latitude (EL))

A line width in a line-and-space was observed with a critical-dimension scanning electron microscope (SEM, Hitachi, Ltd. S-9380II), and an optimum exposure amount upon resolution of a pattern in 20 nm on average was defined as a sensitivity (Eopt) (mJ/cm²). Then, an exposure amount at which the line width was ±10% (that is, 18.0 nm and 22.0 nm) of 20 nm which is a desired value was determined, based on the determined optimum exposure amount (Eopt). Then, an exposure latitude (EL, %) defined by the following equation was calculated. The larger the EL value, the smaller a change in the performance due to a change in the exposure amount, which is the better. Furthermore, the EL (%) is preferably 20.0% or more, and more preferably 21.0% or more.

[EL (%)]=[(Exposure amount at which hole size is 18.0 nm)−(Exposure amount at which hole size is 22.0 nm)]/$E$opt×100

<<Evaluation Results>>

The results of the evaluation tests are shown in Table 9 below.

TABLE 9

| | Actinic ray-sensitive or radiation-sensitive resin composition | Evaluation item LWR | Evaluation item EL |
|---|---|---|---|
| Example 3-1 | Re-20 | 3.9 | 23.3 |
| Example 3-2 | Re-21 | 4.0 | 24.1 |
| Example 3-3 | Re-22 | 4.0 | 22.5 |
| Example 3-4 | Re-23 | 3.9 | 23.1 |
| Example 3-5 | Re-24 | 3.9 | 22.8 |
| Example 3-6 | Re-25 | 3.7 | 21.3 |
| Example 3-7 | Re-26 | 4.0 | 22.0 |
| Example 3-8 | Re-27 | 3.9 | 21.5 |
| Example 3-9 | Re-28 | 3.7 | 24.0 |
| Example 3-10 | Re-29 | 3.9 | 20.0 |
| Example 3-11 | Re-30 | 4.2 | 21.9 |
| Example 3-12 | Re-31 | 3.6 | 23.3 |
| Example 3-13 | Re-32 | 3.7 | 22.7 |
| Example 3-14 | Re-33 | 3.9 | 22.9 |
| Example 3-15 | Re-34 | 4.0 | 23.8 |
| Comparative Example 3-1 | Re-35 | 4.7 | 17.6 |
| Comparative Example 3-2 | Re-36 | 4.5 | 18.3 |
| Comparative Example 3-3 | Re-37 | 4.3 | 19.0 |

From the results in Table 9, it is clear that the LWR performance of a pattern formed from the resist compositions of Examples is excellent. Moreover, it is clear that the resist compositions of Example exhibit excellent EL performance.

In addition, from the results in Table 9, it is clear that in a case where the resin included in the resist composition is a resin including a repeating unit derived from a specific compound capable of generating an acid including a polymerizable group, an acidic moiety derived from an anionic moiety in the structural moiety X, and an anionic moiety in the structural moiety Y by exposure (preferably a resin including a repeating unit derived from the compound (I)), the resist composition exhibits excellent EL performance (a comparison between the resist compositions using the resins A-1 to A-9 and the resist composition using the resin A-10).

Moreover, from the results in Table 9, it is clear that in a case where the resin included in the resist composition is the specific resin Y, and the specific resin Y is a resin including a repeating unit including the group having the first structural moiety and the group having the second structural moiety (in other words, a resin including a repeating unit including two specific structural moieties), the LWR performance of a pattern formed is more excellent (a comparison between the resist compositions using the resins A-1 to A-9 and the resist composition using the resin A-11).

[Pattern Formation (4): EUV Exposure and Aqueous Alkali Solution Development]

A composition for forming an underlayer film, AL412 (manufactured by Brewer Science, Inc.), was applied onto a silicon wafer and baked at 205° C. for 60 seconds to form an underlying film having a film thickness of 20 nm. A resist composition shown in Table 8 was applied thereon and baked at 100° C. for 60 seconds to form a resist film having a film thickness of 30 nm.

The silicon wafer having the obtained resist film was subjected to patternwise irradiation using an EUV exposure device (manufactured by Exitech Ltd., Micro Exposure Tool, NA 0.3, Quadrupol, outer sigma 0.68, inner sigma 0.36). Further, as a reticle, a mask having a line size=20 nm and a line:space=1:1 was used.

The resist film after the exposure was baked at 90° C. for 60 seconds, developed with an aqueous tetramethylammonium hydroxide solution (2.38%-by-mass) for 30 seconds, and then rinsed with pure water for 30 seconds. Thereafter, the resist film was spin-dried to obtain a positive tone pattern.

The obtained positive tone pattern was subjected to performance evaluation of (line width roughness (LWR, nm) and exposure latitude (EL, %)) which had been carried out on the negative tone pattern obtained by the above-described [Pattern Formation (3): EUV Exposure and Organic Solvent Development].

<<Evaluation Results>>

The results of the evaluation tests are shown in Table 10 below.

TABLE 10

| | Actinic ray-sensitive or radiation-sensitive resin composition | Evaluation item LWR | Evaluation item EL |
|---|---|---|---|
| Example 4-1 | Re-20 | 3.9 | 23.3 |
| Example 4-2 | Re-21 | 4.0 | 24.1 |
| Example 4-3 | Re-22 | 3.9 | 22.5 |
| Example 4-4 | Re-23 | 4.0 | 23.1 |
| Example 4-5 | Re-24 | 3.9 | 22.8 |
| Example 4-6 | Re-25 | 3.6 | 21.3 |
| Example 4-7 | Re-26 | 4.1 | 22.0 |
| Example 4-8 | Re-27 | 3.9 | 21.5 |
| Example 4-9 | Re-28 | 3.8 | 24.0 |

TABLE 10-continued

| | Actinic ray-sensitive or radiation-sensitive resin composition | Evaluation item LWR | Evaluation item EL |
|---|---|---|---|
| Example 4-10 | Re-29 | 3.7 | 20.1 |
| Example 4-11 | Re-30 | 4.2 | 21.9 |
| Example 4-12 | Re-31 | 3.7 | 23.3 |
| Example 4-13 | Re-32 | 3.7 | 22.7 |
| Example 4-14 | Re-33 | 3.9 | 22.9 |
| Example 4-15 | Re-34 | 4.0 | 23.8 |
| Comparative Example 4-1 | Re-35 | 4.8 | 17.6 |
| Comparative Example 4-2 | Re-36 | 4.5 | 18.3 |
| Comparative Example 4-3 | Re-37 | 4.3 | 19.0 |

From the results in Table 10, it is clear that the LWR performance of a pattern formed from the resist compositions of Examples is excellent. Moreover, it is clear that the resist compositions of Example exhibit excellent EL performance.

In addition, from the results in Table 10, it is clear that in a case where the resin included in the resist composition is a resin including a repeating unit derived from a specific compound capable of generating an acid including a polymerizable group, an acidic moiety derived from an anionic moiety in the structural moiety X, and an anionic moiety in the structural moiety Y by exposure (preferably a resin including a repeating unit derived from the compound (I)), the resist composition exhibits excellent EL performance (a comparison between the resist compositions using the resins A-1 to A-9 and the resist composition using the resin A-10).

Moreover, from the results in Table 10, it is clear that in a case where the resin included in the resist composition is the specific resin Y, and the specific resin Y is a resin including a repeating unit including the group having the first structural moiety and the group having the second structural moiety (in other words, a resin including a repeating unit including two specific structural moieties), the LWR performance of a pattern formed is more excellent (a comparison between the resist compositions using the resins A-1 to A-9 and the resist composition using the resin A-11).

What is claimed is:

1. An actinic ray-sensitive or radiation-sensitive resin composition comprising a resin X including a repeating unit derived from the following compound:
   (Compound)
   a compound including two or more structural moieties consisting of an anionic moiety and a cationic moiety, and a polymerizable group,
   wherein the compound generates an acid including an acidic moiety derived from the anionic moiety in the two or more structural moieties by irradiation with actinic rays or radiation, and
   the compound is represented by General Formula (S1) or General Formula (S2),

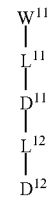

(S1)

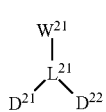
(S2)

in General Formula (S1), $W^{11}$ represents a polymerizable group, $L^{11}$ and $L^{12}$ each independently represent a single bond or a divalent linking group, $D^{11}$ represents a group represented by General Formula (D2), and $D^{12}$ represents a group represented by General Formula (D1), in General Formula (S2), $W^{21}$ represents a polymerizable group, $L^{21}$ represents a trivalent linking group, and $D^{21}$ and $D^{22}$ each independently represent a group represented by General Formula (D1),

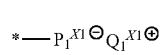
(D1)

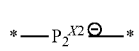
(D2)

in General Formula (D1), $P_1^{X1-}$ represents a negatively charged atomic group having a valence of X1, $Q_1^{X1+}$ represents a positively charged atomic group having a valence of X1, and * represents a bonding position, and in General Formula (D2), $P_2^{X2-}$ represents a negatively charged atomic group having a valence of X2, $Q_2^{X2+}$ represents a positively charged atomic group having a valence of X2, and * represents a bonding position.

2. The actinic ray-sensitive or radiation-sensitive resin composition according to claim 1,
wherein in the compound, structures of two or more anionic moieties among the anionic moieties are different from each other.

3. The actinic ray-sensitive or radiation-sensitive resin composition according to claim 1,
wherein the compound is the following compound (I):
compound (I): a compound having at least one of each of the following structural moiety X and the following structural moiety Y, and a polymerizable group, in which the compound generates an acid including the polymerizable group, the following first acidic moiety derived from the following structural moiety X, and the following second acidic moiety derived from the following structural moiety Y by irradiation with actinic rays or radiation,
structural moiety X: a structural moiety which consists of an anionic moiety $A_1^-$ and a cationic moiety $M_1^+$, and forms a first acidic moiety represented by $HA_1$ by irradiation with actinic rays or radiation,
structural moiety Y: a structural moiety which consists of an anionic moiety $A_2^-$ and a cationic moiety $M_2^+$, and forms a second acidic moiety represented by $HA_2$, having a structure different from that of the first acidic moiety formed by the structural moiety X, by irradiation with actinic rays or radiation,
provided that the compound (I) satisfies the following condition I,
condition I: a compound PI formed by substituting the cationic moiety $M_1^+$ in the structural moiety X and the cationic moiety $M_2^+$ in the structural moiety Y with $H^+$ in the compound (I) has an acid dissociation constant a1 derived from an acidic moiety represented by $HA_1$, formed by substituting the cationic moiety $M_1^+$ in the structural moiety X with $H^+$, and an acid dissociation constant a2 derived from an acidic moiety represented by $HA_2$, formed by substituting the cationic moiety $M_2^+$ in the structural moiety Y with $H^+$, and the acid dissociation constant a2 is larger than the acid dissociation constant a1.

4. The actinic ray-sensitive or radiation-sensitive resin composition according to claim 1,
wherein the resin X further includes a repeating unit having an acid-decomposable group.

5. An actinic ray-sensitive or radiation-sensitive resin composition comprising the following resin Y,
(Resin Y)
a resin including:
an acid-decomposable group,
a group having a first structural moiety consisting of a first anionic moiety and a first cationic moiety, and
a group having a second structural moiety consisting of a second anionic moiety and a second cationic moiety,
wherein the resin includes a repeating unit including the group having the first structural moiety and the group having the second structural moiety,
the first structural moiety forms a first acidic moiety derived from the first anionic moiety by irradiation with actinic rays or radiation,
the second structural moiety forms a second acidic moiety derived from the second anionic moiety by irradiation with actinic rays or radiation,
the second acidic moiety has a structure different from the first acidic moiety, and has an acid dissociation constant larger than an acid dissociation constant of the first acidic moiety, and
the repeating unit represents a repeating unit derived from a compound represented by General Formula (S1) or a repeating unit derived from a compound represented by General Formula (S2),

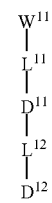
(S1)

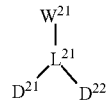
(S2)

in General Formula (S1), $W^{11}$ represents a polymerizable group, $L^{11}$ and $L^{12}$ each independently represent a single bond or a divalent linking group, $D^{11}$ represents a group represented by General Formula (D2), and $D^{12}$ represents a group represented by General Formula (D1), in General Formula (S2), $W^{21}$ represents a polymerizable group, $L^{21}$ represents a trivalent linking group, and $D^{21}$ and $D^{22}$ each independently represent a group represented by General Formula (D1),

in General Formula (D1), $P_1^{X1-}$ represents a negatively charged atomic group having a valence of X1, $Q_1^{X1+}$ represents a positively charged atomic group having a valence of X1, * represents a bonding position, and in General Formula (D2), $P_2^{X2-}$ represents a negatively charged atomic group having a valence of X2, $Q_2^{X2+}$ represents a positively charged atomic group having a valence of X2, and * represents a bonding position.

6. The actinic ray-sensitive or radiation-sensitive resin composition according to claim 5,
wherein the resin Y includes a repeating unit including the acid-decomposable group.

7. A resist film formed of the actinic ray-sensitive or radiation-sensitive resin composition according to claim 1.

8. A pattern forming method comprising:
forming a resist film on a support using the actinic ray-sensitive or radiation-sensitive resin composition according to claim 1;
exposing the resist film; and
developing the exposed resist film using a developer.

9. A compound comprising:
two or more structural moieties consisting of an anionic moiety and a cationic moiety; and
a polymerizable group,
wherein the compound generates an acid including an acidic moiety derived from the anionic moiety in the two or more structural moieties by irradiation with actinic rays or radiation, and
the compound is represented by General Formula (S1) or General Formula (S2),

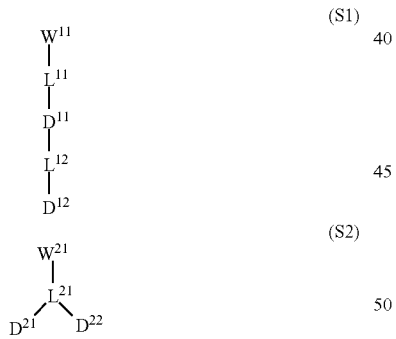

in General Formula (S1), $W^{11}$ represents an ethylenically unsaturated polymerizable group, $L^{11}$ and $L^{12}$ each independently represent a single bond or a divalent linking group, $D^{11}$ represents a group represented by General Formula (D2), and $D^{12}$ represents a group represented by General Formula (D1),

in General Formula (D1), $P_1^{X1-}$ represents a negatively charged atomic group having a valence of X1, the valence represented by X1 is 1, $Q_1^{X1+}$ represents a monovalent organic cation represented by General Formula (ZaI) or a monovalent organic cation represented by General Formula (ZaII), and * represents a bonding position, in General Formula (D2), $P_2^{X2-}$ represents a negatively charged atomic group having a valence of X2, the valence represented by X2 is 1, $Q_2^{X2+}$ represents a monovalent organic cation represented by General Formula (ZaI) or a monovalent organic cation represented by General Formula (ZaII), and * represents a bonding position,

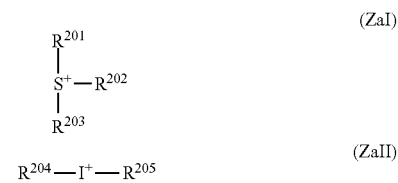

in General Formula (ZaI), $R^{201}$, $R^{202}$, and $R^{203}$ each independently represent an organic group, two of $R^{201}$ to $R^{203}$ may be bonded to each other to form a ring structure, and the ring may include an oxygen atom, a sulfur atom, an ester group, an amide group, or a carbonyl group, in General Formula (ZaII), $R^{204}$ and $R^{205}$ each independently represent an aryl group, an alkyl group, or a cycloalkyl group, and in General Formula (S2), $W^{21}$ represents an ethylenically unsaturated polymerizable group, $L^{21}$ represents a trivalent linking group, and $D^{21}$ and $D^{22}$ each independently represent a group represented by the General Formula (D1).

10. The compound according to claim 9,
wherein structures of two or more anionic moieties among the anionic moieties are different from each other.

11. The compound according to claim 9,
wherein the compound is the following compound (I):
compound (I): a compound having at least one of each of the following structural moiety X and the following structural moiety Y, and a polymerizable group, which generates an acid including the polymerizable group, the following first acidic moiety derived from the following structural moiety X, and the following second acidic moiety derived from the following structural moiety Y by irradiation with actinic rays or radiation,
structural moiety X: a structural moiety which consists of an anionic moiety $A_1^-$ and a cationic moiety $M_1^+$, and forms a first acidic moiety represented by $HA_1$ by irradiation with actinic rays or radiation,
structural moiety Y: a structural moiety which consists of an anionic moiety $A_2^-$ and a cationic moiety $M_2^+$, and forms a second acidic moiety represented by $HA_2$, having a structure different from that of the first acidic moiety formed by the structural moiety X, by irradiation with actinic rays or radiation,
provided that the compound (I) satisfies the following condition I,
condition I: a compound PI formed by substituting the cationic moiety $M_1^+$ in the structural moiety X and the cationic moiety $M_2^+$ in the structural moiety Y with $H^+$ in the compound (I) has an acid dissociation constant a1 derived from an acidic moiety represented by $HA_1$, formed by substituting the cationic moiety $M_1^+$ in the structural moiety X with $H^+$, and an acid dissociation constant a2 derived from an acidic moiety represented by $HA_2$, formed by substituting the cationic moiety $M_2^+$ in the structural moiety Y with $H^+$, and the acid dissociation constant a2 is larger than the acid dissociation constant a1.

12. A resin comprising a repeating unit derived from the compound according to claim 9.

13. The resin according to claim 12, further comprising a repeating unit having an acid-decomposable group.

14. A resin comprising:
an acid-decomposable group;
a group having a first structural moiety consisting of a first anionic moiety and a first cationic moiety; and
a group having a second structural moiety consisting of a second anionic moiety and a second cationic moiety,
wherein the resin includes a repeating unit including the group having the first structural moiety and the group having the second structural moiety,
the first structural moiety forms a first acidic moiety derived from the first anionic moiety by irradiation with actinic rays or radiation,
the second structural moiety forms a second acidic moiety derived from the second anionic moiety by irradiation with actinic rays or radiation,
the second acidic moiety has a structure different from the first acidic moiety, and has an acid dissociation constant larger than an acid dissociation constant of the first acidic moiety; and
the repeating unit represents a repeating unit derived from a compound represented by General Formula (S1) or a repeating unit derived from a compound represented by General Formula (S2),

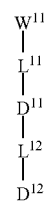

(S1)

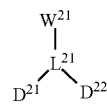

(S2)

in General Formula (S1), $W^{11}$ represents a polymerizable group, $L^{11}$ and $L^{12}$ each independently represent a single bond or a divalent linking group, $D^{11}$ represents a group represented by General Formula (D2), and $D^{12}$ represents a group represented by General Formula (D1), in General Formula (S2), $W^{21}$ represents a polymerizable group, $L^{21}$ represents a trivalent linking group, and $D^{21}$ and $D^{22}$ each independently represent a group represented by General Formula (D1), $$*\!\!-\!\!P_1^{X1\ominus}Q_1^{X1\oplus} \quad (D1)$$

$$*\!\!-\!\!P_2^{X2\ominus}\!\!-\!\!* \atop Q_2^{X2} \quad (D2)$$

in General Formula (D1), $P_1^{X1-}$ represents a negatively charged atomic group having a valence of X1, $Q_1^{X1+}$ represents a positively charged atomic group having a valence of X1, and * represents a bonding position, and in General Formula (D2), $P_2^{X2-}$ represents a negatively charged atomic group having a valence of X2, $Q_2^{X2+}$ represents a positively charged atomic group having a valence of X2, and * represents a bonding position.

15. The resin according to claim 14, further comprising:
a repeating unit including the acid-decomposable group.

* * * * *